United States Patent
Taguchi et al.

(10) Patent No.: US 9,612,532 B2
(45) Date of Patent: Apr. 4, 2017

(54) PHOTOSENSITIVE COLORING COMPOSITION, COLOR FILTER, METHOD FOR PRODUCING COLOR FILTER, ORGANIC EL LIQUID CRYSTAL DISPLAY DEVICE, AND COLOR FILTER FORMING KIT

(71) Applicant: FUJIFILM Corporation, Tokyo (JP)

(72) Inventors: Yoshinori Taguchi, Haibara-gun (JP); Kazuya Oota, Haibara-gun (JP); Takatsugu Kawano, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/008,713

(22) Filed: Jan. 28, 2016

(65) Prior Publication Data

US 2016/0139505 A1    May 19, 2016

Related U.S. Application Data

(63) Continuation of application No. PCT/JP2014/070083, filed on Jul. 30, 2014.

(30) Foreign Application Priority Data

Aug. 23, 2013  (JP) .................. 2013-173375

(51) Int. Cl.
| | |
|---|---|
| G02B 5/20 | (2006.01) |
| G02B 5/22 | (2006.01) |
| G03F 7/004 | (2006.01) |
| G03F 7/00 | (2006.01) |
| C08F 2/44 | (2006.01) |
| C08F 2/48 | (2006.01) |
| G03F 7/031 | (2006.01) |
| G02F 1/1335 | (2006.01) |
| G03F 7/16 | (2006.01) |
| G03F 7/20 | (2006.01) |
| G03F 7/32 | (2006.01) |
| G03F 7/105 | (2006.01) |

(52) U.S. Cl.
CPC .............. *G03F 7/0007* (2013.01); *C08F 2/44* (2013.01); *C08F 2/48* (2013.01); *G02B 5/201* (2013.01); *G02B 5/223* (2013.01); *G02F 1/133516* (2013.01); *G03F 7/031* (2013.01); *G03F 7/105* (2013.01); *G03F 7/168* (2013.01); *G03F 7/20* (2013.01); *G03F 7/2024* (2013.01); *G03F 7/32* (2013.01)

(58) Field of Classification Search
CPC ........ G03F 7/0007; G03F 7/031; G03F 7/028; G03F 7/20; G02B 5/223; G02B 5/21; G02F 1/133516
See application file for complete search history.

(56) References Cited

U.S. PATENT DOCUMENTS

| | | | |
|---|---|---|---|
| 2007/0099094 A1 | 5/2007 | Nemoto et al. | |
| 2009/0311479 A1 | 12/2009 | Shigemori et al. | |

FOREIGN PATENT DOCUMENTS

| | | | |
|---|---|---|---|
| JP | 2005-172923 A | | 6/2005 |
| JP | 2005-173532 A | | 6/2005 |
| JP | 2005-221803 A | | 8/2005 |
| JP | 2007-156395 A | * | 6/2007 |
| JP | 2008-287213 A | | 11/2008 |
| JP | 2011-086527 A | | 4/2011 |
| KR | 10-2007-003679 | | 1/2017 |

OTHER PUBLICATIONS

Computer-generated translation of JP 2005-221803 (Aug. 2005).*
Computer-generated translation of JP 2007-156395 (Jun. 2007).*
International Preliminary Report on Patentability and Written Opinion, issued Feb. 23, 2016, in International Application No. PCT/JP2014/070083, 11 pages in English and Japanese.
International Search Report of PCT/JP2014/070083 dated Oct. 28, 2014.
Written Opinion of the International Searching Authority of PCT/JP2014/070083 dated Oct. 28, 2014.
Office Action dated Nov. 22, 2016 from the Japanese Patent Office in counterpart Japanese Application No. 2013-173375.
Office Action dated Feb. 1, 2017 in counterpart Korean Patent Application No. 10-2016-7002331.

* cited by examiner

*Primary Examiner* — John A McPherson
(74) *Attorney, Agent, or Firm* — Sughrue Mion, PLLC

(57) ABSTRACT

Provided is a photosensitive coloring composition of the present invention including a polymerization initiator (a) with an absorption coefficient at 365 nm in methanol of $1.0 \times 10^3$ mL/gcm or more, a polymerization initiator (b) with an absorption coefficient at 365 nm in methanol of $1.0 \times 10^2$ mL/gcm or less and an absorption coefficient at 254 nm in methanol of $1.0 \times 10^3$ mL/gcm or more, a compound (c) which has an unsaturated double bond, an alkali-soluble resin (d), and a coloring material (e), in which, in the total solid content of the photosensitive coloring composition, the content of the polymerization initiator (a) is 1.5 mass % to 10 mass % and the content of the polymerization initiator (b) is 1.5 mass % to 7.5 mass %.

20 Claims, No Drawings

PHOTOSENSITIVE COLORING COMPOSITION, COLOR FILTER, METHOD FOR PRODUCING COLOR FILTER, ORGANIC EL LIQUID CRYSTAL DISPLAY DEVICE, AND COLOR FILTER FORMING KIT

CROSS-REFERENCE TO RELATED APPLICATIONS

This application is a Continuation of PCT International Application No. PCT/JP2014/070083 filed on Jul. 30, 2014, which claims priority under 35 U.S.C §119(a) to Japanese Patent Application No. 2013-173375 filed on Aug. 23, 2013. Each of the above application(s) is hereby expressly incorporated by reference, in its entirety, into the present application.

BACKGROUND OF THE INVENTION

1. Field of the Invention

The present invention relates to a photosensitive coloring composition, a color filter, a method for producing a color filter, an organic EL liquid crystal display device, and a color filter forming kit.

2. Description of the Related Art

In recent years, there has been a tendency for the demand for liquid crystal displays (LCD), particularly color liquid crystal displays, to increase along with the development of personal computers, particularly, large screen liquid crystal televisions. Due to a further demand for increases in quality, the widespread use of organic EL displays is also expected. On the other hand, due to the spread of digital cameras and mobile phones with built-in cameras, the demand for solid-state imaging elements such as CCD image sensors has also increased.

Color filters are used as the displays or as the key devices of optical elements and the demand for reduced costs has increased along with the demand for higher quality. Such color filters are generally provided with a coloring pattern of the three primary colors of red (R), green (G), and blue (B) and play a role of dividing light passing therethrough into three primary colors in the display device or imaging element.

Normal color filters are generally produced through steps of coating on a substrate, pre-baking at approximately 100° C., exposure, development, and post-baking at approximately 210° C. In addition, examples of a curing technique other than post-baking include a method for increasing the amount of a polymerization initiator and carrying out curing using an ultraviolet ray curing apparatus (JP2005-172923A and JP2005-173532A).

SUMMARY OF THE INVENTION

In recent years, the light emitting sources of liquid crystal display devices have been changed to organic EL light emitting sources and the photoelectric conversion films of image sensors have been changed to organic materials. In terms of the characteristics thereof, there is a demand for manufacturing color filters at a low temperature of approximately 100° C. On the other hand, when manufacturing color filters under conditions in which there is no post-baking at approximately 210° C., there is a tendency for the solvent resistance to deteriorate.

In addition, in the techniques according to JP2005-172923A and JP2005-173532A, when attempting to carry out curing after forming a fine pattern (for example, a pattern of 1.0 μm), the sensitivity is excessively high and there is a tendency for it to be difficult to form a fine pattern.

The present invention is to solve the above problem and has an object of providing photosensitive coloring compositions with favorable solvent resistance and which are able to form a fine pattern.

The present inventors have discovered that it is possible to solve the problem described above by blending, in a photosensitive coloring composition, a polymerization initiator with an absorption coefficient at 365 nm in methanol of $1.0\times10^3$ mL/gcm or more and a polymerization initiator with an absorption coefficient at 365 nm in methanol of $1.0\times10^2$ mL/gcm or less and an absorption coefficient at 254 nm of $1.0\times10^3$ mL/gcm or more.

In detail, the problem described above was solved by the means <1> below, preferably <2> to <20>.

<1> A photosensitive coloring composition including a polymerization initiator (a) with an absorption coefficient at 365 nm in methanol of $1.0\times10^3$ mL/gcm or more, a polymerization initiator (b) with an absorption coefficient at 365 nm in methanol of $1.0\times10^2$ mL/gcm or less and an absorption coefficient at 254 nm in methanol of $1.0\times10^3$ mL/gcm or more, a compound (c) which has an unsaturated double bond, an alkali-soluble resin (d), and a coloring material (e), in which, in the total solid content of the photosensitive coloring composition, the content of the polymerization initiator (a) is 1.5 mass % to 10 mass % and the content of the polymerization initiator (b) is 1.5 mass % to 7.5 mass %.

<2> The photosensitive coloring composition according to <1>, in which the coloring material (e) includes a red, green, or blue coloring material.

<3> The photosensitive coloring composition according to <2>, in which the coloring material (e) includes
at least one compound selected from the group consisting of C.I. Pigment Red 81, 122, 166, 177, 179, 209, 224, 242 and 254; and
at least one compound selected from the group consisting of C.I. Pigment Yellow 138, 139, 150 and 185.

<4> The photosensitive coloring composition according to <3>, wherein the coloring material (e) includes C.I. Pigment Yellow 139 and at least one compound selected from the group consisting of C.I. Pigment Red 177 and 254.

<5> The photosensitive coloring composition according to <2>, in which the coloring material (e) includes
at least one compound selected from the group consisting of C.I. Pigment Green 7, 36 and 58; and
at least one compound selected from the group consisting of C.I. Pigment Yellow 138, 139, 150 and 185.

<6> The photosensitive coloring composition according to <2>, wherein the coloring material (e) includes
at least one compound selected from the group consisting of C.I. Pigment Blue 15, 15:1, 15:2, 15:3, 15:4, 15:5, 15:6 and a triarylmethane dye; and
at least one compound selected from the group consisting of C.I. Pigment Violet 23, 19, a xanthene dye and a pyrromethene dye.

<7> The photosensitive coloring composition according to any one of <1> to <6>, in which the polymerization initiator (a) is at least one compound selected from the group consisting of
2-benzyl-2-dimethylamino-1-(4-morpholinophenyl)-butanone-1;
2-dimethylanimo-2-(4-methyl-benzyl)-1-(4-morpholin-4-yl-phenyl)-butan-1-one;
1,2-octanedione,1-[4-(phenylthio)-,2-(o-benzoyloxime)]; and ethanone,1-[9-ethyl-6-(2-methylbenzoyl)-9H-carbazole-3-yl]-,1-(O-acetyloxime).

<8> The photosensitive coloring composition according to any one of <1> to <7>, in which the polymerization initiator (b) is at least one compound selected from the group consisting of 1-hydroxy-cyclohexyl-phenyl-ketone;

2-hydroxy-2-methyl-1-phenyl-propan-1-one;

1-[4-(2-hydroxyethoxy)-phenyl]-2-hydroxy-2-methyl-1-propan-1-one; and phenylglyoxylic acid methyl ester.

<9> The photosensitive coloring composition according to any one of <1> to <8>, in which the content of the coloring material (e) is 40 mass % to 70 mass % in the total solid content of the photosensitive coloring composition.

<10> The photosensitive coloring composition according to any one of <1> to <9>, in which the compound (c) which has an unsaturated double bond includes a polyfunctional polymerizable compound.

<11> The photosensitive coloring composition according to any one of <1> to <10>, in which the alkali-soluble resin (d) has a polymerizable group.

<12> The photosensitive coloring composition according to any one of <1> to <11>, in which the polymerization initiator (a) is 1,2-octanedione,1-[4-(phenylthio)-,2-(o-benzoyloxime)] and the polymerization initiator (b) is 1-[4-(2-hydroxyethoxy)-phenyl]-2-hydroxy-2-methyl-1-propan-1-one.

<13> The photosensitive colored compound according to any one of <1> to <12>, in which the coloring material (e) includes a pigment and a pigment derivative which is represented by General Formula (I) below or General Formula (II) below,

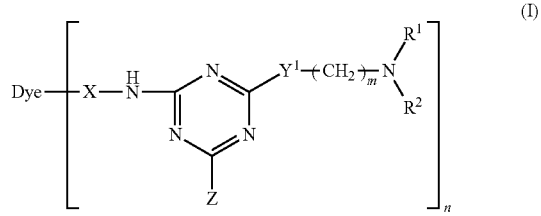

(in General Formula (I),

Dye represents a n-valent organic dye residue,

X represents a single bond, —CONH—$Y^2$—, —$SO_2$NH—$Y^2$—, or —$CH_2$NHCOCH$_2$NH—$Y^2$—, ($Y^2$ represents an alkylene group or an arylene group which may have a substituent group), $Y^1$ represents —NH— or —O—, Z represents a hydroxyl group, an alkoxy group, a group which is represented by General Formula (I-1) below, or —NH—X-Dye when n represents 1 (X has the same meaning as X in General Formula (I)) and Z represents a hydroxyl group, an alkoxy group, or a group which is represented by General Formula (I-1) below when n represents an integer of 2 to 4, $R^1$ and $R^2$ each represent an alkyl group which may have a substituent group, and $R^1$ and $R^2$ may be combined with each other to form a hetero ring which includes a nitrogen atom, m represents an integer of 1 to 6, n represents an integer of 1 to 4, and each of a plurality of X, $Y^1$, $R^1$, and $R^2$ may be the same or different when n is 2 or more),

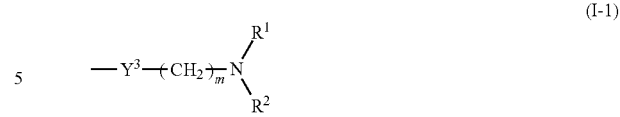

(in General Formula (I-1), $Y^3$ represents —NH— or —O—, $R^1$ and $R^2$ each represent an alkyl group which may have a substituent group, and $R^1$ and $R^2$ may be combined with each other to form a hetero ring which includes a nitrogen atom, and m represents an integer of 1 to 6),

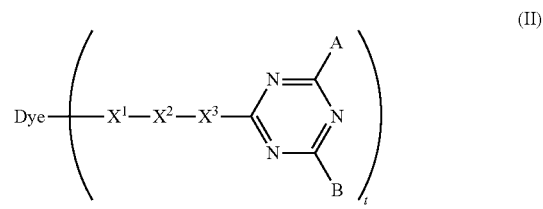

(in General Formula (II), Dye represents a quinophthalone residue which may have a substituent group, $X^1$ represents —NR'$SO_2$—, —$SO_2$NR'—, —CONR'—, —$CH_2$NR'COCH$_2$NR'—, or —NR'CO—, $X^2$ represents an arylene group with 6 to 20 carbon atoms which may have a substituent group or a hetero aromatic ring group with 4 to 20 carbon atoms which may have a substituent group, these groups may be bonded with each other by a divalent linking group selected from —NR'—, —O—, —$SO_2$—, or —CO—, $X^3$ represents —NR'— or —O—, R' represents a hydrogen atom, an alkyl group with 1 to 20 carbon atoms which may have a substituent group, an alkenyl group with 2 to 20 carbon atoms which may have a substituent group, or an aryl group with 6 to 20 carbon atoms which may have a substituent group, A and B each represent a group selected from a group which is represented by General Formula (II-1) below, a group which is represented by General Formula (II-2) below, —O—$(CH_2)_n$—$R^8$, —$OR^9$, —$NR^{10}R^{11}$—Cl, —F, and —$X^3$—$X^2$—$X^1$-Dye, $R^8$ represents a nitrogen-containing heterocyclic residue which may be substituted, $R^9$, $R^{10}$, and $R^{11}$ each represent a hydrogen atom, an alkyl group with 1 to 20 carbon atoms which may have a substituent group, an alkenyl group with 2 to 20 carbon atoms which may have a substituent group, or an aryl group with 6 to 20 carbon atoms which may have a substituent group, and n represents an integer of 0 to 20, one of A and B represents a group which is represented by General Formula (II-1) below, a group which is represented by General Formula (II-2) below, —O—$(CH_2)_n$—$R^8$, —$OR^9$, or $NR^{10}R^{11}$, and t represents an integer of 1 to 3, and a plurality of $X^1$, $X^2$, $X^3$, A, and B may be the same or may be different when t is 2 or more),

-continued

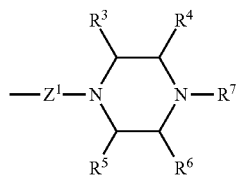
(II-2)

(in General Formula (II-1), $Y^1$ represents —NR'— or —O—, $Y^2$ represents an alkylene group with 1 to 20 carbon atoms which may have a substituent group, an alkenylene group with 2 to 20 carbon atoms which may have a substituent group, or an arylene group with 6 to 20 carbon atoms which may have a substituent group and these groups may be combined with each other by a divalent linking group selected from —NR'—, —O—, —SO$_2$—, and —CO—, R' represents a hydrogen atom, an alkyl group with 1 to 20 carbon atoms which may have a substituent group, an alkenyl group with 2 to 20 carbon atoms which may have a substituent group, or an aryl group with 6 to 20 carbon atoms which may have a substituent group, $R^1$ and $R^2$ each represent an alkyl group with 1 to 20 carbon atoms which may have a substituent group, or an alkenyl group with 2 to 20 carbon atoms which may have a substituent group, and $R^1$ and $R^2$ may be combined with each other to form a heterocyclic structure and the heterocyclic structure may further include a nitrogen atom, an oxygen atom, or a sulfur atom or may have a substituent group, and in General Formula (II-2), $Z^1$ represents a single bond which connects a triazine ring and a nitrogen atom, —NR'—, —NR'-G-CO—, NR'-G-CONR"—, —NR'-G-SO$_2$—, —NR'-G-SO$_2$NR"—, —O-G-CO—, —O-G-CONR'—, —O-G-SO$_2$—, or —O-G-SO$_2$NR'—, G represents an alkylene group with 1 to 20 carbon atoms which may have a substituent group, an alkenylene group with 2 to 20 carbon atoms which may have a substituent group, or an arylene group with 6 to 20 carbon atoms which may have a substituent group, and R' and R" each represent a hydrogen atom, an alkyl group with 1 to 20 carbon atoms which may have a substituent group, an alkenyl group with 2 to 20 carbon atoms which may have a substituent group, or an aryl group with 6 to 20 carbon atoms which may have a substituent group, and $R^3$, $R^4$, $R^5$, and $R^6$ each represent a hydrogen atom, an alkyl group with 1 to 20 carbon atoms which may have a substituent group, an alkenyl group with 2 to 20 carbon atoms which may have a substituent group, or an aryl group with 6 to 20 carbon atoms which may have a substituent group and $R^7$ represents an alkyl group with 1 to 20 carbon atoms which may have a substituent group or an alkenyl group with 2 to 20 carbon atoms which may have a substituent group.)

<14> A color filter in which the photosensitive coloring composition according to any one of <1> to <13> is used.

<15> An organic EL liquid crystal display device which has the color filter according to <14>.

<16> A method for producing a color filter, including a step (i) of forming a photosensitive coloring composition layer on a substrate using a photosensitive coloring composition; a step (ii) of exposing the photosensitive coloring composition layer using light with a wavelength of more than 350 nm to 380 nm or less; a step (iii) of carrying out alkali development on the photosensitive coloring composition layer after exposure; and a step (iv) of exposing the photosensitive coloring composition layer after alkali development using light with a wavelength of 254 nm to 350 nm, in the stated order, in which the photosensitive coloring composition contains a polymerization initiator (a) with an absorption coefficient at 365 nm in methanol of $1.0\times10^3$ mL/gcm or more, a polymerization initiator (b) with an absorption coefficient at 365 nm in methanol of $1.0\times10^2$ mL/gcm or less and an absorption coefficient at 254 nm in methanol of $1.0\times10^3$ mL/gcm or more, a compound (c) which has an unsaturated double bond, an alkali-soluble resin (d), and a coloring material (e), and with respect to the total solid content of the photosensitive coloring composition, the content of the polymerization initiator (a) is 1.5 mass % to 10 mass %, and the content of the polymerization initiator (b) is 1.5 mass % to 7.5 mass %.

<17> The method for producing a color filter according to <16>, in which, in the step (ii) of exposure using light with a wavelength of more than 350 nm to 380 nm or less, a reaction rate of the compound (c) which has an unsaturated double bond in the photosensitive coloring composition after exposure is 30% to 60%.

<18> The method for producing a color filter according to <16> or <17>, in which, in the step (iv) of exposure using light with a wavelength of 254 nm to 350 nm, a reaction rate of the compound (c) which has an unsaturated double bond in the photosensitive coloring composition after exposure is 60% to 90%.

<19> The method for producing a color filter according to any one of <16> to <18>, further including a step of heating the photosensitive coloring composition layer which is formed on the substrate at 120° C. or less.

<20> A color filter forming kit, including a photosensitive red composition which contains a red coloring material, a photosensitive green composition which contains a green coloring material, and a photosensitive blue composition which contains a blue coloring material, in which the photosensitive red composition, the photosensitive green composition, and the photosensitive blue composition each further include a polymerization initiator (a) with an absorption coefficient at 365 nm in methanol of $1.0\times10^3$ mL/gcm or more, a polymerization initiator (b) with an absorption coefficient at 365 nm in methanol of $1.0\times10^2$ mL/gcm or less and an absorption coefficient at 254 nm in methanol of $1.0\times10^3$ mL/gcm or more, a compound (c) which has an unsaturated double bond, and an alkali-soluble resin (d), and with respect to the total solid content of each of the photosensitive red composition, the photosensitive green composition, and the photosensitive blue composition, the content of the polymerization initiator (a) is 1.5 mass % to 10 mass %, and the content of the polymerization initiator (b) is 1.5 mass % to 7.5 mass %.

According to the present invention, it is possible to provide a photosensitive coloring composition with favorable solvent resistance and which is able to form a fine pattern.

DESCRIPTION OF THE PREFERRED EMBODIMENTS

In the notation of the groups (atomic groups) in the present specification, notation which does not indicate whether a group is substituted or unsubstituted encompasses a group (an atomic group) which has a substituent group as well as a group (an atomic group) which does not have a substituent group. For example, an "alkyl group" encompasses not only an alkyl group which does not have a substituent group (an unsubstituted alkyl group), but also an alkyl group which has a substituent group (a substituted alkyl group).

In addition, the "radiation" in the present specification has the meaning of, for example, the bright line spectrum of a mercury lamp, far ultraviolet rays which are represented by an excimer laser, extreme ultraviolet rays (EUV light), X-rays, electron beams, and the like. In addition, light in the present invention has the meaning of actinic rays or radiation. Unless otherwise stated, the "exposure" in the present specification includes not only exposure using a mercury lamp, far ultraviolet rays which are represented by an excimer laser, X-rays, EUV light, and the like, but also drawing using particle beams such as electron beams and ion beams.

In addition, in the present specification, "(meth)acrylate" represents both or either of acrylate and methacrylate, "(meth)acryl" represents both or either of acryl and methacryl, and "(meth)acryloyl" represents both or either of acryloyl and methacryloyl.

In addition, in the present specification, a "monomer" and "monomer" have the same meaning. A monomer in the present specification is distinct from an oligomer and a polymer and refers to a compound with a weight average molecular weight of 2,000 or less. In the present specification, a polymerizable compound refers to a compound which has a polymerizable functional group and may be a monomer and may be a polymer. A polymerizable functional group refers to a group which is involved in a polymerization reaction.

It is possible to obtain a weight average molecular weight and a number average molecular weight by gel permeation chromatography (GPC). With GPC, it is possible to obtain a polystyrene converted value by using TSK gel Super AWM-H (manufactured by Tosoh Corporation, 6.0 mmID× 15.0 cm) as a column, and 10 mmol/L lithium bromide NMP (N-methylpyrrolidinone) solution as an eluant, using, for example, HLC-8220 (produced by Tosoh Corporation). In the present specification, Me in the chemical formula represents a methyl group, Et represents an ethyl group, Pr represents a propyl group, Bu represents a butyl group, and Ph represents a phenyl group.

Regarding the word "step" in the present specification, the present technical terms include "step" not only as an independent step, but even in a case where it is not possible to make a clear distinction with other steps as long as the expected effect of the step is achieved.

<Photosensitive Coloring Composition>

The photosensitive coloring composition of the present invention contains a polymerization initiator (a) with an absorption coefficient at 365 nm in methanol of $1.0 \times 10^3$ mL/gcm or more, a polymerization initiator (b) with an absorption coefficient at 365 nm in methanol of $1.0 \times 10^2$ mL/gcm or less and an absorption coefficient at 254 nm in methanol of $1.0 \times 10^3$ mL/gcm or more, a compound (c) which has an unsaturated double bond, an alkali-soluble resin (d), and a coloring material (e), in which the content of the polymerization initiator (a) is 1.5 mass % to 10 mass % in the total solid content of the photosensitive coloring composition and the content of the polymerization initiator (b) is 1.5 mass % to 7.5 mass %.

It is possible to make the solvent resistance favorable and it is possible to form a fine pattern by using the photosensitive coloring composition of the present invention.

<<Polymerization Initiator (a) with an Absorption Coefficient of 365 nm in Methanol of $1.0 \times 10^3$ mL/gcm or More>>

Regarding the polymerization initiator (a) with an absorption coefficient at 365 nm in methanol of $1.0 \times 10^3$ mL/gcm or more (referred to below as a polymerization initiator (a)) which is used in the present invention, the absorption coefficient at 365 nm in methanol satisfies $1.0 \times 10^3$ mL/gcm or more, preferably $1.0 \times 10^3$ mL/gcm to $1.0 \times 10^4$ mL/gcm, more preferably $2.0 \times 10^3$ mL/gcm to $9.0 \times 10^3$ mL/gcm, and even more preferably $6.0 \times 10^3$ mL/gcm to $8.0 \times 10^3$ mL/gcm.

It is possible to favorably use an oxime compound, an aminoacetophenone compound, and an acyl phosphine compound as the polymerization initiator (a), and an oxime compound is preferable. In more detail, for example, it is also possible to use the aminoacetophenone-based initiator described in JP1998-291969A (JP-H10-291969A) and the acyl phosphine oxide-based initiator described in JP4225898A.

It is possible to use the compounds described in JP2001-233842A, the compounds described in JP2000-80068A, and the compounds described in JP2006-342166A as an oxime compound.

In detail, the oxime compound is preferably a compound which is represented by General Formula (OX-1) below. Here, the oxime compound may be an oxime compound of which the N—O bond of the oxime may be an (E) body, may be an oxime compound of a (Z) body, or may be a mixture of an (E) body and a (Z) body.

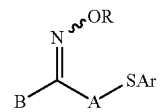

(OX-1)

In General Formula (OX-1), R and B each independently represent a monovalent substituent group, A represents a divalent organic group, and Ar represents an aryl group.

In General Formula (OX-1), a monovalent substituent group which is represented by R is preferably a monovalent non-metallic atomic group.

Examples of the monovalent non-metallic atomic group include an alkyl group, an aryl group, an acyl group, an alkoxycarbonyl group, an aryloxycarbonyl group, a heterocyclic group, an alkylthiocarbonyl group, an arylthiocarbonyl group, and the like. In addition, the groups may have one or more substituent groups. In addition, the substituent groups described above may be further substituted with another substituent group.

Examples of the substituent groups include a halogen atom, an aryloxy group, an alkoxycarbonyl group or an aryloxycarbonyl group, an acyloxy group, an acyl group, an alkyl group, an aryl group, and the like.

The alkyl group is preferably an alkyl group with 1 to 30 carbon atoms and, specifically, it is possible to refer to paragraph "0025" in JP2009-191061A, the entire contents of which are incorporated herein by reference.

The aryl group is preferably an aryl group with 6 to 30 carbon atoms and, specifically, it is possible to refer to paragraph "0026" in JP2009-191061A, the entire contents of which are incorporated herein by reference.

The acyl group is preferably an acyl group with 2 to 20 carbon atoms and, specifically, it is possible to refer to paragraph "0033" in JP2009-191061A, the entire contents of which are incorporated herein by reference.

The alkoxycarbonyl group is preferably an alkoxycarbonyl group with 2 to 20 carbon atoms and, specifically, it is possible to refer to paragraph "0034" in JP2009-191061A, the entire contents of which are incorporated herein by reference.

The aryloxycarbonyl group is preferably an aryloxycarbonyl group with 6 to 30 carbon atoms and, specifically, it is possible to refer to paragraph "0035" in JP2009-191061A, the entire contents of which are incorporated herein by reference.

The heterocyclic group is preferably an aromatic or aliphatic hetero ring which includes a nitrogen atom, an oxygen atom, a sulfur atom, or a phosphorus atom.

In detail, it is possible to refer to paragraph "0037" in JP2009-191061A, the entire contents of which are incorporated herein by reference.

The alkylthiocarbonyl group is specifically preferably an alkylthiocarbonyl group with 1 to 20 carbon atoms and it is possible to refer to paragraph "0038" in JP2009-191061A, the entire contents of which are incorporated herein by reference.

The arylthiocarbonyl group is specifically preferably an arylthiocarbonyl group with 6 to 30 carbon atoms and it is possible to refer to paragraph "0039" in JP2009-191061A, the entire contents of which are incorporated herein by reference.

In General Formula (OX-1), a monovalent substituent group which is represented by B represents an aryl group, a heterocyclic group, an arylcarbonyl group, or a heterocyclic carbonyl group. In addition, the groups may have one or more substituent groups. Examples of the substituent groups include the substituent groups described above. In addition, the substituent groups may be further substituted with another substituent group.

Among these, it is possible to particularly preferably refer to paragraph "0044" in JP2009-191061A, the entire contents of which are incorporated herein by reference.

In Formula (OX-1), examples of the divalent organic group which is represented by A include an alkylene group with 1 to 12 carbon atoms, a cycloalkylene group, and an alkynylene group. In addition, the groups may have one or more substituent groups. Examples of the substituent groups include the substituent groups described above. In addition, the substituent groups described above may be further substituted with another substituent group.

Among these, in terms of increasing the sensitivity and suppressing coloring due to heating over time, A in Formula (OX-1) is preferably an unsubstituted alkylene group, an alkylene group which is substituted with an alkyl group (for example, a methyl group, an ethyl group, a tert-butyl group, and a dodecyl group), an alkylene group which is substituted with an alkenyl group (for example, a vinyl group and an allyl group), and an alkylene group which is substituted with an aryl group (for example, a phenyl group, a p-tolyl group, a xylyl group, a cumenyl group, a naphthyl group, an anthryl group, a phenanthryl group, and a styryl group).

In Formula (OX-1), an aryl group which is represented by Ar is preferably an aryl group with 6 to 30 carbon atoms and moreover may have a substituent group. Examples of the substituent group include the same examples as the substituent groups which are introduced in the substituted aryl groups which were previously exemplified as specific examples of the aryl groups which may have a substituent group.

Among these, in terms of increasing the sensitivity and suppressing coloring due to heating over time, a substituted or unsubstituted phenyl group is preferable.

In Formula (OX-1), for a preferable structure of "SAr" which is formed by Ar in Formula (OX-1) and S which is adjacent thereto, it is possible to refer to paragraph "0049" described in JP2009-191061A, the entire contents of which are incorporated herein by reference.

For the oxime compound, it is possible to refer to paragraphs "0050" to "0106" in JP2009-191061A, the entire contents of which are incorporated herein by reference.

As specific examples of the oxime compound, it is preferable to use 1,2-octanedione,1-[4-(phenylthio)-,2-(O-benzoyloxime)](for example, Irgacure OXE 01), ethanone, and 1-[9-ethyl-6-(2-methylbenzoyl)-9H-carbazole-3-il]],1-(O-acetyloxime) (for example, Irgacure OXE 02).

As an aminoacetophenone compound, it is possible to use Irgacure 369 and Irgacure 379 (the above are product names, both are produced by BASF Corporation) and the like which are commercially available products.

As an aminoacetophenone compound, it is also possible to use the compounds described in JP2009-191179A where the absorption wavelength is matched with a long wavelength light source such as 365 nm or 405 nm.

In addition, as an acyl phosphine compound, it is possible to use Irgacure 819 (the above is a product name, produced by BASF Corporation) and the like which are commercially available products.

The polymerization initiator (a) is preferably 2-benzyl-2-dimethylamino-1-(4-morpholinophenyl)-butanone-1 (for example, Irgacure 369), 2-dimethylamino-2-(4-methyl-benzyl)-1-(4-morpholine-4-il-phenyl)-butan-1-one (for example, Irgacure 379), bis(2,4,6-trimethylbenzoyl)-phenylphosphine oxide (for example, Irgacure 819), 1,2-octanedione,1-[4-(phenylthio)-,2-(O-benzoyloxime)], ethanone,1-[9-ethyl-6-(2-methylbenzoyl)-9H-carbazole-3-il]-,1-(O-acetyloxime), and the like.

Among these, at least one compound selected from the group consisting of 2-benzyl-2-dimethylamino-1-(-4-morpholinophenyl)-butanone-1,2-dimethylamino-2-(4-methyl-benzyl)-1-(4-morpholine-4-il-phenyl)-butan-1-one, 1,2-octanedione,1-[4-(phenylthio)-,2-(O-benzoyloxime)], and ethanone,1-[9-ethyl-6-(2-methylbenzoyl)-9H-carbazole-3-il]-,1-(O-acetyloxime) is preferable.

At least one type of 1,2-octanedione,1-[4-(phenylthio)-, 2-(O-benzoyloxime)] and ethanone,1-[9-ethyl-6-(2-methylbenzoyl)-9H-carbazole-3-il]-,1-(O-acetyloxime) are particularly preferable, and 1,2-octanedione,1-[4-(phenylthio)-, 2-(O-benzoyloxime) is more preferable.

The content of the polymerization initiator (a) is preferably 1.5 mass % to 10 mass % of the total solid content of the composition of the present invention and more preferably 3 mass % to 8 mass %. When the content of the polymerization initiator (a) exceeds 10 mass %, the sensitivity is excessively high and it is difficult to form a fine pattern (for example, a pattern of 1.0 µm or less). In addition, when the content of the polymerization initiator (a) is less than 1.5 mass %, desensitization occurs over time. In addition, the solvent resistance deteriorates. In addition, acicular foreign matter are easily generated. The polymerization initiator (a) may be used as one type individually or two or more types may be used together.

<<Polymerization Initiator (b) with an Absorption Coefficient at 365 nm in Methanol of $1.0 \times 10^2$ mL/gcm or Less and an Absorption Coefficient at 254 nm in Methanol of $1.0 \times 10^3$ mL/gcm or More>>

Regarding the polymerization initiator (b) with an absorption coefficient at 365 nm in methanol of $1.0 \times 10^2$ mL/gcm or less and with an absorption coefficient of 254 nm in methanol of $1.0 \times 10^3$ mL/gcm or more which is used in the present invention (simply referred to below as a polymerization initiator (b) with an absorption coefficient at 365 nm in methanol of $1.0 \times 10^2$ mL/gcm or less or as a polymerization initiator (b)), the polymerization initiator (b) with an absorption coefficient at 365 nm in methanol satisfies $1.0 \times$ $10^2$ mL/gcm or less, preferably 10 mL/gcm to $1.0\times10^2$ mL/gcm, and more preferably 20 mL/gcm to $9.0\times10^2$ mL/gcm.

The difference in the absorption coefficients at the wavelength 365 nm between the polymerization initiator (a) and the polymerization initiator (b) is $9.0\times10^2$ mL/gcm or more, preferably $9.0\times10^2$ mL/gcm to $1.0\times10^5$ mL/gcm, and more preferably $9.0\times10^2$ mL/gcm to $1.0\times10^4$ mL/gcm.

In addition, the polymerization initiator (b) has an absorption coefficient at 254 nm in methanol of $1.0\times10^3$ mL/gcm or more, preferably $1.0\times10^3$ mL/gcm to $1.0\times10^6$ mL/gcm, and more preferably $5.0\times10^3$ mL/gcm to $1.0\times10^5$ mL/gcm.

As the polymerization initiator (b), it is possible to favorably use a hydroxy acetophenone compound, an aminoacetophenone compound, and an acyl phosphine compound. In more detail, for example, it is also possible to use the aminoacetophenone-based initiator described in JP1998-291969A (JP-H10-291969A) and the acyl phosphine oxide-based initiator described in JP4225898A. In particular, a hydroxy acetophenone compound is preferable.

The hydroxy acetophenone compound is preferably a compound which is represented by Formula (V) below.

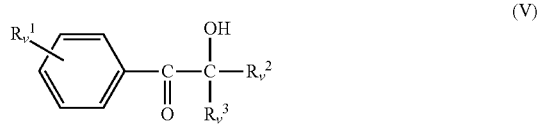

In Formula (V), $Rv^1$ represents a hydrogen atom, an alkyl group (preferably an alkyl group with 1 to 10 carbon atoms), an alkoxy group (preferably an alkoxy group with 1 to 10 carbon atoms), or a divalent organic group. In a case where $Rv^1$ is a divalent organic group, $Rv^1$ represents a dimer formed by two photosensitive hydroxy acetophenone structures (that is, a structure in which the substituent group $Rv^1$ is excluded from the compound which is represented by General Formula (V)) bonding with each other via $Rv^1$. $Rv^2$ and $Rv^3$ each independently represent a hydrogen atom or an alkyl group (preferably an alkyl group with 1 to 10 carbon atoms). In addition, $Rv^2$ and $Rv^3$ may be combined with each other to form a ring (preferably a ring with 4 to 8 carbon atoms). The alkyl group and the alkoxy group as $Rv^1$ described above, the alkyl group as $Rv^2$ and $Rv^3$, and the ring which is formed by $Rv^2$ and $Rv^3$ bonding with each other may further have a substituent group.

Examples of the polymerization initiator (b) include 1-hydroxy-cyclohexyl-phenyl-ketone (for example, Irgacure 184), 2-hydroxy-2-methyl-1-phenyl-propan-1-one (for example, Darocur 1173), 1-[4-(2-hydroxyethoxy)-phenyl]-2-hydroxy-2-methyl-1-propan-1-one (for example, Irgacure 2959), oxy-phenyl-acetic acid 2-[2-oxo-2-phenyl-acetoxy-ethoxy]-ethyl ester (for example, Irgacure 754), phenylglyoxylic acid methyl ester (for example, Darocur MBF), and the like.

Among these, at least one compound selected from the group consisting of 1-hydroxy-cyclohexyl-phenyl-ketone, 2-hydroxy-2-methyl-1-phenyl-propan-1-one, 1-[4-(2-hydroxyethoxy)-phenyl]-2-hydroxy-2-methyl-1-propan-1-one, and phenylglyoxylic acid methyl ester is preferable.

In particular, 1-[4-(2-hydroxyethoxy)-phenyl]-2-hydroxy-2-methyl-1-propan-1-one is preferable.

The content of the polymerization initiator (b) is preferably 1.5 mass % to 7.5 mass % of the total solid content of the composition of the present invention and more preferably 2 mass % to 6 mass %. When the content of the polymerization initiator (b) exceeds 7.5 mass %, the added amount of other components in the composition of the present invention is excessively decreased and, as a result, the pattern forming property is deteriorated. In addition, when the content of the polymerization initiator (b) is less than 1.5 mass %, for example, since the curing rate during exposure using light other than light with a wavelength of more than 350 nm to 380 nm or less (specifically, light with a wavelength other than i rays) is insufficient, the solvent resistance deteriorates. The polymerization initiator (b) may be used as one type individually or two or more types may be used together.

<<Compound (c) which has an Unsaturated Double Bond>>

The composition of the present invention may contain a compound (c) which has an unsaturated double bond (also referred to below as a polymerizable compound). In the present invention, examples thereof include a polymerizable compound which includes an ethylenic unsaturated bond and are favorably selected from compounds which have at least one terminal ethylenic unsaturated bond, preferably two or more terminal ethylenic unsaturated bonds. Among these, a polyfunctional polymerizable compound is preferable, a polymerizable compound with three or more functional groups is preferable, and a polymerizable compound with four or more functional groups is more preferable. The upper limit is not particularly set; however, 8 or less functional groups is preferable, and 6 or less functional groups is more preferable.

The compound (c) which has an unsaturated double in the present invention may be used as one type individually or two or more types may be used together.

As the compound (c) which has an unsaturated double bond, a compound which has an ethylenic unsaturated group which has at least one addition-polymerizable ethylene group and which has a boiling point of 100° C. or more under normal pressure is also preferable. Examples thereof include monofunctional acrylate or methacrylate such as polyethylene glycol mono(meth)acrylate, polypropylene glycol mono(meth)acrylate, and phenoxy ethyl (meth)acrylate, polyfunctional acrylate or methacrylate such as polyfunctional acrylate or methacrylate which is (meth)acrylated after adding ethylene oxide or propylene oxide to polyfunctional alcohol such as polyethylene glycol di(meth)acrylate, trimethylol ethane tri(meth)acrylate, neopentyl glycol di(meth)acrylate, pentaerythritol tri(meth)acrylate, pentaerythritol tetra(meth)acrylate, dipentaerythritol penta(meth)acrylate, dipentaerythritol hexa(meth)acrylate, hexanediol (meth)acrylate, trimethylol propane tri(acryloyloxypropyl) ether, tri(acryloyloxyethyl) isocyanurate, glycerin, and trimethylol ethane, the urethane (meth)acrylates described in JP1973-41708B (JP-S48-41708B), JP1975-6034B (JP-S50-6034B), and JP1976-37193A (JP-S51-37193A), the polyester acrylates described in JP1973-64183A (JP-S48-64183A), JP1974-43191B (JP-S49-43191B), and JP1977-30490B (JP-S52-30490B), and epoxy acrylates which are the reaction products of an epoxy resin and (meth)acrylic acid, and mixtures thereof.

Examples thereof also include polyfunctional (meth)acrylate and the like which are obtained by reacting a compound which has a cyclic ether group such as glycidyl (meth)acrylate and an ethylenic unsaturated group in a polyfunctional carboxylic acid.

In addition, as other preferable polymerizable compounds, it is also possible to use a compound which has a fluorene ring and which has two or more functional groups of ethylenic unsaturated groups, and a cardo resin described in JP2010-160418A, JP2010-129825A, JP4364216A, and the like.

In addition, as a compound which has a boiling point of 100° C. or more under normal pressure and which has at least one addition-polymerizable ethylenic unsaturated group, the compounds according to paragraphs "0254" to "0257" in JP2008-292970A are also favorable.

Apart from the above, it is also possible to favorably use radical polymerizable monomers which are represented by General Formulas (MO-1) to (MO-5) below. Here, in the formulas, in a case where T is an oxyalkylene group, the terminal on the carbon atom side is bonded with R.

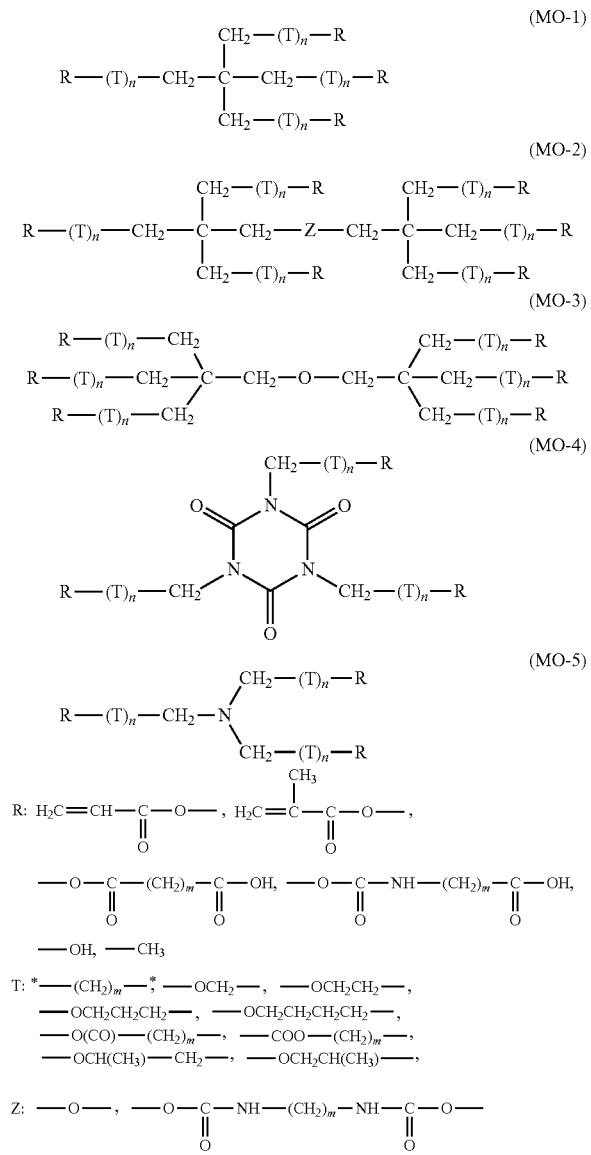

In General Formulas, n is 0 to 14 and m is 1 to 8. R and T of which a plurality are present in one molecule may each be the same or may be different.

In each of the polymerizable compounds which are represented by General Formulas (MO-1) to (MO-5), at least one of the plurality of R represents a group which is represented by —OC(=O)CH=CH$_2$ or —OC(=O)C(CH$_3$)=CH$_2$.

As specific examples of the polymerizable compounds which are represented by General Formulas (MO-1) to (MO-5), it is also possible to favorably use the compounds according to paragraphs "0248" to "0251" in JP2007-269779A in the present invention.

In addition, as a polymerizable compound, along with the specific examples as General Formulas (1) and (2) in JP1998-62986A (JP-H10-62986A), it is also possible to use a compound which is (meth)acrylated after adding ethylene oxide or propylene oxide to the polyfunctional alcohol described above.

Among these, as a polymerizable compound, a structure in which dipentaerythritol triacrylate (as a commercially available product, KAYARAD D-330; produced by Nippon Kayaku Co., Ltd.), dipentaerythritol tetraacrylate (as a commercially available product, KAYARAD D-320; produced by Nippon Kayaku Co., Ltd.), dipentaerythritol penta(meth)acrylate (as a commercially available product, KAYARAD D-310; produced by Nippon Kayaku Co., Ltd.), dipentaerythritol hexa(meth)acrylate (as a commercially available product, KAYARAD DPHA; produced by Nippon Kayaku Co., Ltd., KAYARAD RP-1040; produced by Nippon Kayaku Co., Ltd., and A-DPH-12E; produced by Shin-Nakamura Chemical Co., Ltd.), and the (meth)acryloyl groups thereof are via ethylene glycol and propylene glycol residue is preferable. It is also possible to use oligomer types thereof. The forms of preferable polymerizable compounds will be given below.

The polymerizable compound is a polyfunctional monomer and may have an acid group such as a carboxyl group, a sulfonic acid group, and a phosphoric acid group. When an ethylenic compound has an unreacted carboxyl group such as in the case of being a mixture as described above, it is possible to use this as it is; however, as necessary, an acid group may be introduced by reacting a non-aromatic carboxylic acid anhydride with the hydroxyl group of the ethylenic compound described above. In this case, specific examples of the non-aromatic carboxylic acid anhydride to be used include tetrahydrophthalic acid anhydride, alkylation tetrahydrophthalic acid anhydride, hexahydrophthalic acid anhydride, alkylation hexahydrophthalic acid anhydride, succinic anhydride, and maleic anhydride.

In the present invention, a monomer which has an acid group is an ester of an aliphatic polyhydroxy compound and unsaturated carboxylic acid, preferably a polyfunctional monomer which has an acid group by reacting a non-aromatic carboxylic acid anhydride with an unreacted hydroxyl group of an aliphatic polyhydroxy compound, and particularly preferably a monomer where the aliphatic polyhydroxy compound is pentapentaerythritol and/or dipentaerythritol in the ester. Examples of commercially available products thereof include M-510 and M-520 as polybasic acid-modified acryl oligomers produced by Toagosei Co., Ltd.

The monomers may be used as one type individually; however, since it is difficult to use a single compound in terms of manufacturing, two or more types may be mixed and used. In addition, as necessary, a polyfunctional monomer which does not have an acid group and a polyfunctional monomer which has an acid group may be used together as a monomer.

The acid value of the polyfunctional monomer which has an acid group is preferably 0.1 mgKOH/g to 40 mgKOH/g and particularly preferably 5 mgKOH/g to 30 mgKOH/g. When the acid value of the polyfunctional monomer is excessively low, the developer dissolving characteristics decrease and, when the acid value is excessively high, the manufacturing and the handling are difficult, the photopolymerization performance decreases, and the curing property such as surface smoothness of pixels is deteriorated. Accordingly, in a case of using two or more types of polyfunctional monomers with different acid groups together or in a case of using polyfunctional monomers which do not have an acid group together, it is preferable to carry out adjustment such that the acid groups are within the range described above for the whole polyfunctional monomer.

In addition, as a polymerizable monomer, a preferable aspect also contains a polyfunctional monomer which has a caprolactone structure.

The polyfunctional monomer which has a caprolactone structure is not particularly limited as long as the monomer has a caprolactone structure in the molecules thereof; however, examples thereof include polyhydric alcohols such as trimethylol ethane, ditrimethylol ethane, trimethylol propane, ditrimethylol propane, pentaerythritol, dipentaerythritol, tripentaerythritol, glycerin, diglycerol, and trimethylol melamine, and ε-caprolactone-modified polyfunctional (meth)acrylate which is obtained by esterifying the (meth) acrylic acid and ε-caprolactone. Among these, the polyfunctional monomer which has the caprolactone structure which is represented by General Formula (Z-1) below is preferable.

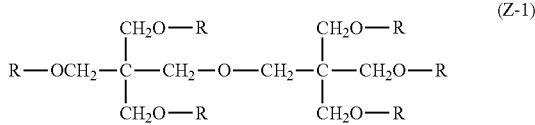

(Z-1)

In General Formula (Z-1), 6 of R are all groups which are represented by General Formula (Z-2) below or 1 to 5 out of 6 of R are groups which are represented by General Formula (Z-2) and the remainder are groups which are represented by General Formula (Z-3) below.

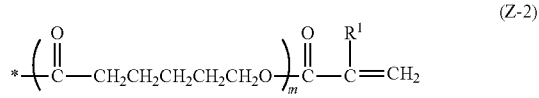

(Z-2)

In General Formula (Z-2), $R^1$ represents a hydrogen atom or a methyl group, m indicates a number of 1 or 2, and "*" indicates a bond.

(Z-3)

In General Formula (Z-3), $R^1$ represents a hydrogen atom or a methyl group and "*" indicates a bond.

Polyfunctional monomers which have such a caprolactone structure are commercially available, for example, as the KAYARAD DPCA series from Nippon Kayaku Co., Ltd., and examples thereof include DPCA-20 (a compound where, in Formulas (1) to (3) described above, m=1, the number of the groups which are represented by Formula (2)=2, and $R^1$ are all hydrogen atoms), DPCA-30 (a compound where, in the same formulas, m=1, the number of the groups which are represented by Formula (2)=3, and $R^1$ are all hydrogen atoms), DPCA-60 (a compound where, in the same formulas, m=1, the number of the groups which are represented by Formula (2)=6, and $R^1$ are all hydrogen atoms), DPCA-120 (a compound where, in the same formulas, m=2, the number of the groups which are represented by Formula (2)=6, and $R^1$ are all hydrogen atoms), and the like.

In the present invention, it is possible to use the polyfunctional monomer which has a caprolactone structure individually or in a mixture of two or more types.

In addition, the specific monomer in the present invention is also preferably at least one type selected from a group of compounds which are represented by General Formula (Z-4) or (Z-5) below.

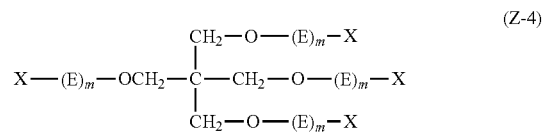

(Z-4)

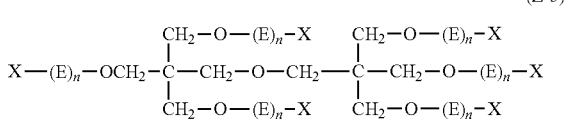

(Z-5)

In General Formulas (Z-4) and (Z-5), E each independently represents —$((CH_2)yCH_2O)$— or —$((CH_2)yCH(CH_3)O)$—, y each independently represents an integer of 0 to 10, X each independently represents an acryloyl group, a methacryloyl group, a hydrogen atom, or a carboxyl group.

In General Formula (Z-4), the total of the acryloyl groups and the methacryloyl groups is 3 or 4, m each independently represents an integer of 0 to 10, and the total of each m is an integer of 0 to 40. Here, in a case where the total of each m is 0, any one of the X is a carboxyl group.

In General Formula (ii), the total of the acryloyl groups and the methacryloyl groups is 5 or 6, n each independently represents an integer of 0 to 10, and the total of each n is an integer of 0 to 60. Here, in a case where the total of each n is 0, any one of the X is a carboxyl group.

In General Formula (Z-4), m is preferably an integer of 0 to 6 and more preferably an integer of 0 to 4.

In addition, the total of each m is preferably an integer of 2 to 40, more preferably an integer of 2 to 16, and particularly preferably an integer of 4 to 8.

In General Formula (Z-5), n is preferably an integer of 0 to 6 and more preferably an integer of 0 to 4.

In addition, the total of each n is preferably an integer of 3 to 60, more preferably an integer of 3 to 24, and particularly preferably an integer of 6 to 12.

In addition, —$((CH_2)yCH_2O)$— or —$((CH_2)yCH(CH_3)O)$— in General Formula (Z-4) or General Formula (Z-5) are preferably in a form in which the terminal on the oxygen atom side is bonded with X.

The compound which is represented by General Formula (Z-4) or General Formula (Z-5) may be used as one type individually or two or more types may be used together. In particular, in General Formula (ii), a form in which 6 of X are all acryloyl groups is preferable.

In addition, the total content of the compounds which are represented by General Formula (Z-4) or General Formula (Z-5) in the polymerizable compound is preferably 20 mass % or more and more preferably 50 mass % or more.

It is possible to synthesize the compounds which are represented by General Formula (Z-4) or (Z-5) from a step of bonding a ring-opening skeleton with pentaerythritol or dipentaerythritol by a ring-opening adding reaction of ethylene oxide or propylene oxide, and a step of introducing a (meth)acryloyl group by reacting, for example, (meth)acryloyl chloride with the terminal hydroxyl group of the ring-opening skeleton, which are steps which are known in the prior art. Each of the steps is a well-known step, and it is possible for a person skilled in the art to easily synthesize the compounds which are represented by General Formula (i) or (ii).

Among the compounds which are represented by General Formula (Z-4) or (Z-5), a pentaerythritol derivative and/or a dipentaerythritol derivative is more preferable.

Specific examples thereof include the compounds which are represented by Formulas (a) to (f) below (also referred to below as "example compounds (a) to (f)"), and among these, the example compounds (a), (b), (e), and (f) are preferable.

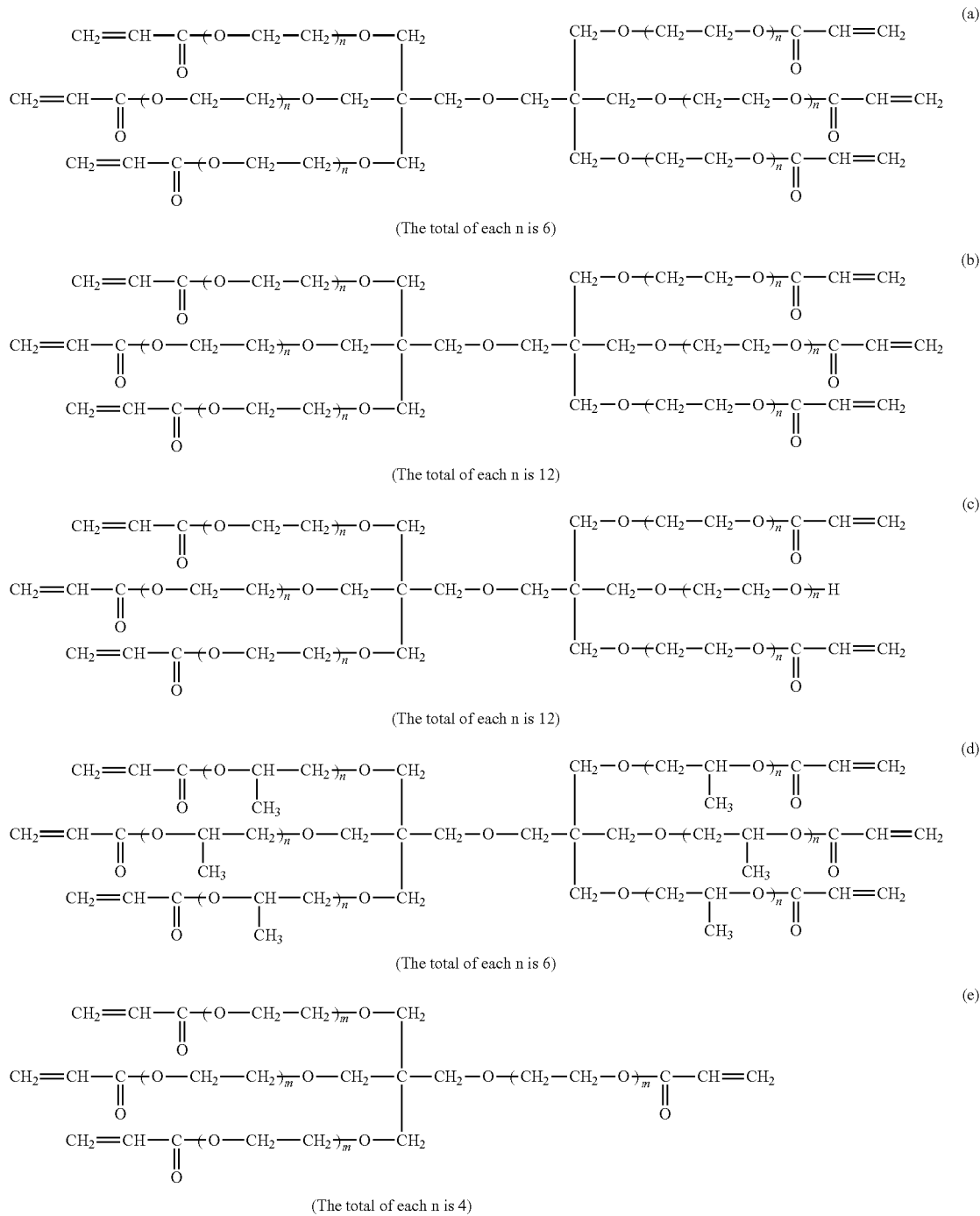

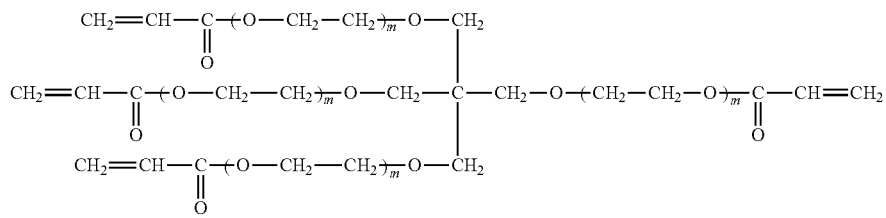

(f)

(The total of each n is 12)

Examples of commercially available products of the polymerizable monomer which are represented by General Formulas (Z-4) and (Z-5) include SR-494 which is a tetrafunctional acrylate which has four ethylene oxy chains produced by Sartomer Corporation, DPCA-60 which is a hexafunctional acrylate which has six pentyleneoxy chains and TPA-330 which is a trifunctional acrylate which has three isobutylene oxy chains produced by Nippon Kayaku Co., Ltd., and the like.

In addition, as the polymerizable monomer, the urethane acrylates according to JP1973-41708B (JP-S48-41708B), JP1976-37193A (JP-S51-37193A), JP1990-32293B (JP-H2-32293B), and JP1990-16765B (JP-H2-16765B), and the urethane compounds which have an ethylene oxide skeleton according to JP1983-49860B (JP-S58-49860B), JP1981-17654B (JP-S56-17654B), JP1987-39417B (JP-S62-39417B), and JP1987-39418B (JP-S62-39418B) are also favorable. Furthermore, as the polymerizable monomers, it is possible to obtain a curable composition with an extremely excellent photosensitive speed by using the addition-polymerizable monomers which have an amino structure or a sulfide structure in the molecule according to JP1988-277653A (JP-S63-277653A), JP1988-260909A (JP-S63-260909A), and JP1989-105238A (JP-H1-105238A).

Examples of commercially available products of the polymerizable monomers include urethane oligomer UAS-10 and UAB-140 (produced by Sanyo-kokusaku Pulp Co., Ltd.), UA-7200 (produced by Shin-Nakamura Chemical Co., Ltd.), DPHA-40H (produced by Nippon Kayaku Co., Ltd.), UA-306H, UA-306T, UA-306I, AH-600, T-600, and AI-600 (produced by Kyoeisha Chemical Co., Ltd.), trimethylol propane triacrylate (as a commercially available product, A-TMPT; produced by Shin-Nakamura Chemical Co., Ltd.), and the like.

In a case where the composition of the present invention contains a compound (c) which has an unsaturated double bond, the content of the compound (c) which have an unsaturated double bond is preferably 1 mass % to 20 mass % with respect to the total solid content in the composition, more preferably 2 mass % to 15 mass %, and particularly preferably 4 mass % to 9 mass %.

<<Alkali-Soluble Resin (d)>>

The composition of the present invention may further contain an alkali-soluble resin as a binder. Here, the components which are contained in the composition of the present invention as dispersing agent components are not included in the alkali-soluble resin referred to here.

The alkali-soluble resin is a linear organic high molecular weight polymer and it is possible to appropriately select the alkali-soluble resin from alkali-soluble resins which have at least one group which promotes alkali-solubility in the molecule (preferably a molecule which has an acryl-based copolymer and a styrene-based copolymer as the main chain). A polyhydroxy styrene-based resin, a polysiloxane-based resin, an acryl-based resin, an acrylamide-based resin, and an acryl/acrylamide copolymer resin are preferable from the point of view of the heat resistance, and an acryl-based resin, an acrylamide-based resin, and an acryl/acrylamide copolymer resin are preferable from the point of view of the developing control.

Examples of the group (also referred to below as an acid group) which promotes the alkali-solubility include a carboxyl group, a phosphoric acid group, a sulfonic acid group, a phenolic hydroxyl group, and the like; however, a group which is able to dissolve in an organic solvent and which is able to be developed by a weak alkali aqueous solution is preferable, and particularly preferable examples thereof include (meth)acrylic acid. The acid groups may be one type only or may be two or more types.

Examples of monomers which may add an acid group after the polymerization include a monomer which has a hydroxyl group such as 2-hydroxyethyl (meth)acrylate, a monomer which has an epoxy group such as glycidyl (meth)acrylate, a monomer which has an isocyanate group such as 2-isocyanate ethyl (meth)acrylate, and the like. The monomers for introducing an acid group may be one type only or may be two or more types. In order to introduce an acid group to an alkali-soluble resin, for example, a monomer which has an acid group and/or a monomer which may add an acid group after polymerization (also referred to below as a "monomer for introducing an acid group") may be polymerized as a monomer component.

Here, in a case of introducing an acid group using a monomer which may add an acid group after polymerization as a monomer component, a process for adding, for example, the acid group which will be described below after polymerization is necessary.

It is possible to apply a method, for example, using a radical polymerization method which is known in the art to manufacture the alkali-soluble resin. It is possible for a person skilled in the art to easily set the polymerization conditions such as the temperature, pressure, the type of the radical initiator and the amount thereof, and the type of solvent when manufacturing an alkali-soluble resin using a radical polymerization method and it is also possible to set the conditions experimentally.

A linear organic high molecular weight polymer which is used as an alkali-soluble resin is preferably a polymer which has carboxylic acid in a side chain and examples thereof include a methacrylic acid copolymer, an acrylic acid copolymer, an itaconic acid copolymer, a crotonic acid copolymer, a maleic acid copolymer, a partially esterified maleic acid copolymer, alkali-soluble phenol resins such as a novolak type resin, and the like and an acidic cellulose derivative which has a carboxylic acid in the side chain, and polymers where acid anhydride is added to a polymer which has a hydroxyl group. In particular, a copolymer of (meth)acrylic acid and another monomer which is able to be copolymerized therewith is favorable as an alkali-soluble resin. Examples of the other monomer which is able to be copolymerized with (meth)acrylic acid include alkyl (meth)acrylate, aryl (meth)acrylate, a vinyl compound, and the like. Examples of alkyl (meth)acrylate and aryl (meth)acrylate include methyl (meth)acrylate, ethyl (meth)acrylate, propyl (meth)acrylate, butyl (meth)acrylate, isobutyl (meth)acrylate, pentyl (meth)acrylate, hexyl (meth)acrylate, octyl (meth)acrylate, phenyl (meth)acrylate, benzyl (meth) acrylate, tolyl (meth)acrylate, naphthyl (meth)acrylate, cyclohexyl (meth)acrylate, and the like, examples of the vinyl compound include styrene, α-methyl styrene, vinyl toluene, glycidyl methacrylate, acrylonitrile, vinyl acetate, N-vinylpyrrolidone, tetrahydro furfuryl methacrylate, polystyrene macromonomer, polymethyl methacrylate macromonomer, and the like, and examples of N-position substituted maleimide monomers according to JP1998-300922A (JP-H10-300922A) include N-phenyl maleimide, N-cyclohexyl maleimide, and the like. Here, the other monomers which are able to be copolymerized with the (meth)acrylic acids may be one type only or may be two or more types.

An alkali-soluble resin also preferably include a polymer (a) which is formed by polymerizing monomer components where a compound (also referred to below as an "ether dimer") which is illustrated by General Formula (ED) below is essential.

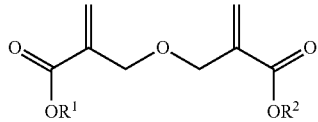

General Formula (ED)

In General Formula (ED), $R^1$ and $R^2$ each independently represent a hydrogen atom or a hydrocarbon group with 1 to 25 carbon atoms which may have a substituent group.

Due to this, the coloring composition of the present invention may form a cured coating film which has extremely excellent transparency along with heat resistance. In General Formula (1) which illustrates the ether dimer, the hydrocarbon group with 1 to 25 carbon atoms which may have a substituent group which is represented by $R^1$ and $R^2$ is not particularly limited; however, examples thereof include a straight-chain or branched alkyl group such as methyl, ethyl, n-propyl, isopropyl, n-butyl, isobutyl, tert-butyl, tert-amyl, stearyl, lauryl, and 2-ethylhexyl; an aryl group such as phenyl; an alicyclic group such as cyclohexyl, tert-butylcyclohexyl, dicyclopentadienyl, tricyclodecanyl, isobornyl, adamantyl, and 2-methyl-2-adamantyl; an alkyl group which is substituted with an alkoxy such as 1-methoxyethyl and 1-ethoxyethyl; an alkyl group which is substituted with an aryl group such as benzyl; and the like. Among these, a primary or secondary carbon substituent group such as methyl, ethyl, cyclohexyl, and benzyl which is not easily desorbed by acid or heat is preferable in terms of the heat resistance.

Specific examples of the ether dimer include dimethyl 2,2'-[oxybis(methylene)]bis-2-propenoate, diethyl-2,2'-[oxybis(methylene)]bis-2-propenoate, di(n-propyl)-2,2'-[oxybis(methylene)]bis-2-propenoate, di(isopropyl)-2,2'-[oxybis(methylene)]bis-2-propenoate, di(n-butyl)-2,2'-[oxybis(methylene)]bis-2-propenoate, di(isobutyl)-2,2'-[oxybis(methylene)]bis-2-propenoate, di(tert-butyl)-2,2'-[oxybis(methylene)]bis-2-propenoate, di(tert-amyl)-2,2'-[oxybis(methylene)]bis-2-propenoate, di(stearyl)-2,2'-[oxybis(methylene)]bis-2-propenoate, di(lauryl)-2,2'-[oxybis(methylene)]bis-2-propenoate, di(2-ethylhexyl)-2,2'-[oxybis(methylene)]bis-2-propenoate, di(1-methoxyethyl)-2,2'-[oxybis(methylene)]bis-2-propenoate, di(1-ethoxyethyl)-2,2'-[oxybis(methylene)]bis-2-propenoate, dibenzyl-2,2'-[oxybis(methylene)]bis-2-propenoate, diphenyl-2,2'-[oxybis(methylene)]bis-2-propenoate, dicyclohexyl-2,2'-[oxybis(methylene)]bis-2-propenoate, di(tert-butyl cyclohexyl)-2,2'-[oxybis(methylene)]bis-2-propenoate, di(di-cyclopentadienyl)-2,2'-[oxybis(methylene)]bis-2-propenoate, di(tricyclodecanyl)-2,2'-[oxybis(methylene)]bis-2-propenoate, di(isobornyl)-2,2'-[oxybis(methylene)]bis-2-propenoate, diadamantyl-2,2'-[oxybis(methylene)]bis-2-propenoate, di(2-methyl-2-adamantyl)-2,2'-[oxybis(methylene)]bis-2-propenoate, and the like. Among these, dimethyl 2,2'-[oxybis(methylene)]bis-2-propenoate, diethyl-2,2'-[oxybis(methylene)]bis-2-propenoate, dicyclohexyl-2,2'-[oxybis(methylene)]bis-2-propenoate, and dibenzyl-2,2'-[oxybis(methylene)]bis-2-propenoate are particularly preferable. The ether dimers may be one type only or may be two or more types. The structure body derived from the compound which is illustrated by General Formula (ED) may copolymerize other monomers.

In addition, in order to improve the cross-link efficiency of the coloring composition in the present invention, an alkali-soluble resin which has a polymerizable group may be used. As the alkali-soluble resin which has a polymerizable group, an alkali-soluble resin and the like which contain an allyl group, a (meth)acryl group, an allyloxyalkyl group, and the like in a side chain are valid. Examples of the polymer which contains the polymerizable groups described above include Dianar NR series (produced by Mitsubishi Rayon Co., Ltd.), Photomer 6173 (COOH-containing polyurethane acrylic oligomer produced by Diamond Shamrock Co., Ltd.), Viscoat R-264 and KS Resist 106 (both produced by Osaka Organic Chemical Industry Ltd.), Cyclomer P series and Placcel CF200 series (both produced by Daicel Chemical Industry Ltd.), Ebecryl 3800 (produced by Daicel-UCB Co., Ltd.), and the like. The alkali-soluble resin which contains the polymerizable groups is preferably a urethane-modified polymerizable double bond-containing acryl resin which is obtained by reacting an isocyanate group and an OH group in advance, leaving one unreacted isocyanate group, and reacting a compound which includes a (meth)acryloyl group and an acryl resin which includes a carboxyl group, an unsaturated group-containing acryl resin which is obtained by reacting an acryl resin which includes a carboxyl group and a compound which has both an epoxy group and a polymerizable double bond in the molecule, an acid pendant type epoxy acrylate resin, a polymerizable double bond-containing acryl resin where an acryl resin which includes an OH group and a dibasic acid anhydride which has a polymerizable double bond are reacted, a resin where an acryl resin which includes an OH group and a compound which has isocyanate and a polymerizable group are reacted, the resins according to JP2002-229207A and JP2003-335814A which are obtained by carrying out a basicity process on a resin which has an ester group which has a halogen atom or a desorbing group such as a sulfonate group at the α-position or β-position in the side chain, and the like.

As the alkali-soluble resin, a benzyl (meth)acrylate/(meth)acrylic acid copolymer or a multi-component copolymer formed by benzyl (meth)acrylate/(meth)acrylic acid/other monomers is particularly favorable. Other than these, examples thereof include a copolymer of 2-hydroxy ethyl methacrylate, a 2-hydroxy propyl (meth)acrylate/polystyrene macromonomer/benzyl methacrylate/methacrylic acid copolymer according to JP1995-140654A (JP-H07-140654A), a 2-hydroxy-3-phenoxypropyl acrylate/polymethyl methacrylate macromonomer/benzyl methacrylate/methacrylic acid copolymer, a 2-hydroxy ethyl methacrylate/polystyrene macromonomer/methyl methacrylate/methacrylic acid copolymer, a 2-hydroxy ethyl methacrylate/polystyrene macromonomer/benzyl methacrylate/methacrylic acid copolymer, and the like and particularly preferable examples thereof include a copolymer of methacrylic acid benzyl/methacrylic acid and the like.

For the alkali-soluble resin, it is possible to refer to the description after paragraphs "0558" to "0571" in JP2012-208494A (corresponding to paragraphs "0685" to "0700" in US2012/235099A), the entire contents of which are incorporated herein by reference.

Furthermore, it is preferable to use the alkali-soluble resins which are used in the copolymer (B) and Examples according to paragraphs "0029" to "0063" in JP2012-32767A, the binder resins which are used in the binder resins and Examples according to paragraphs "0088" to "0098" in JP2012-208474A, the binder resins which are used in the binder resins and Examples according to paragraphs "0022" to "0032" in JP2012-137531A, the binder resins which are used in the binder resins and Examples according to paragraphs "0132" to "0143" in JP2013-024934A, the binder resins which are used in the binder resins and Examples according to paragraphs "0092" to "0098" in JP2011-242752A, and the binder resins according to paragraphs 0030 to 0072 described in JP2012-032770A, the entire contents of which are incorporated herein by reference. In more detail, the resins below are preferable.

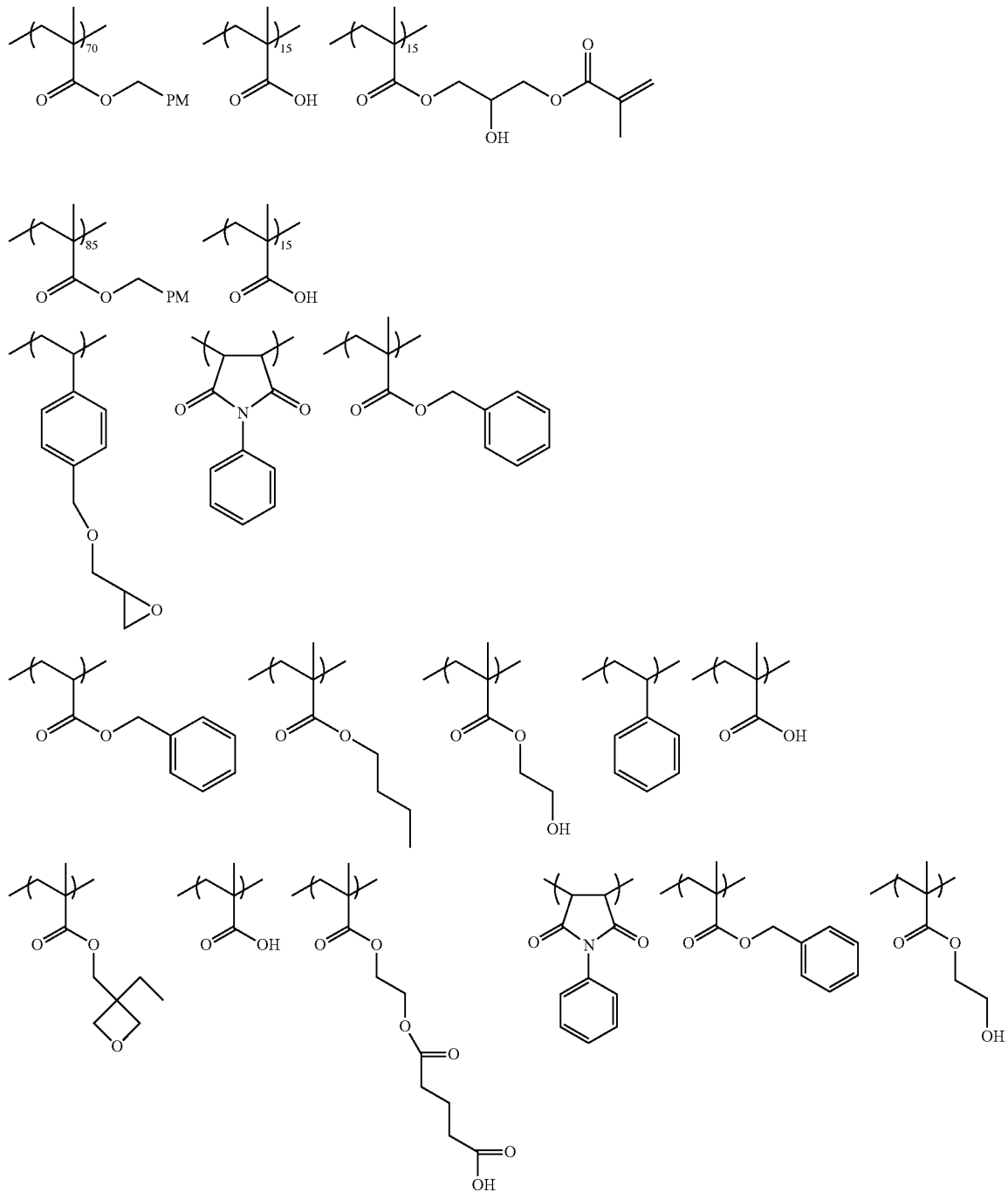

-continued

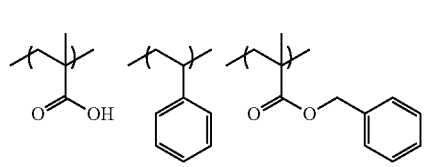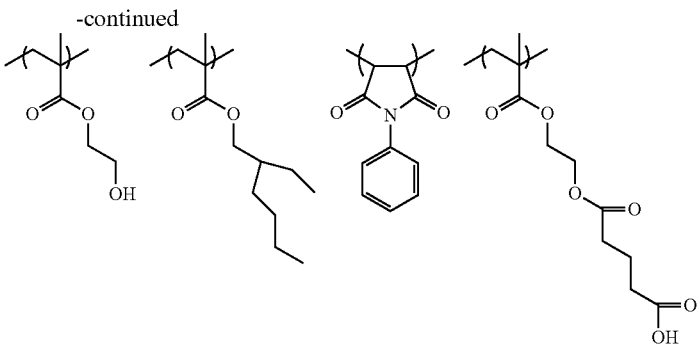

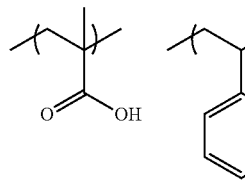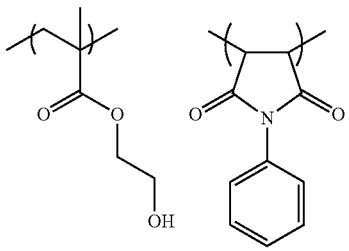

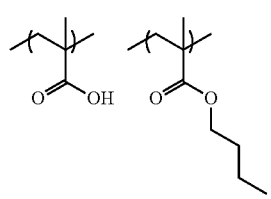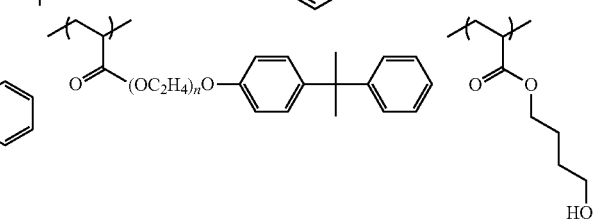

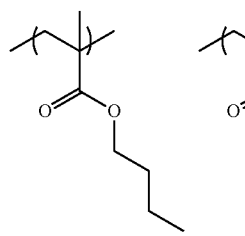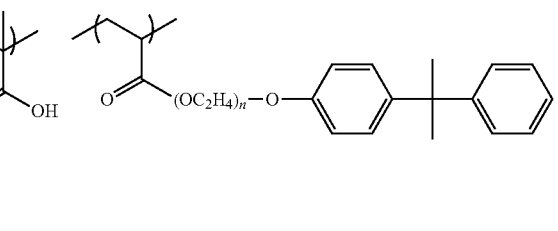

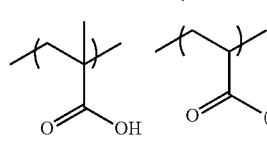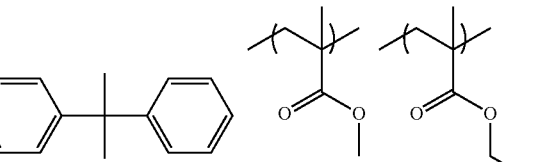

The acid value of the alkali-soluble resin is preferably 30 mgKOH/g to 200 mgKOH/g, more preferably 50 mgKOH/g to 150 mgKOH/g, and most preferably 70 mgKOH/g to 120 mgKOH/g.

In addition, the weight average molecular weight (Mw) of the alkali-soluble resin is preferably 2,000 to 50,000, more preferably 5,000 to 30,000, and most preferably 7,000 to 20,000.

In a case of containing the alkali-soluble resin in the composition of the present invention, the content of the alkali-soluble resins is preferably 1 mass % to 20 mass % with respect to the total solid content of the composition of the present invention, more preferably 2 mass % to 15 mass %, and particularly preferably 6 mass % to 11 mass %.

The composition of the present invention may include one type of the alkali-soluble resin or may include two or more types. In a case of including two or more types, the total amount thereof is preferably in the ranges described above.

<<Coloring Material (e)>>

A coloring material (e) which is used in the present invention preferably includes a red, green, or blue coloring material. In particular, the composition of the present invention is preferably a photosensitive red composition which includes a coloring material which has a red color as a main component, a photosensitive green composition which includes a coloring material which has a green color as a main component, or a photosensitive blue composition which includes a coloring material which has a blue color as a main component. It is possible to use a pigment and/or dye as the coloring material (e) and the coloring material (e) may be a monomer or a polymer; however, a polymer is preferable.

Examples of the red coloring material include a monoazo lake pigment, a disazo pigment, a naphthol-based pigment, a naphthol lake-based pigment, a pyrazolone pigment, a BONA lake pigment, a xanthene lake pigment, a thioindigo pigment, a perylene pigment, a condensed azo pigment, an anthraquinone pigment, an anthraquinone lake pigment, a benzimidazolone pigment, a quinacridone pigment, a diketopyrrolopyrrole pigment, an azomethine metal complex pigment, and the like, and specifically, for example, it is possible to use red pigments such as C.I. Pigment Red 7, 9, 14, 41, 48:1, 48:2, 48:3, 48:4, 81:1, 81:2, 81:3, 97, 122, 123, 144, 146, 149, 168, 169, 177, 178, 179, 180, 181, 184, 185, 187, 192, 200, 202, 208, 209, 210, 215, 216, 217, 220, 223, 224, 226, 227, 228, 240, 242, 246, 254, 255, 264, and 272.

Examples of the green coloring material include a phthalocyanine pigment, an azomethine metal complex pigment, and the like, and specifically, for example, it is possible to use C.I. Pigment Green 1, 4, 7, 8, 36, 58, and the like.

Examples of the blue coloring material include a naphthol AS pigment, a phthalocyanine pigment, a dyeing lake pigment, an anthraquinone-based pigment, and the like, and specifically, C.I. Pigment Blue 15, 15:1, 15:2, 15:3, 15:4, 15:5, 15:6, a triarylmethane dye, and the like are preferable.

The composition of the present invention may further include a yellow pigment, an orange pigment, a violet pigment and/or a dye as a coloring material.

Examples of the yellow pigment include a monoazo pigment, a monoazo lake pigment, a disazo pigment, an anthraquinone pigment, a monoazo pyrazolone pigment, a condensed azo pigment, an isoindoline pigment, a benzimidazolone pigment, an azomethine metal complex pigment, a quinophthalone pigment, a quinoxaline pigment, and the like and specifically, for example, it is possible to use yellow pigments such as C.I. Pigment Yellow 1, 2, 3, 4, 5, 6, 10, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, and 214. Among these, at least one type of pigment selected from a group formed of C.I. Pigment Yellow 138, 139, 150, and 185 is preferable.

Examples of the orange pigment include a monoazo pigment, a naphthol-based pigment, a pyrazolone pigment, a benzimidazolone pigment, a disazo pigment, a naphthol lake pigment, a naphthalene sulfonic acid lake pigment, a perinone pigment, a quinacridone pigment, an anthraquinone-based pigment, an isoindolinone pigment, an isoindoline-based pigment, an azomethine metal complex pigment, a diketopyrrolopyrrole pigment, and the like, specifically, for example, it is possible to use C.I. Pigment Orange 1, 2, 3, 5, 4, 24, 38, 74, 13, 34, 36, 60, 62, 64, 72, 15, 16, 17, 46, 19, 43, 48, 49, 51, 61, 66, 68, 71, 73, 81, and the like, and among these, C.I. Pigment Orange 71 is preferable.

It is possible to use C.I. Pigment Violet 23, 19, and the like as the violet pigment. In addition, it is possible to use a xanthene dye, a pyrromethene dye, and the like as the violet dye.

The coloring material which is used in the present invention preferably includes at least one compound selected from the group consisting of C.I. Pigment Green 7, 36, and 58 and at least one compound selected from the group consisting of C.I. Pigment Yellow 138, 139, 150, and 185. The mass ratio of the at least one compound selected from the group consisting of C.I. Pigment Green 7, 36, and 58 and the at least one compound selected from the group consisting of C.I. Pigment Yellow 138, 139, 150, and 185 is preferably 10:90 to 90:10 and more preferably 40:60 to 70:30.

In addition, the coloring material which is used in the present invention preferably includes at least one compound selected from the group consisting of C.I. Pigment Red 81, 122, 166, 177, 179, 209, 224, 242, and 254 and at least one compound selected from the group consisting of C.I. Pigment Yellow 138, 139, 150, and 185. In particular, it is preferable to include at least one compound selected from the group consisting of C.I. Pigment Red 177 and 254 and C.I. Pigment Yellow 139. The mass ratio of the at least one compound selected from the group consisting of C.I. Pigment Red 81, 122, 166, 177, 179, 209, 224, 242, and 254 and the at least one compound selected from the group consisting of C.I. Pigment Yellow 138, 139, 150, and 185 is preferably 10:90 to 90:10 and more preferably 50:50 to 80:20.

In addition, the coloring material which is used in the present invention preferably includes at least one compound selected from the group consisting of C.I. Pigment Blue 15, 15:1, 15:2, 15:3, 15:4, 15:5, 15:6, and a triarylmethane dye and at least one compound selected from the group consisting of C.I. Pigment Violet 23, 19, a xanthene dye and a pyrromethene dye. In particular, a combination of C.I. Pigment Blue 15:6 and C.I. Pigment Violet 23 or 19, and a combination of C.I. Pigment Blue 15:6 and a pyrromethene dye or a xanthene dye are preferable. The mass ratio of the at least one compound selected from the group consisting of C.I. Pigment Blue 15, 15:1, 15:2, 15:3, 15:4, 15:5, 15:6, and a triarylmethane dye and the at least one compound selected from the group consisting of C.I. Pigment Violet 23, 19, a xanthene dye and a pyrromethene dye is preferably 10:90 to 90:10 and more preferably 60:40 to 90:10.

The content of the coloring material (e) in the composition of the present invention is preferably 40 mass % to 70 mass % in the total solid content of the photosensitive coloring composition, more preferably 40 mass % to 60 mass %, and even more preferably 45 mass % to 55 mass %.

The coloring material (e) may be configured by one type of pigment or dye or may be configured by two or more types of pigments or dyes; however, it is preferably configured by two or more types of pigments or dyes. In a case of including two or more types, the total amount is preferably in the ranges described above.

In addition, the composition of the present invention may include other pigments and/or dyes in a range which does not depart from the spirit of the present invention. The other pigments and dyes are preferably 1 mass % or less of the entirety of the coloring material.

For example, it is possible to use the dyes which are disclosed in JP1989-90403A (JP-S64-90403A), JP1989-91102A (JP-S64-91102A), JP1989-94301A (JP-H1-94301A), JP-1994-11614A (JP-H6-11614A), JP2592207B, U.S. Pat. No. 4,808,501A, U.S. Pat. No. 5,667,920A, US505950A, JP-1993-333207A (JP-H5-333207A), JP-1994-35183A (JP-H6-35183A), JP-1994-51115A (JP-H6-51115A), JP-1994-194828A (JP-H6-194828A), and the like. As the chemical structure, it is possible to use pyrazole azo-based dyes, anilino azo-based dyes, triphenylmethane-based dyes, anthraquinone-based dyes, benzylidene-based dyes, oxonol-based dyes, pyrazolotriazole azo-based dyes, pyridone azo-based dyes, cyanine-based dyes, phenothiazine-based dyes, pyrrolopyrazole azomethine-based dyes, and the like.

In addition, a dye polymer may be used as a dye. Examples of the dye polymer include the compounds according to JP2011-213925A, JP2013-041097A, and the like.

<<Pigment Dispersing Agent>>

The composition of the present invention preferably contains a pigment dispersing agent (also simply referred to below as a "dispersing agent"). As a dispersing agent which may be used in the present invention, it is possible to widely adopt the dispersing agents which are known in the art. For example, it is possible to refer to the description in paragraphs "0049" to "0055" in JP2013-077009A, the entire contents of which are incorporated herein by reference.

In the present invention, as a pigment dispersing agent, it is preferable to use at least one compound selected from the group consisting of a compound (D-1) which is obtained by reacting a polymer (POH) which has a hydroxyl group at one terminal or a polymer (PNH$_2$) which has a primary amino group at one terminal with tricarboxylic acid anhydride or tetracarboxylic acid dianhydride, a copolymer (D-2) which includes a structure unit which is represented by one of General Formula (1) below and General Formula (2) below, a compound (D-3) which includes phosphoric acid ester which is represented by General Formula (3) below, and a compound (D-4) which includes a nitrogen atom in the main chain which is represented by General Formula (4). By using the compound, effects of the present invention are effectively exhibited. Description will be given below of (D-1) to (D-4).

—(D-1) Carboxylic Acid-Based Dispersing Agent which is Formed by Reacting a Polymer (POH) which has a Hydroxyl Group at at Least One Terminal or a Polymer (PNH$_2$) which has a Primary Amino Group at at Least One Terminal with Tricarboxylic Acid Anhydride or Tetracarboxylic Acid Dianhydride—

The composition of the present invention preferably has a carboxylic acid-based dispersing agent (D-1) which is formed by reacting a polymer (POH) which has a hydroxyl group at at least one terminal or a polymer (PNH$_2$) which has a primary amino group at at least one terminal with tricarboxylic acid anhydride or tetracarboxylic acid dianhydride.

It is possible to obtain the carboxylic acid-based dispersing agent by reacting a polymer (POH) which has a hydroxyl group at at least one terminal or a polymer (PNH$_2$) which has a primary amino group at at least one terminal with tricarboxylic acid anhydride or tetracarboxylic acid dianhydride. (POH) and (PNH$_2$) preferably have a hydroxyl group or a primary amino group at one terminal.

(Polymer (POH) which has a hydroxyl group at at least one terminal and polymer (PNH$_2$) which has a primary amino group at at least one terminal)

As a preferable form of a polymer (POH) which has a hydroxyl group at at least one terminal or a polymer (PNH$_2$) which has a primary amino group at at least one terminal, for example, the forms represented by General Formula (II) are preferable.

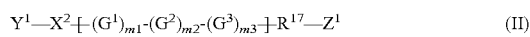

(II)

(In General Formula (II), $Y^1$ represents a monovalent terminal group with 1 to 20 carbon atoms, 0 to 12 oxygen atoms, and 0 to 3 nitrogen atoms, $X^2$ represents —O—, —S—, or —N($R^b$)—, and $R^b$ represents a hydrogen atom or a straight-chain or branched alkyl group with 1 to 18 carbon atoms. $G^1$ represents a repeating unit which is indicated by —$R^{11}$—, $G^2$ represents a repeating unit which is indicated by —C(=O)$R^{12}$O—, $G^3$ represents a repeating unit which is indicated by —C(=O)$R^{13}$C(=O)—O$R^{14}$O—, $R^{11}$ represents a straight-chain or branched alkylene group with 2 to 8 carbon atoms or a cycloalkylene group with 3 to 8 carbon atoms, $R^{12}$ represents a straight-chain or branched alkylene group with 1 to 8 carbon atoms or a cycloalkylene group with 4 to 8 carbon atoms, $R^{13}$ represents a straight-chain or branched alkylene group with 2 to 6 carbon atoms, a straight-chain or branched alkenylene group with 2 to 6 carbon atoms, a cycloalkylene group with 3 to 20 carbon atoms, or an arylene group with 6 to 20 carbon atoms, $R^{14}$ represents —CH($R^{15}$)—CH($R^{16}$)—, one of $R^{15}$ and $R^{16}$ is a hydrogen atom and the other is an alkyl group with 1 to 20 carbon atoms, an alkenyl group with 2 to 20 carbon atoms, an aryl group with 6 to 20 carbon atoms, an alkyloxy methylene group of which the number of carbon atoms of the alkyl portion is 1 to 20, an alkenyloxy methylene group of which the number of carbon atoms of the alkenyl portion is 2 to 20, an aryloxy methylene group of which the number of carbon atoms of the aryl portion is 6 to 20 and of which the aryl portion may be substituted with a halogen atom, or an N-methylene-phthalimido. $Z^1$ represents —OH or —NH$_2$ and $R^{17}$ represents a straight-chain or branched alkylene group with 2 to 8 carbon atoms, a cycloalkylene group with 3 to 8 carbon atoms, —C(=O)$R^{12}$—, or —C(=O)$R^{13}$C(=O)—O$R^{14}$—. m1 represents an integer of 0 to 100, m2 represents an integer of 0 to 60, and m3 represents an integer of 0 to 30. However, m1+m2+m3 is 1 or more to 100 or less. The arrangement of the repeating units $G^1$ to $G^3$ in General Formula (II) indicates that the repeating units $G^1$ to $G^3$ are included between the group $X^2$ and the group $R^{17}$ in an arbitrary order in a polymer which is represented by General Formula (II) without the order thereof being limited and, moreover, the repeating units $G^1$ to $G^3$ may each be either a random type or a block type.)

$Y^1$ represents a monovalent terminal group with 1 to 20 carbon atoms, 0 to 12 oxygen atoms, and 0 to 3 nitrogen atoms and is preferably a straight-chain or branched alkyl group with 0 oxygen atoms, 0 nitrogen atoms, and 1 to 18 carbon atoms from the point of view of decreasing the viscosity of the pigment dispersion and the storage stability of the pigment dispersion.

In addition, as another form, $Y^1$ preferably has an ethylenic unsaturated double bond. In this case, it is possible to add an active energy ray curing property to a dispersing agent (C-2). In addition, in a case where m2=0 and m3=0, $Y^1$ is preferably a straight-chain or branched alkyl group with 1 to 7 carbon atoms or has an ethylenic unsaturated double bond.

In order to have an ethylenic unsaturated double bond, it is necessary to have a group which has an ethylenic unsaturated double bond. Examples of the group include a vinyl group, a (meth)acryloyl group, or the like; however, a (meth)acryloyl group is preferable. The group which has a double bond may be one type or may be a plurality of types.

$X^2$ represents —O—, —S—, or —N($R^b$)—, and —O—, or —N($R^b$)— is preferable.

$R^b$ represents a hydrogen atom or a straight-chain or branched alkyl group with 1 to 18 carbon atoms. The straight-chain or branched alkyl group with 1 to 18 carbon atoms is preferably an alkyl group with 1 to 6 carbon atoms. Specific examples thereof include a methyl group, an ethyl group, a propyl group, an isopropyl group, a butyl group, an isobutyl group, a tert-butyl group, a neopentyl group, an n-hexyl group, a cyclohexyl group, and the like.

$Z^1$ represents —OH or —NH$_2$ and —OH is preferable.

$G^1$ represents a repeating unit which is indicated by —$R^{11}$O— and $R^{11}$ represents a straight-chain or branched alkylene group with 2 to 8 carbon atoms or a cycloalkylene group with 3 to 8 carbon atoms. Specific examples of the alkylene group or the cycloalkylene group which $R^{11}$ represents include an ethylene group, a propylene group, a butylene group, a pentylene group, a hexylene group, a cyclopentylene group, a cyclohexylene group, and the like.

$G^2$ represents a repeating unit which is indicated by —C(=O)R$^{12}$O— and R$^{12}$ represents a straight-chain or branched alkylene group with 1 to 8 carbon atoms or a cycloalkylene group with 4 to 8 carbon atoms. Specific examples of the alkylene group and the cycloalkylene group which R$^{12}$ represents include a methylene group, an ethylene group, a propylene group, a butylene group, a pentylene group, a hexylene group, a cyclopentylene group, a cyclohexylene group, and the like.

$G^3$ represents a repeating unit which is indicated by —C(=O)R$^{13}$C(=O)—OR$^{14}$O— and R$^{13}$ represents a straight-chain or branched alkylene group with 2 to 6 carbon atoms, a straight-chain or branched alkenylene group with 2 to 6 carbon atoms, a cycloalkylene group with 3 to 20 carbon atoms, or an arylene group with 6 to 20 carbon atoms. Specific examples of the alkylene group or the cycloalkylene group which R$^{13}$ represents include a methylene group, an ethylene group, a propylene group, a butylene group, a pentylene group, a hexylene group, a cyclopentylene group, a cyclohexylene group, and the like. Specific examples of the alkenylene group which R$^{13}$ represents include an ethenylene group, a propenylene group, a butenylene group, a pentenylene group, a hexenylene group, and the like. Specific examples of the arylene group which R$^{13}$ represents include a phenylene group, a naphthylene group, an anthracenylene group, and the like.

$R^{14}$ represents —CH(R$^{15}$)—CH(R$^{16}$)—. One of R$^{15}$ and R$^{16}$ is a hydrogen atom and the other represents an alkyl group with 1 to 20 carbon atoms, an alkenyl group with 2 to 20 carbon atoms, an aryl group with 6 to 20 carbon atoms, an alkyloxy methylene group of which the number of carbon atoms of the alkyl portion is 1 to 20, an alkenyloxy methylene group of which the number of carbon atoms of the alkenyl portion is 2 to 20, an aryloxy methylene group of which the number of carbon atoms of the aryl portion is 6 to 20 and of which the aryl portion may be substituted with a halogen atom, or an N-methylene-phthalimido group.

The alkyl group with 1 to 20 carbon atoms is preferably an alkyl group with 1 to 10 carbon atoms and more preferably an alkyl group with 1 to 6 carbon atoms. Specific examples thereof include a methyl group, an ethyl group, a propyl group, an isopropyl group, a butyl group, an isobutyl group, a tert-butyl group, a neopentyl group, an n-hexyl group, an n-octyl group, and the like.

The alkenyl group with 2 to 20 carbon atoms is preferably an alkenyl group with 2 to 10 carbon atoms and more preferably an alkenyl group with 2 to 6 carbon atoms. Specific examples thereof include an ethenyl group, a propenyl group, a butenyl group, a pentenyl group, a hexenyl group, and the like.

The aryl group with 6 to 20 carbon atoms is preferably an aryl group with 6 to 10 carbon atoms and specific examples thereof include a phenyl group, a naphthyl group, an anthracenyl group, and the like.

The alkyloxy methylene group of which the number of carbon atoms of the alkyl portion is 1 to 20 is a form in which an oxy methylene group is bonded with an alkyl group with 1 to 20 carbon atoms which is represented by R$^{14}$ and the alkyl group with 1 to 20 carbon atoms has the same meaning as the alkyl group with 1 to 20 carbon atoms which is represented by R$^{14}$ and the preferable ranges thereof are also the same.

The alkenyloxy methylene group of which the number of carbon atoms of the alkenyl portion is 2 to 20 is a form in which an oxy methylene group is bonded with an alkenyl group with 2 to 20 carbon atoms which is represented by R$^{14}$ and the alkenyl group with 2 to 20 carbon atoms has the same meaning as the alkenyl group with 2 to 20 carbon atoms which is represented by R$^{14}$ and the preferable ranges thereof are also the same.

The aryloxy methylene group of which the number of carbon atoms of the aryl portion is 6 to 20 is a form in which an oxy methylene group is bonded with an aryl group with 6 to 20 carbon atoms which is represented by R$^{14}$ and the aryl group with 6 to 20 carbon atoms has the same meaning as the aryl group with 6 to 20 carbon atoms which is represented by R$^{14}$ represents and the preferable ranges thereof are also the same.

$R^{17}$ represents a straight-chain or branched alkylene group with 2 to 8 carbon atoms, a cycloalkylene group with 3 to 8 carbon atoms, —C(=O)R$^{12}$—, or —C(=)OR$^{13}$C(=O)—OR$^{14}$—. Specific examples of the alkylene group or the cycloalkylene group which is represented by R$^{17}$ include an ethylene group, a propylene group, a butylene group, a pentylene group, a hexylene group, a cyclopentylene group, a cyclohexylene group, and the like. R$^{12}$ and R$^{13}$ have the same meaning as R$^{12}$ and R$^{13}$ described above and the preferable ranges thereof are also the same.

m1 represents an integer of 0 to 100, preferably an integer of 0 to 90, and more preferably an integer of 5 to 50.

m2 represents an integer of 0 to 60, preferably an integer of 0 to 50, and more preferably an integer of 0 to 20. m2 is preferably an integer of 3 to 15 from the point of view of decreasing the viscosity of the pigment dispersion and the storage stability of the pigment dispersion.

m3 represents an integer of 0 to 30, preferably an integer of 0 to 25, and more preferably an integer of 0 to 10.

Here, m1+m2+m3 is preferably an integer of 1 or more to 100 or less, more preferably an integer of 5 to 80, and even more preferably an integer of 10 to 50.

As a method for synthesizing the compounds which are represented by General Formula (II), synthesis is possible using a method which is known in the art and, for example, it is possible to refer to description in paragraphs "0047" to "0082" in JP2007-131832A, the entire contents of which are incorporated herein by reference.

As the carboxylic acid-based dispersing agent which is used in the present invention, it is preferable to use a carboxylic acid-based dispersing agent which is obtained by ring-opening addition of a ε-caprolactone-based compound and a 6-valerolactone-based compound.

In addition, as a preferable form of the polymer (POH) which has a hydroxyl group at at least one terminal or the polymer (PNH$_2$) which has a primary amino group at at least one terminal, for example, the forms represented by General Formula (III) are also preferable.

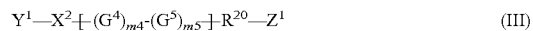
$$Y^1—X^2—[(G^4)_{m4}-(G^5)_{m5}]—R^{20}—Z^1 \qquad (III)$$

(In General Formula (III), Y$^1$ represents a monovalent terminal group with 1 to 20 carbon atoms, 0 to 12 oxygen atoms, and 0 to 3 nitrogen atoms, X$^2$ represents —O—, —S—, or —N(R$^b$)—, and R$^b$ represents a hydrogen atom or a straight-chain or branched alkyl group with 1 to 18 carbon atoms. Z$^1$ represents —OH or —NH$_2$.

G$^4$ and G$^5$ each represent a repeating unit which is indicated by C(=O)R$^{12}$O— and R$^{12}$ represents a straight-chain or branched alkylene group with 1 to 8 carbon atoms or a cycloalkylene group with 4 to 8 carbon atoms. However, R$^{12}$ in G$^4$ and R$^{12}$ in G$^5$ are different groups from each other. R$^{20}$ represents —C(=O)R$^{12}$. m4 represents an integer of 5 to 60 and m5 represents an integer of 5 to 60. The arrangement of the repeating units G$^4$ and G$^5$ in General Formula (III) indicates that the repeating units $G^4$ and $G^5$ are included between the group $X^2$ and the group $Z^1$ in an arbitrary order in a polymer which is represented by General Formula (III) without the order thereof being limited and, moreover, the repeating units $G^4$ and $G^5$ may be each either a random type or a block type.)

In General Formula (III), $Y^1$ has the same meaning as $Y^1$ in General Formula (II) and the preferable ranges thereof are also the same. In a case where m5=0, $Y^1$ is preferably a straight-chain or branched alkyl group with 1 to 7 carbon atoms or has an ethylenic unsaturated double bond.

In General Formula (III), $X^2$ has the same meaning as $X^2$ in General Formula (II) and the preferable ranges thereof are also the same.

In General Formula (III), $Z^1$ has the same meaning as $Z^1$ in General Formula (II) and the preferable ranges thereof are also the same.

$G^4$ and $G^5$ each represent a repeating unit which is indicated by $C(=O)R^{12}O$— and $R^{12}$ represents a straight-chain or branched alkylene group with 1 to 8 carbon atoms or a cycloalkylene group with 4 to 8 carbon atoms. However, $R^{12}$ in $G^4$ and $R^{12}$ in $G^5$ are different groups from each other. $G^4$ and $G^5$ have the same meaning as $G^2$ in General Formula (II) and the preferable ranges thereof are also the same. $R^{12}$ in General Formula (III) has the same meaning as $R^{12}$ in General Formula (II) and the preferable range is also the same.

$R^{20}$ represents —$C(=O)R^{12}$. The $R^{12}$ has the same meaning as $R^{12}$ in General Formula (II) and the preferable ranges thereof are also the same.

m4 represents an integer of 5 to 60, is preferably an integer of 5 to 50, and more preferably an integer of 10 to 30.

m5 represents an integer of 5 to 60, is preferably an integer of 5 to 50, and more preferably an integer of 10 to 30. m5 is preferably an integer of 10 to 30 from the point of view of decreasing the viscosity of the pigment dispersion and the storage stability of the pigment dispersion.

As a method for synthesizing the compounds which are represented by General Formula (III), synthesis is possible using a method which is known in the art and, for example, it is possible to refer to the description in paragraphs "0046" to "0087" in JP2010-189514A, the entire contents of which are incorporated herein by reference.

As the carboxylic acid-based dispersing agent which is used in the present invention, it is preferable to use a carboxylic acid-based dispersing agent which is obtained by ring-opening addition of a ε-caprolactone-based compound and a δ-valerolactone-based compound.

(Tricarboxylic Acid Anhydride or Tetracarboxylic Acid Dianhydride)

Examples of tricarboxylic acid anhydride firstly include aliphatic tricarboxylic acid anhydride or aromatic tricarboxylic acid anhydride.

Examples of the aliphatic tricarboxylic acid anhydride include 3-carboxymethyl glutaric acid anhydride, 1,2,4-butane tricarboxylic acid-1,2-anhydride, cis-propene-1,2,3-tricarboxylic acid-1,2-anhydride, 1,3,4-cyclopentane tricarboxylic acid anhydride, and the like.

Examples of the aromatic tricarboxylic acid anhydride include benzene tricarboxylic anhydride (1,2,3-benzene tricarboxylic anhydride, trimellitic acid anhydride (1,2,4-benzene tricarboxylic anhydride), and the like), naphthalene tricarboxylic anhydride (1,2,4-naphthalene tricarboxylic anhydride, 1,4,5-naphthalene tricarboxylic anhydride, 2,3,6-naphthalene tricarboxylic anhydride, 1,2,8-naphthalene tricarboxylic anhydride, and the like), 3,4,4'-benzophenone tricarboxylic anhydride, 3,4,4'-biphenylether tricarboxylic anhydride, 3,4,4'-biphenyl tricarboxylic anhydride, 2,3,2'-biphenyl tricarboxylic anhydride, 3,4,4'-biphenyl methane tricarboxylic anhydride, 3,4,4'-biphenyl sulfone tricarboxylic anhydride, and the like.

In a case of using tricarboxylic anhydride, aromatic tricarboxylic anhydride is preferable out of the described above.

Examples of the tetracarboxylic acid dianhydride include aliphatic tetracarboxylic acid dianhydride, aromatic tetracarboxylic acid dianhydride, or polycyclic tetracarboxylic acid dianhydride.

Examples of the aliphatic tetracarboxylic acid dianhydride include 1,2,3,4-butane tetracarboxylic acid dianhydride, 1,2,3,4-cyclobutane tetracarboxylic acid dianhydride, 1,3-dimethyl-1,2,3,4-cyclobutane tetracarboxylic acid dianhydride, 1,2,3,4-cyclopentane tetracarboxylic acid dianhydride, 2,3,5-tricarboxy cyclopentylacetic acid dianhydride, 2,3,5,6-tetracarboxy cyclohexane dianhydride, 2,3,5,6-tetracarboxy norbornane dianhydride, 3,5,6-tricarboxy norbornane-2-acetic dianhydride, 2,3,4,5-tetrahydrofuran tetracarboxylic acid dianhydride, 5-(2,5-dioxo tetrahydrofural)-3-methyl-3-cyclohexene-1,2-dicarboxylic acid dianhydride, bicyclo[2,2,2]-octo-7-ene-2,3,5,6-tetracarboxylic acid dianhydride.

Examples of aromatic tetracarboxylic acid dianhydride include pyromellitic acid dianhydride, ethylene glycol trimellitic acid ester dianhydride, propylene glycol trimellitic acid ester dianhydride, butylene glycol trimellitic acid ester dianhydride, 3,3',4,4'-benzophenone tetracarboxylic acid dianhydride, 2,2',3,3'-benzophenone tetracarboxylic acid dianhydride, 3,3',4,4'-biphenyl sulfone tetracarboxylic acid dianhydride, 2,2',3,3'-biphenyl sulfone tetracarboxylic acid dianhydride, 1,4,5,8-naphthalene tetracarboxylic acid dianhydride, 2,3,6,7-naphthalene tetracarboxylic acid dianhydride, 3,3',4,4'-biphenyl ether tetracarboxylic acid dianhydride, 3,3',4,4'-dimethyldiphenylsilane tetracarboxylic acid dianhydride, 3,3',4,4'-tetraphenylsilane tetracarboxylic acid dianhydride, 1,2,3,4-furan tetracarboxylic acid dianhydride, 4,4'-bis(3,4-dicarboxy phenoxy)diphenyl sulfide dianhydride, 4,4'-bis(3,4-dicarboxy phenoxy)diphenyl sulfone dianhydride, 4,4'-bis(3,4-dicarboxy phenoxy)diphenyl propane dianhydride, 3,3',4,4'-perfluoroisopropylidene diphthalic acid dianhydride, 3,3',4,4'-biphenyl tetracarboxylic acid dianhydride, bis(phthalic acid)phenyl phosphine oxide dianhydride, p-phenylene-bis(triphenyl phthalic acid) dianhydride, m-phenylene-bis(triphenyl phthalic acid) dianhydride, bis(triphenyl phthalic acid)-4,4'-diphenyl ether dianhydride, bis(triphenyl phthalic acid)-4,4'-diphenyl methane dianhydride, 9,9-bis(3,4-dicarboxy phenyl)fluorene dianhydride, 9,9-bis[4-(3,4-dicarboxy phenoxy)phenyl]fluorene dianhydride, and the like.

Examples of the polycyclic tetracarboxylic acid dianhydride include 3,4-dicarboxy-1,2,3,4-tetrahydro-1-naphthalene succinic acid dianhydride, 3,4-dicarboxy-1,2,3,4-tetrahydro-6-methyl-1-naphthalene succinic acid dianhydride, and the like.

In a case of using the tetracarboxylic acid dianhydride, the aromatic tetracarboxylic acid dianhydride is preferable out of the above.

The tricarboxylic acid anhydride or the tetracarboxylic acid dianhydride which is used in the present invention may have any structure without being limited to the example compounds. These may be used individually or together. From the point of view of decreasing the viscosity of a pigment dispersion or various types of ink, an aromatic tricarboxylic acid anhydride or an aromatic tetracarboxylic acid dianhydride are preferably used in the present invention. Furthermore, pyromellitic acid dianhydride, 3,3',4,4'-biphenyl tetracarboxylic acid dianhydride, 9,9-bis(3,4-dicarboxy phenyl)fluorene dianhydride, 2,3,6,7-naphthalene tetracarboxylic acid dianhydride, ethylene glycol trimellitic acid ester dianhydride, and trimellitic acid anhydride are preferable.

(Reaction of a Polymer (POH) which has a Hydroxyl Group at at Least One Terminal or a Polymer ($PNH_2$) which has a Primary Amino Group at at Least One Terminal with Tricarboxylic Acid Anhydride or Tetracarboxylic Acid Dianhydride)

It is possible to obtain the carboxylic acid-based dispersing agent in the present invention by reacting a hydroxyl group of a "polymer (POH) which has a hydroxyl group at at least one terminal" or a primary amino group of a "polymer ($PNH_2$) which has a primary amino group at at least one terminal" with an acid anhydride group of tricarboxylic acid anhydride or tetracarboxylic acid dianhydride.

When the molar number of the hydroxyl group of the polymer (POH) or the primary amino group of the polymer ($PNH_2$) is set as <H> And the molar number of the tricarboxylic acid anhydride or the tetracarboxylic acid dianhydride is set as <N>, the reaction ratio is preferably 0.5<<H>/<N><1.2, more preferably 0.7<<H>/<N><1.1, and most preferably a case of <H>/<N>=1. In a case of reacting with <H>/<N><1, the remaining acid anhydride may be used after hydrolyzation using a necessary amount of water.

A catalyst may be used for reacting the polymer (POH) or the polymer ($PNH_2$) with the tricarboxylic acid anhydride or the tetracarboxylic acid dianhydride. It is possible to use a tertiary amine-based compound as the catalyst and examples thereof include triethylamine, triethyleneamine, N—N-dimethylbenzylamine, N-methylmorpholine, 1,8-diazabicyclo-[5.4.0]-7-undecene, 1,5-diazabicyclo-[4.3.0]-5-nonene, and the like.

The reaction of the polymer (POH) or the polymer ($PNH_2$) with the tricarboxylic acid anhydride or the tetracarboxylic acid dianhydride may be performed without using a solvent or an appropriate dehydrating organic solvent may be used. The solvent which is used in the reaction is removed by a distillation operation or the like after completing the reaction or it is also possible to use the solvent as a part of the product of the dispersing agent as it is.

In a case of using the "polymer (POH) which has a hydroxyl group at at least one terminal", the reaction temperature of the polymer (POH) or the polymer ($PNH_2$) with the tricarboxylic acid anhydride or the tetracarboxylic acid dianhydride is preferably a range of 80° C. to 180° C. and more preferably 90° C. to 160° C. When the reaction temperature is less than 80° C., the reaction speed is slow, and when the reaction temperature exceeds 180° C., there are cases where the acid anhydride, which reacts to open a ring, generates a cyclic anhydride again and it is difficult to complete the reaction. In addition, in a case of using the "polymer ($PNH_2$) which has a primary amino group at at least one terminal", the reaction is preferably performed in a range of 0° C. to 150° C., and more preferably 10° C. to 100° C. At less than 0° C., there are cases where the reaction does not proceed and when the temperature exceeds 150° C., there are cases of imidification, and neither is preferable.

—Phosphoric Acid-Based Dispersing Agent (D-2) which is Represented by General Formula (3)—

The composition of the present invention preferably has a phosphoric acid-based dispersing agent (D-2) which is represented by General Formula (3).

General Formula (3)

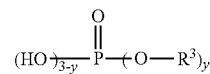

(3)

(In General Formula (3), $R^3$ represents a polyester structure with a number average molecular weight of 400 to 30000 and y represents 1 or 2. In a case where y is 2, a plurality of $R^3$ may be the same or may be different.)

$R^3$ represents a polyester structure with a number average molecular weight of 400 to 30000 and, in a case where y is 2, a plurality of $R^3$ may be the same or may be different. The number average molecular weight of the polyester structure is more preferably 1900 to 10000, even more preferably 400 to 3000, and particularly preferably 2000 to 3000. In a case where the number average molecular weight is less than 400, since the pigment dispersion power is defective, use is not possible.

Examples of the polyester structure include a polyester structure which has a polyester group which is obtained by carrying out ring-opening polymerization on a lactone monomer, a styrene group, an acryloyl group, a cyanoacryloyl group, a methacryloyl group, a vinylether group, and the like and a polyester group which is obtained by carrying out ring-opening polymerization on a lactone monomer is preferable.

In addition, in a case where y is 2, $R^3$ is preferably a polyester structure which is obtained by carrying out ring-opening polymerization on two or more different types of lactone monomers.

Regarding the phosphoric acid-based dispersing agent which is represented by General Formula (3), $R^3$ may be a single type of phosphoric acid ester or may be a plurality of types of phosphoric acid ester formed of different $R^3$. The phosphoric acid-based dispersing agent may be an individual phosphoric acid-based dispersing agent where Y=1 or may be a mixture of a phosphoric acid-based dispersing agent where Y=1 and a phosphoric acid-based dispersing agent where Y=2.

Regarding the phosphoric acid ester which is indicated by General Formula (3), when the present ratio of the phosphoric acid-based dispersing agent where Y=1 and the phosphoric acid-based dispersing agent where Y=2 is 100:0 to 100:30, the pigment dispersibility is favorable, which is preferable.

In addition, when $R^3$ of the phosphoric acid-based dispersing agent which is indicated by General Formula (3) is a polycaprolactone structure with a number average molecular weight of 400 to 10000, the pigment dispersibility is favorable, which is preferable. The number average molecular weight is more preferably 400 to 3000.

Furthermore, $R^3$ of the phosphoric acid-based dispersing agent which is indicated by General Formula (3) is preferably indicated by General Formula (11) below.

$$R^{12}-O-R^{13}-(O-R^{14})_s \qquad \text{General Formula (11)}$$

(In the formula, $R^{12}$ represents an alkylene group, $R^{13}$ represents a polyvalent alcohol structure of trivalent or more, $R^{14}$ represents an acryloyl group, a cyanoacryloyl group, and a methacryloyl group, and s represents 2 or more.)

$R^{12}$ is preferably an alkylene group with 8 or less carbon atoms. In addition, from the point of view of the pigment dispersibility, s is preferably 2 or more. In this case, different groups may be used for $R^{14}$. s is more preferably 2 to 5 and particularly preferably 2.

Examples of the trivalent or more polyvalent alcohol which is used in $R^{13}$ include glycerin, pentaerythritol, dipentaerythritol, and the like. Trivalent to hexavalent alcohol is particularly preferable.

The acid value of the phosphoric acid-based dispersing agent is preferably 10 mgKOH/g to 200 mgKOH/g, more preferably 25 mgKOH/g to 150 mgKOH/g, and even more preferably 50 mgKOH/g to 130 mgKOH/g.

It is possible to produce the phosphoric acid-based dispersing agent by a method which is known in the art and, for example, it is possible to refer to the description in paragraphs "0037" to "0051" in JP2007-231107A, the entire contents of which are incorporated herein by reference.

As the phosphoric acid-based dispersing agent which is used in the present invention, it is preferable to use a phosphoric acid-based dispersing agent which is obtained by ring-opening addition of ε-caprolactone and δ-valerolactone.

—Copolymer (D-3) which Includes a Structure Unit which is Represented by One of General Formula (1) Below and General Formula (2)—

The composition of the present invention preferably has a copolymer (D-3) which includes a structure unit which is represented by one of General Formula (1) below and General Formula (2).

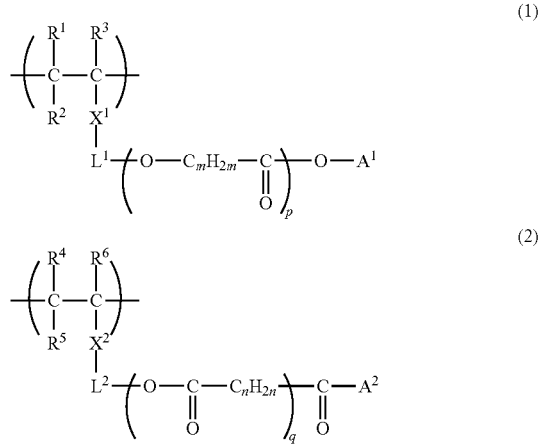

In General Formulas (1) and (2) described above, $R^1$ to $R^6$ each represents a hydrogen atom or a monovalent organic group, $X^1$ and $X^2$ each represent —CO—, —C(=O)O—, —CONH—, —OC(=O)—, or a phenylene group, $L^1$ and $L^2$ each represent a single bond or a divalent organic linking group, $A^1$ and $A^2$ each represent a monovalent organic group, m and n each represent an integer of 2 to 8, and p and q each represent an integer of 1 to 100.

In General Formulas (1) and (2), $R^1$ to $R^6$ each represent a hydrogen atom or a monovalent organic group. The monovalent organic group is preferably a substituted or unsubstituted alkyl group. The alkyl group is preferably an alkyl group with 1 to 12 carbon atoms, more preferably an alkyl group with 1 to 8 carbon atoms, and particularly preferably an alkyl group with 1 to 4 carbon atoms.

In a case where the alkyl group has a substituent group, examples of the substituent group include a hydroxy group, an alkoxy group (preferably an alkoxy group with 1 to 5 carbon atoms, more preferably an alkoxy group with 1 to 3 carbon atoms, and even more preferably a methoxy group and an ethoxy group), a cyclohexyloxy group, and the like.

Specific examples of the preferable alkyl group include a methyl group, an ethyl group, a propyl group, an n-butyl group, an i-butyl group, a t-butyl group, an n-hexyl group, a cyclohexyl group, 2-hydroxy ethyl group, 3-hydroxy propyl group, 2-hydroxy propyl group, and 2-methoxyethyl group.

In General Formulas (1) and (2), $R^1$, $R^2$, $R^4$, and $R^5$ are preferably a hydrogen atom and $R^3$ and $R^6$ are most preferably a hydrogen atom or a methyl group even in terms of adsorption efficiency to the pigment surface.

In General Formulas (1) and (2), $X^1$ and $X^2$ each represent —CO—, —C(=O)O—, —CONH—, —OC(=O)—, or a phenylene group. Among these, —C(=O)O—, —CONH—, and a phenylene group are preferable from the point of view of absorption efficiency to the pigment and —C(=O)O— is most preferable.

In General Formulas (1) and (2), $L^1$ and $L^2$ each represent a single bond or a divalent organic linking group. The divalent organic linking group is preferably a substituted or unsubstituted alkylene group or a divalent organic linking group which is formed of the alkylene group and a hetero atom or a partial structure which includes a hetero atom. Here, the alkylene group is preferably an alkylene group with 1 to 12 carbon atoms, more preferably an alkylene group with 1 to 8 carbon atoms, and particularly preferably an alkylene group with 1 to 4 carbon atoms. In addition, examples of the hetero atom in the partial structure which includes a hetero atom include an oxygen atom, a nitrogen atom, and a sulfur atom and, among these, an oxygen atom and a nitrogen atom are preferable.

Specific examples of the preferable alkylene group include a methylene group, an ethylene group, a propylene group, a trimethylene group, and a tetramethylene group.

In a case where the alkylene group has a substituent group, examples of the substituent group include a hydroxy group and the like.

The divalent organic linking group preferably has a hetero atom selected from —C(=O)—, —OC(=O)—, and —NHC(=O)— or a partial structure which has a hetero atom at a terminal of the alkylene group described above and is linked with an adjacent oxygen atom via the hetero atom or a partial structure which includes a hetero atom in terms of the absorption to the pigment. Here, the adjacent oxygen atom has the meaning of an oxygen atom which is bonded on a side chain terminal side with respect to $L^1$ in General Formula (1) and $L^2$ in General Formula (2).

In General Formulas (1) and (2), $A^1$ and $A^2$ each represent a monovalent organic group. The monovalent organic group is preferably a hydroxyl group, a substituted or unsubstituted alkyl group, or a substituted or unsubstituted aryl group.

Preferable examples of the alkyl group include a straight-chain, branched, and cyclic alkyl group with 1 to 20 carbon atoms and specific examples thereof include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, an isobutyl group, an s-butyl group, a t-butyl group, an isopentyl group, a neopentyl group, a 1-methylbutyl group, an isohexyl group, a 2-ethylhexyl group, a 2-methylhexyl group, a cyclohexyl group, a cyclopentyl group, and a 2-norbornyl group.

A group of a monovalent non-metallic atomic group excluding hydrogen is used as the substituent group of the substituted alkyl group and preferable examples thereof include a halogen atom (—F, —Br, —Cl, or —I), a hydroxyl group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acyloxy group, an acylthio group, an acylamino group, an N-alkylacylamino group, an N-arylacylamino group, an ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—SO$_3$H) and conjugate basic groups thereof (referred to below as sulfonato groups), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkyl sulfamoyl group, an N,N-dialkylsulfamoyl group, an N-arylsulfamoyl group, an N,N-diarylsulfamoyl group, an N-alkyl-N-arylsulfamoyl group, a phosphono group (—PO$_3$H$_2$) and conjugate basic groups thereof (referred to below as phosphonato groups), a dialkylphosphono group (—PO$_3$(alkyl)$_2$), a diarylphosphono group (—PO$_3$(aryl)$_2$), an alkylarylphosphono group (—PO$_3$(alkyl)(aryl)), a monoalkylphosphono group (—PO$_3$H(alkyl)) and conjugate basic groups thereof (referred to below as alkylphosphonato groups), a monoarylphosphono group (—PO$_3$H(aryl)) and conjugate basic groups thereof (referred to below as arylphosphonato groups), a phosphonooxy group (—OPO$_3$H$_2$) and conjugate basic groups thereof (referred to below as phosphonatooxy groups), a dialkylphosphonooxy group (—OPO$_3$(alkyl)$_2$), a diarylphosphonooxy group (—OPO$_3$(aryl)$_2$), an alkylarylphosphonooxy group (—OPO$_3$(alkyl)(aryl)), a monoalkylphosphonooxy group (—OPO$_3$H(alkyl)) and conjugate basic groups thereof (referred to below as alkylphosphonatooxy groups), a monoarylphosphonooxy group (—OPO$_3$H(aryl)) and conjugate basic groups thereof (referred to below as arylphosphonatooxy groups), a cyano group, a nitro group, an aryl group, a heteroaryl group, an alkenyl group, an alkynyl group, and a silyl group.

Specific examples of the alkyl group in the substituent groups include the alkyl groups described above and these may further have a substituent group.

An alkoxy group, an aryloxy group, an alkylthio group, an arylthio group, an N,N-dialkylamino group, an N,N-diarylamino group, an N-alkyl-N-arylamino group, an acyloxy group, an aryl group, a heteroaryl group, an alkenyl group, an alkynyl group, and a silyl group are preferable as the substituent group in terms of the dispersion stability.

Specific examples of the aryl group include a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxyphenylcarbonyl group, a phenoxycarbonylphenyl group, an N-phenylcarbamoylphenyl group, a phenyl group, a cyanophenyl group, a sulfophenyl group, a sulfonatophenyl group, a phosphonophenyl group, a phosphonatophenyl group, and the like.

As A$^1$ and A$^2$, in terms of the dispersion stability and the developing characteristics, a straight-chain alkyl group with 1 to 20 carbon atoms, a branched alkyl group with 3 to 20 carbon atoms, and a cyclic alkyl group with 5 to 20 carbon atoms are preferable, a straight-chain alkyl group with 4 to 15 carbon atoms, a branched alkyl group with 4 to 15 carbon atoms, and a cyclic alkyl group with 6 to 10 carbon atoms are more preferable, and a straight-chain alkyl group with 6 to 10 carbon atoms and a branched alkyl group with 6 to 12 carbon atoms are even more preferable.

In General Formulas (1) and (2), m and n each represent an integer of 2 to 8. In terms of the dispersion stability and the developing characteristics, an integer of 4 to 6 is preferable, and 5 is most preferable.

In General Formulas (1) and (2), p and q each represent an integer of 1 to 100. Two or more types where p is different and q is different may be mixed. In terms of the dispersion stability and the developing characteristics, p and q are preferably an integer of 5 to 60, more preferably an integer of 5 to 40, and even more preferably an integer of 5 to 20.

A copolymer which includes a structure unit which is represented by one of General Formula (1) and General Formula (2) below preferably includes a repeating unit which is represented by General Formula (1) in terms of the dispersion stability.

In addition, the repeating unit which is represented by General Formula (1) is more preferably a repeating unit which is represented by General Formula (1)-2 below.

General Formula (1-2)

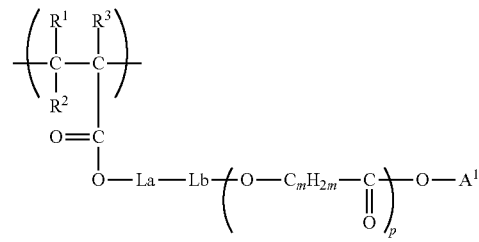

In General Formula (1)-2 described above, R$^1$ to R$^3$ each represent a hydrogen atom or a monovalent organic group, La represents an alkylene group with 2 to 10 carbon atoms, Lb represents —C(=O)— or —NHC(=O)—, A$^1$ represents a monovalent organic group, m represents an integer of 2 to 8, and p represents an integer of 1 to 100.

Repeating units which are represented by General Formula (1), (2), or (1)-2 are each introduced as repeating units of a polymer compound by polymerizing or copolymerizing monomers which are represented by General Formula (i), (ii), or (i)-2 below.

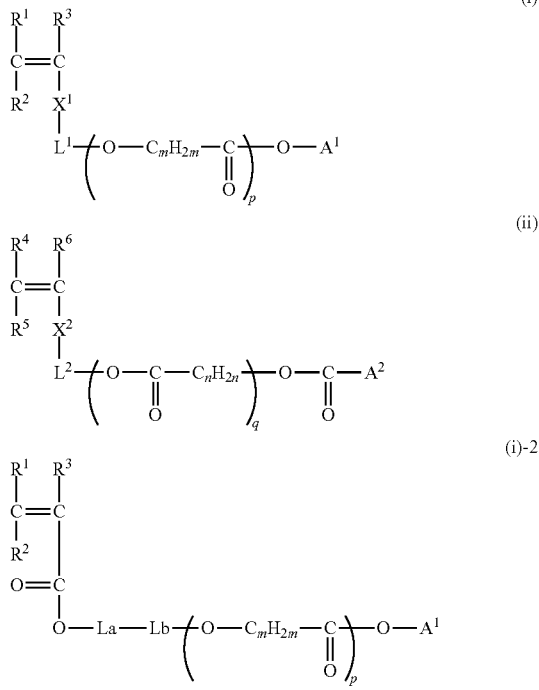

In General Formulas (i), (ii), and (i)-2, $R^1$ to $R^6$ each represent a hydrogen atom or a monovalent organic group, $X^1$ and $X^2$ each represent —CO—, —C(=O)O—, —CONH—, —OC(=O)—, or a phenylene group, $L^1$ and $L^2$ each represent a single bond or a divalent organic linking group, La represents an alkylene group with 2 to 10 carbon atoms, Lb represents —C(=O)— or —NHC(=O)—, $A^1$ and $A^2$ each represent a monovalent organic group, m and n each represent an integer of 2 to 8, and p and q each represent an integer of 1 to 100.

Below, preferable specific examples of the monomers which are represented by General Formula (i), (ii), or (i)-2 include the monomers (XA-1) to (XA-23) according to paragraphs "0081" to "0084" in JP2012-173356A; however, the present invention is not limited thereto.

It is sufficient if the copolymer which includes a structure unit which is represented by one of General Formula (1) and General Formula (2) below includes at least one type of repeating unit selected from repeating units which are represented by one of General Formulas (1) and (2) and the copolymer may include one type only or may include two or more types.

In addition, in the copolymer which includes a structure unit which is represented by one of General Formula (1) and General Formula (2) below, the content of the repeating units which are represented by one of General Formulas (1) and (2) is not particularly limited; however, in a case where the entirety of the repeating units which are contained in the polymer is set to 100 mass %, it is preferable to contain 5 mass % or more of the repeating units which are represented by one of General Formulas (1) and (2), it is more preferable to contain 50 mass %, and it is even more preferable to contain 50 mass % to 80 mass %.

The copolymer which includes a structure unit which is represented by one of General Formula (1) and General Formula (2) below is preferably a polymer compound formed by copolymerizing a monomer which has a functional group which may be absorbed in a pigment and a monomer which is represented by General Formulas (i), (ii), and (i)-2 for the purpose of increasing the absorption in the pigment.

Examples of the monomer which has a functional group which may be absorbed in a pigment specifically include a monomer which has an acid group, a monomer which has an organic dye structure or a heterocyclic structure, a monomer which has a basic nitrogen atom, a monomer which has an ionic group, and the like. Among these, in terms of adsorptive power to a pigment, a monomer which has an acid group and a monomer which has an organic dye structure or a heterocyclic structure are preferable.

Examples of the monomer which has an acid group include a vinyl monomer which has a carboxyl group or a vinyl monomer which has a sulfonic acid group.

Examples of the vinyl monomer which has a carboxyl group include (meth)acrylic acid, vinyl benzoic acid, maleic acid, maleic acid monoalkyl ester, fumaric acid, itaconic acid, crotonic acid, cinnamic acid, acrylic acid dimer, and the like. In addition, it is also possible to use an addition reactant of a monomer which has a hydroxyl group such as 2-hydroxyethyl (meth)acrylate and a cyclic acid anhydride such as maleic acid anhydride, phthalic acid anhydride, succinic acid anhydride, and a cyclohexane dicarboxylic acid anhydride, ω-carboxy-polycaprolactone mono(meth)acrylate, and the like. In addition, as a precursor of the carboxyl group, an acid anhydride-containing monomer such as maleic acid anhydride, itaconic acid anhydride, and citraconic acid anhydride may be used. Here, out of these, from the point of view of the developing removability of a non-exposed section, an addition reactant of a monomer which has a hydroxyl group such as 2-hydroxyethyl (meth)acrylate and a cyclic acid anhydride such as maleic acid anhydride, phthalic acid anhydride, succinic acid anhydride, and a cyclohexane dicarboxylic acid anhydride is preferable.

In addition, examples of the vinyl monomer which has a sulfonic acid group include 2-acrylamide-2-methylpropane sulfonic acid and the like and examples of the vinyl monomer which has a phosphoric acid group include phosphoric acid mono(2-acryloyloxyethyl ester), phosphoric acid mono (1-methyl-2-acryloyloxyethyl ester), and the like.

The copolymer which includes a structure unit which is represented by one of General Formula (1) and General Formula (2) below preferably includes a repeating unit which is derived from the monomer which has acid group as described above. By including the repeating unit, the developing removability of a non-exposed section is excellent in a case of applying the composition of the present invention to a colored photosensitive resin composition.

The copolymer which includes a structure unit which is represented by one of General Formula (1) and General Formula (2) below may only include one type of repeating unit which is derived from a monomer which has an acid group or may include two or more types.

In the copolymer which includes a structure unit which is represented by one of General Formula (1) and General Formula (2) below, the content of the repeating units which are derived from a monomer which has an acid group is preferably 50 mgKOH/g or more and particularly preferably 50 mgKOH/g to 200 mgKOH/g. That is, in terms of suppressing the generation of deposits in a developer, the content of the repeating units which are derived from a monomer which has an acid group is preferably 50 mgKOH/g or more. In order to effectively suppress the generation of secondary aggregates which are aggregates of primary particles of a pigment or effectively weaken the aggregation of the secondary aggregates, the content of the repeating units which are derived from a monomer which has an acid group is preferably 50 mgKOH/g to 200 mgKOH/g.

Examples of the monomer which has an organic dye structure or a heterocyclic structure include one compound selected from the group consisting of specific monomers, maleimide, and maleimide derivatives according to paragraphs "0048" to "0070" in JP2009-256572A.

Examples of the monomer which has a basic nitrogen atom include, as (meth)acrylic acid ester, (meth)acrylic acid N,N-dimethylaminoethyl, (meth)acrylic acid N,N-dimethyaminopropyl, (meth)acrylic acid 1-(N,N-dimethylamino)-1,1-dimethylmethyl, (meth)acrylic acid N,N-dimethylaminohexyl, (meth)acrylic acid N,N-diethylaminoethyl, (meth)acrylic acid N,N-diisopropylaminoethyl, (meth)acrylic acid N,N-di-n-butylaminoethyl, (meth)acrylic acid N,N-di-i-butylaminoethyl, (meth)acrylic acid morpholinoethyl, (meth)acrylic acid piperidinoethyl, (meth)acrylic acid 1-piperidinoethyl, (meth)acrylic acid N,N-methyl-2-pyrrolidylaminoethyl, (meth)acrylic acid N,N-methylphenylaminoethyl, and the like, as (meth)acrylamides, N—(N',N'-dimethylaminoethyl)acrylamide, N—(N',N'-dimethylaminoethyl) methacrylamide, N—(N',N'-diethylaminoethyl)acrylamide, N—(N',N'-diethylaminoethyl) methacrylamide, N—(N',N'-dimethylaminopropyl)acrylamide, N—(N',N'-dimethylaminopropyl) methacrylamide, N—(N',N'-diethylaminopropyl)acrylamide, N—(N',N'-diethylaminopropyl) methacrylamide, 2-(N,N-dimethylamino)ethyl (meth)acrylamide, 2-(N,N-diethylamino)ethyl (meth)acrylamide, 3-(N,N-diethylamino)propyl (meth)acrylamide, 3-(N,N-dimethylamino)propyl (meth)acrylamide, 1-(N,N-dimethylamino)-1,1-dimethylmethyl (meth)acrylamide, and 6-(N,N-diethylamino)hexyl (meth)acrylamide, morpholino (meth)acrylamide, piperidino (meth)acrylamide, N-methyl-2-pyrrolidyl (meth)acrylamide, and the like, and as styrenes, N,N-dimethylamino styrene, N,N-dimethylaminomethyl styrene, and the like.

In addition, it is also possible to use a monomer which has a urea group, a urethane group, a hydrocarbon group with 4 or more carbon atoms which has an oxygen atom with a ligating property, an alkoxysilyl group, an epoxy group, an isocyanate group, and a hydroxyl group. In detail, examples thereof include the monomers according to paragraph "0095" in JP2012-173356A, the entire contents of which are incorporated herein by reference.

Examples of the monomer which has an ionic group include a vinyl monomer (an anionic vinyl monomer and a cationic vinyl monomer) which has an ionic group. Examples thereof include, as an anionic vinyl monomer, alkali metallic salt of the vinyl monomer which has an acid group, salts with organic amines (for example, a tertiary amine such as triethylamine and dimethylamino ethanol), and the like, as a cationic vinyl monomer, a cationic vinyl monomer where the nitrogen-containing vinyl monomer is made to be quaternary using halogenated alkyl (alkyl groups: C1 to C18, halogen atoms: chlorine atoms, bromine atoms, or iodine atoms); halogenated benzyl such as benzyl chloride and benzyl bromide; alkyl sulfonic acid ester such as methane sulfonic acid (alkyl groups: C1 to C18); aryl sulfonic acid alkyl ester such as benzene sulfonic acid and toluene sulfonic acid (alkyl groups: C1 to C18); sulfate dialkyl (alkyl groups: C1 to C4), and the like, dialkyldiallyl ammonium salt, and the like.

It is possible to appropriately select the monomer which has a functional group which may be absorbed in a pigment according to the type of the pigment to be dispersed and these monomers may be used individually or two or more types may be used together.

The copolymer which includes a structure unit which is represented by one of General Formula (1) and General Formula (2) below may further include a repeating unit which is derived from a copolymerizable vinyl monomer within a range in which the effects are not impaired.

Here, the usable vinyl monomer is not particularly limited; however, for example, (meth)acrylic acid esters, crotonic acid esters, vinyl esters, maleic acid diesters, fumaric acid diesters, itaconic diesters, (meth)acrylamides, vinyl ethers, esters such as vinyl alcohol, styrenes, (meth)acrylonitrile, and the like are preferable. Specific examples of the vinyl monomer include the compounds below. Here, in the present specification, "(meth)acryl" may be used in a case of indicating one of or both "acryl and methacryl".

Examples of the (meth)acrylic acid esters include (meth)acrylic acid methyl, (meth)acrylic acid ethyl, (meth)acrylic acid n-propyl, (meth)acrylic acid isopropyl, (meth)acrylic acid n-butyl, (meth)acrylic acid isobutyl, (meth)acrylic acid t-butyl, (meth)acrylic acid n-hexyl, (meth)acrylic acid cyclohexyl, (meth)acrylic acid t-butylcyclohexyl, (meth)acrylic acid 2-ethylhexyl, (meth)acrylic acid t-octyl, (meth)acrylic acid dodecyl, (meth)acrylic acid octadecyl, (meth)acrylic acid acetoxyethyl, (meth)acrylic acid acetoacetoxyethyl, (meth)acrylic acid phenyl, (meth)acrylic acid 2-hydroxyethyl, (meth)acrylic acid 2-ethoxyethyl, (meth)acrylic acid 2-ethoxyethyl, (meth)acrylic acid 2-(2-methoxyethoxy)ethyl, (meth)acrylic acid 3-phenoxy-2-hydroxypropyl, (meth)acrylic acid benzyl, (meth)acrylic acid diethylene glycol monomethyl ether, (meth)acrylic acid diethylene glycol monoethyl ether, (meth)acrylic acid triethylene glycol monomethyl ether, (meth)acrylic acid triethylene glycol monoethyl ether, (meth)acrylic acid polyethylene glycol monomethyl ether, (meth)acrylic acid polyethylene glycol monoethyl ether, (meth)acrylic acid β-phenoxyethoxyethyl, (meth)acrylic acid nonylphenoxy polyethylene glycol, (meth)acrylic acid dicyclopentenyl, (meth)acrylic acid dicyclopentenyloxyethyl, (meth)acrylic acidtrifluoroethyl, (meth)acrylic acid octafluoropentyl, (meth)acrylic acid perfluorooctylethyl, (meth)acrylic acid dicyclopentanyl, (meth)acrylic acid tribromophenyl, (meth)acrylic acid tribromophenyloxyethyl, and the like.

Examples of the crotonic acid esters include crotonic acid butyl, crotonic acid hexyl, and the like.

Examples of the vinyl esters include vinyl acetate, vinyl propionate, vinyl butylate, vinyl methoxy acetate, vinyl benzoate, and the like.

Examples of the maleic acid diesters include maleic acid dimethyl, maleic acid diethyl, maleic acid dibutyl, and the like.

Examples of the fumaric acid diesters include fumaric acid dimethyl, fumaric acid diethyl, fumaric acid dibutyl, and the like.

Examples of the itaconic acid diesters include itaconic acid dimethyl, itaconic acid diethyl, itaconic acid dibutyl, and the like.

Examples of the (meth)acrylamides include (meth)acrylamide, N-methyl (meth)acrylamide, N-ethyl (meth)acrylamide, N-propyl (meth)acrylamide, N-isopropyl (meth)acrylamide, N-n-butylacryl (meth)acrylamide, N-t-butyl (meth)acrylamide, N-cyclohexyl (meth)acrylamide, N-(2-methoxyethyl) (meth)acrylamide, N,N-dimethyl (meth)acrylamide, N,N-diethyl (meth)acrylamide, N-phenyl (meth)acrylamide, N-benzyl (meth)acrylamide, (meth)acryloylmorpholine, diacetone acrylamide, and the like.

Examples of the vinyl ethers include methyl vinyl ether, butyl vinyl ether, hexyl vinyl ether, methoxyethyl vinyl ether, and the like.

Examples of the styrenes include styrene, methyl styrene, dimethyl styrene, trimethyl styrene, ethyl styrene, isopropyl styrene, butyl styrene, hydroxy styrene, methoxy styrene, butoxy styrene, acetoxy styrene, chloro styrene, dichloro styrene, bromo styrene, chloromethyl styrene, hydroxy styrene which is protected by a group (for example, t-Boc and the like) which is able to be removed and protected by acidic substances, vinyl benzoic acid methyl, α-methyl styrene, and the like.

A preferable aspect of the copolymer which includes a structure unit which is represented by one of General Formula (1) and General Formula (2) below is an aspect where at least a monomer which is represented by General Formula (i), (ii), or (i)-2 and a monomer which has an acid group or a monomer which has an organic dye structure or a heterocyclic structure are copolymerized and more preferably an aspect where at least a monomer which is represented by General Formula (i)-2 described above and a monomer which has an acid group are copolymerized.

According to the aspect, it is possible to add a composition which is excellent in pigment absorption and superior in the developing characteristics.

In the present invention, those dispersing agents indicated below are particularly preferable as a dispersing agent (D-3).

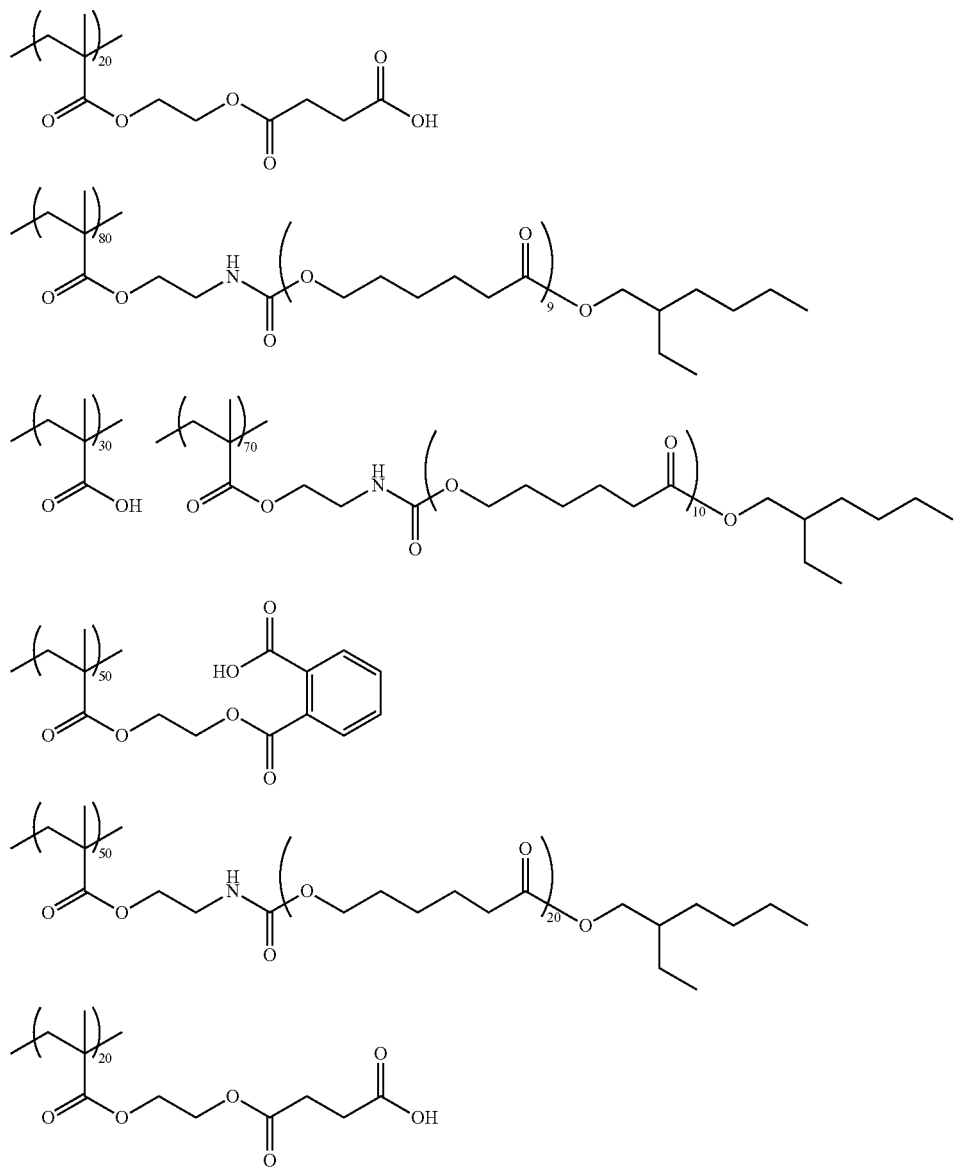

-continued
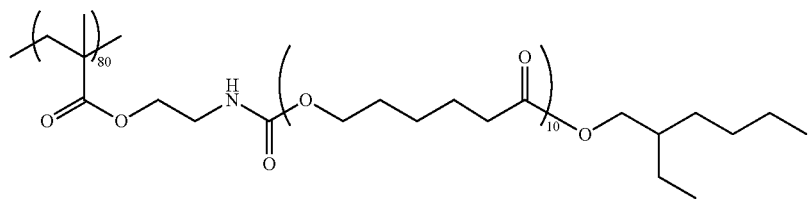
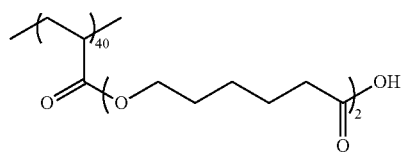
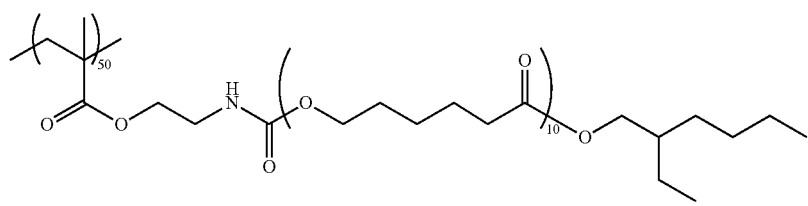
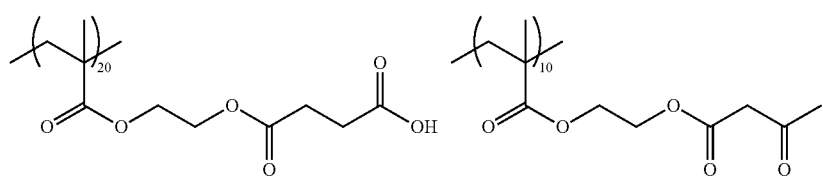
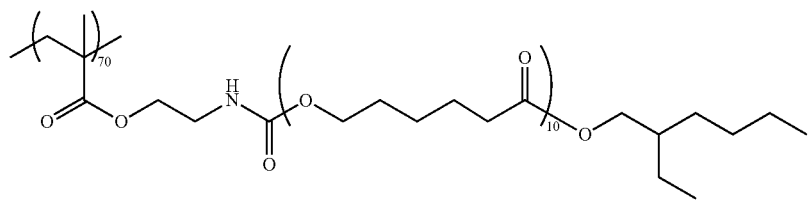
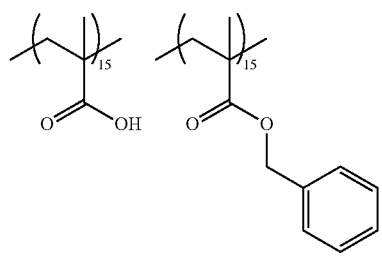
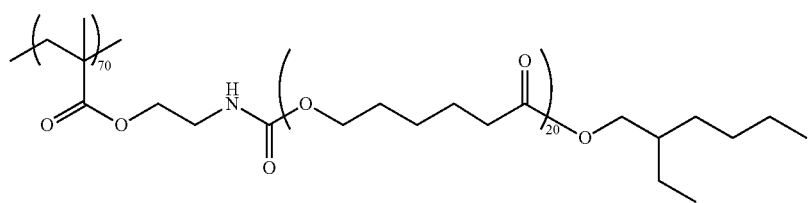

—Graft Copolymer (D-4) which Includes a Nitrogen Atom in the Main Chain—

The composition of the present invention preferably has a graft copolymer (D-4) which includes a nitrogen atom in the main chain. The graft copolymer which contains a nitrogen atom in the main chain preferably has a repeating unit which is represented by Formula (A) and/or a repeating unit which is represented by Formula (B).

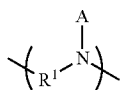

General Formula (A)

(In Formula (A), $R^1$ represents an alkylene group with 1 to 5 carbon atoms and A represents a hydrogen atom or any one of Formulas (C) to (E) below.)

In Formula (A) described above, $R^1$ represents a straight-chain or branched alkylene group with 1 to 5 carbon atoms such as methylene, ethylene, and propylene, preferably an alkylene group with 2 or 3 carbon atoms, and more preferably an ethylene group. A represents a hydrogen atom or any one of Formulas (C) to (E) below; however, Formula (C) is preferable.

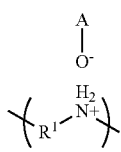

(B)

In Formula (B) described above, $R^1$ and A have the same meaning as $R^1$ and A in Formula (A).

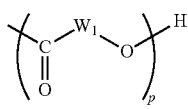

(C)

In Formula (C) described above, $W_1$ represents a straight-chain or branched alkylene group with 2 to 10 carbon atoms and, among these, an alkylene group with 4 to 7 carbon atoms such as butylene, pentylene, and hexylene is preferable. p represents an integer of 1 to 20 and is preferably an integer of 5 to 10.

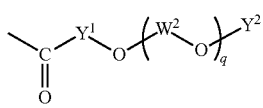

(D)

In Formula (D) described above, $Y^1$ represents a divalent linking group and, among these, an alkylene group with 1 to 4 carbon atoms such as ethylene and propylene and an alkyleneoxy group with 1 to 4 carbon atoms such as ethyleneoxy and propyleneoxy are preferable. $W^2$ represents a straight-chain or branched alkylene group with 2 to 10 carbon atoms such as ethylene, propylene, and butylene and, among these, an alkylene group with 2 or 3 carbon atoms such as ethylene and propylene is preferable. $Y^2$ represents a hydrogen atom or —CO—$R^2$ ($R^2$ represents an alkyl group with 1 to 10 carbon atoms such as ethyl, propyl, butyl, pentyl, or hexyl and, among these, an alkyl group with 2 to 5 carbon atoms such as ethyl, propyl, butyl, or pentyl is preferable). q represents an integer of 1 to 20 and is preferably an integer of 5 to 10.

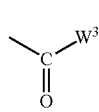

(E)

In Formula (E) described above, $W^3$ represents an alkyl group with 1 to 50 carbon atoms or a hydroxyalkyl group with 1 to 50 carbon atoms which has 1 to 5 hydroxyl groups and, among these, an alkyl group with 10 to 20 carbon atoms such as stearyl and a hydroxyalkyl group with 10 to 20 carbon atoms such as monohydroxystearyl which has 1 or 2 hydroxyl groups is preferable.

The content ratio of the repeating units which are represented by Formula (A) or (B) in the "graft copolymer which contains a nitrogen atom" is preferably high, generally 50 mol % or more, and preferably 70 mol % or more. Both the repeating unit which is represented by Formula (A) and the repeating unit which is represented by Formula (B) may be present and the content ratio thereof is not particularly limited; however, it is preferable to contain more of the repeating unit of Formula (A). The total number of the repeating units which are represented by Formula (A) or Formula (B) is generally 1 to 100, preferably 10 to 70, and more preferably 20 to 50. In addition, other repeating units than the repeating units of Formula (A) and Formula (B) may be included and examples of the other repeating units include an alkylene group, an alkyleneoxy group, and the like. The "graft copolymer which contains a nitrogen atom" is preferably a graft copolymer of which the terminal is —$NH_2$ and —$R^1$—$NH_2$ ($R^1$ has the same meaning as the $R^1$ above).

Here, the main chain of the "graft copolymer which contains a nitrogen atom" may be straight-chain or branched. The amine value of the graft copolymer is generally 5 mgKOH/g to 100 mgKOH/g, preferably 10 mgKOH/g to 70 mgKOH/g, and more preferably 15 mgKOH/g to 40 mgKOH/g or less.

When the amine value is 5 mgKOH/g or more, it is possible to further improve the dispersion stability and it is possible to make the viscosity more stable. When the amine value is 100 mgKOH/g or less, it is possible to further suppress residue and it is possible to further suppress decreases in the electric characteristics after forming a liquid crystal panel.

The weight average molecular weight of the "graft copolymer which contains a nitrogen atom" described above which is measured by GPC is preferably 3,000 to 100,000 and particularly preferably 5,000 to 50,000. When the weight average molecular weight is 3,000 or more, it is possible to further suppress aggregation of the coloring material and it is possible to further suppress increases in viscosity or gelling. When 100,000 or less, it is possible to further suppress the copolymer itself from increasing in viscosity and it is also possible to further suppress the solubility in an organic solvent from being insufficient.

In the present invention, the dispersing agent indicated below is particularly preferable as the dispersing agent (D-4).

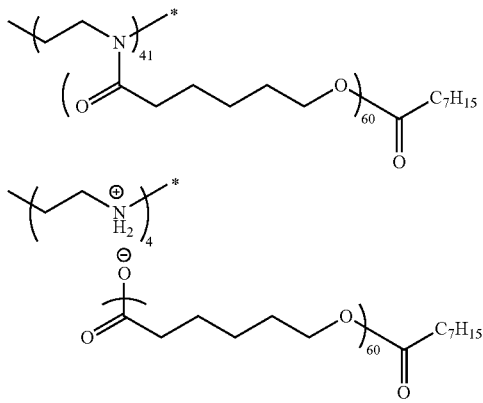

It is possible to adopt a method which is known in the art for the method for synthesizing the dispersing agent (D-4) described above and, for example, it is possible to use the method according to JP1988-30057B (JP-S63-30057B).

The molecular weight of the dispersing agent which is used in the present invention is preferably 2,000 to 50,000 in weight average molecular weight (Mw) and more preferably 5,000 to 30,000.

The content of the dispersing agent is preferably 10 parts by mass to 120 parts by mass with respect to the entirety of the pigment as 100 parts by mass, and more preferably 25 parts by mass to 60 parts by mass.

Only one type of the dispersing agent may be included in the composition of the present invention or two or more types may be included. In a case of including two or more types, the total amount is preferably within the ranges described above.

<<Pigment Derivative>>

The composition of the present invention preferably has a pigment derivative. The pigment derivative is preferably a compound which has a structure in which a portion of the pigment is substituted with a basic group. Examples of the pigment for constituting the pigment derivative include a quinoline-based pigment, a benzimidazolone-based pigment, an isoindoline-based pigment, a diketopyrrolopyrrole-based pigment, an azo-based pigment, a phthalocyanine-based pigment, an anthraquinone-based pigment, a quinacridone-based pigment, a dioxazine-based pigment, a perinone-based pigment, a perylene-based pigment, a thioindigo-based pigment, an isoindoline-based pigment, an isoindolinone-based pigment, a quinophthalone-based pigment, a threne-based pigment, a metal complex-based pigment, and the like.

The pigment derivative is preferably a quinoline-based, benzimidazolone-based, or an isoindoline-based pigment derivative, and more preferably a benzimidazolone-based pigment derivative.

The basic group of the pigment derivative is preferably an amino group. Examples of the compound include the compounds below.

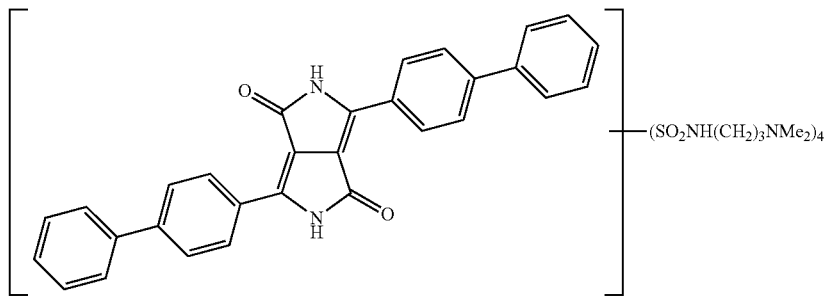

-continued

The pigment derivative which is used in the present invention is preferably at least one type of pigment derivative which is represented by General Formulas (I) to (IV) below. Description will be given below of a pigment derivative which is represented by General Formulas (I) to (IV).

—Pigment Derivative which is Represented by General Formula (I)—

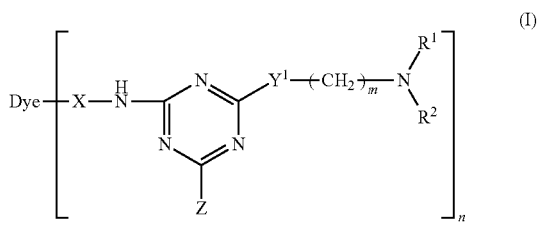

(In General Formula (I), Dye represents an n-valent organic dye residue, X represents a single bond, —CONH—$Y^2$—, —SO$_2$NH—$Y^2$—, or —CH$_2$NHCOCH$_2$NH—$Y^2$— ($Y^2$ represents an alkylene group or an arylene group which may have a substituent group), $Y^1$ represents —NH— or —O—, Z represents a hydroxyl group, an alkoxy group, a group which is represented by General Formula (I-1) below, or —NH—X-Dye (X has the same meaning as X in General Formula (I)) in a case where n represents 1 and each represents a hydroxyl group, an alkoxy group, or a group which is represented by General Formula (I-1) below in a case where n represents an integer of 2 to 4, $R^1$ and $R^2$ each represent an alkyl group which may have a substituent group, and R¹ and R² may be combined with each other to form a hetero ring which includes a nitrogen atom. m represents an integer of 1 to 6 and n represents an integer of 1 to 4. In a case where n is 2 or more, a plurality of X, Y¹, R¹, and R² may be each the same or may be different.)

(In General Formula (I-1), Y³ represents —NH— or —O—. R¹ and R² each represent an alkyl group which may have a substituent group and R¹ and R² may be combined with each other to form a hetero ring which includes a nitrogen atom. m represents an integer of 1 to 6.)

Dye represents an n-valent organic dye residue. Examples of the organic dye residue include a coloring atomic group in the pigment as described above, the similar structure thereof, or a partial structure and specific examples thereof include a structure which includes one or more types of partial structures selected from a skeleton which has an azo group, a skeleton which has an urea structure, a skeleton which has an amide structure, a skeleton which has a cyclic amide structure, an aromatic ring which has a hetero atom-containing 5-membered ring, and an aromatic ring which has a hetero atom-containing 6-membered ring and Dye is a substituent group which includes the organic dye residues.

Dye preferably has a pigment mother nucleus structure or a pigment mother nucleus structure and an aromatic ring, or a nitrogen-containing aromatic ring, or an oxygen-containing aromatic ring, or a sulfur-containing aromatic ring, and the amino group is bonded with any of the pigment mother nucleus structure, an aromatic ring, a nitrogen-containing aromatic ring, an oxygen-containing aromatic ring, and a sulfur-containing aromatic ring directly or by a linking group. Specific examples thereof include a quinoline-based residue, a benzimidazolone-based residue, an isoindoline-based residue, diketopyrrolopyrrole-based residue, an azo-based residue, a phthalocyanine-based residue, an anthraquinone-based residue, a quinacridone-based residue, a dioxazine-based residue, a perinone-based residue, a perylene-based residue, a thioindigo-based residue, an isoindoline-based residue, an isoindolinone-based residue, a quinophthalone-based residue, a threne-based residue, a metal complex-based residue, and the like.

Specific examples of the organic dye residue which Dye represents include a copper phthalocyanine residue, the organic dye residues below, and the like. In the formulas, * represents a bonding site with X in General Formula (I).

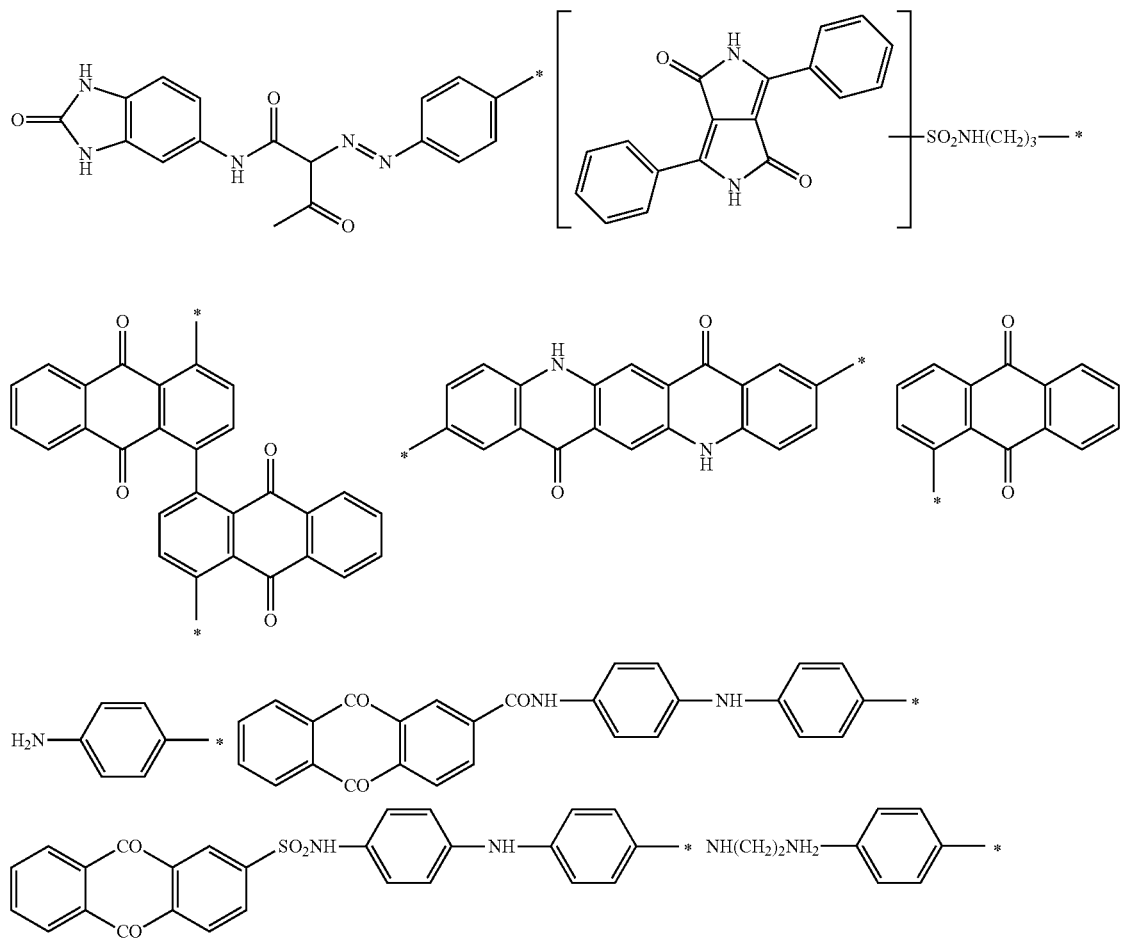

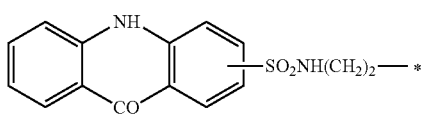
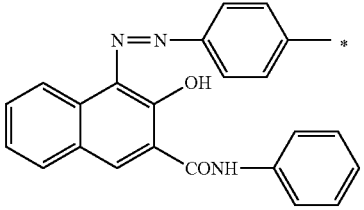
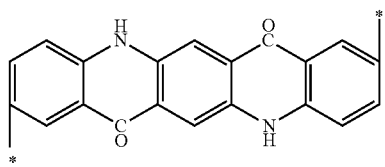
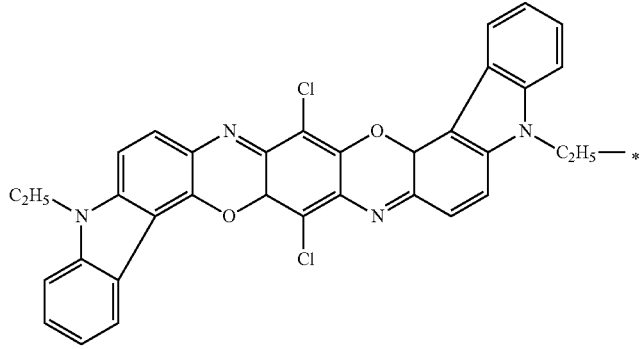
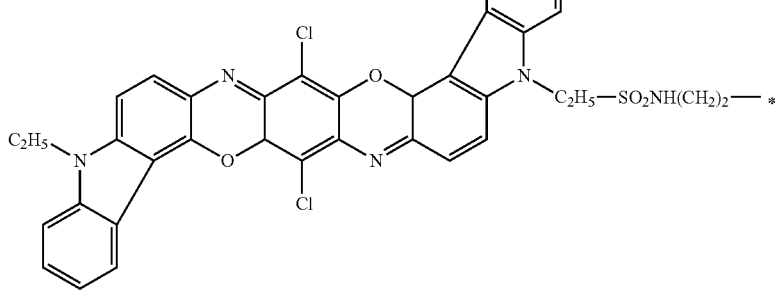
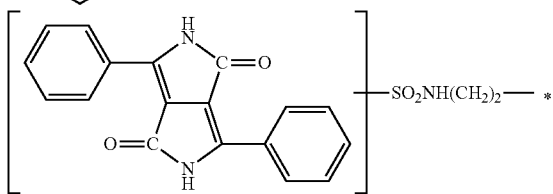

Among these, a monoazo dye which has a benzimidazolone skeleton is preferable.

X represents a single bond, —CONH—$Y^2$—, $SO_2$NH—$Y^2$—, or —$CH_2$NHCOC$H_2$NH—$Y^2$— and a single bond is preferable.

$Y^2$ represents an alkylene group or an arylene group which may have a substituent group. The alkylene group is preferably an alkylene group with 1 to 10 carbon atoms, more preferably an alkylene group with 1 to 6 carbon atoms, and even more preferably an alkylene group with 1 to 3 carbon atoms. Specific examples thereof include a methylene group, an ethylene group, a propylene group, a butylene group, a pentylene group, a hexylene group, and the like. The alkylene group may have a substituent group and examples of the substituent group include the groups described in the substituent group section.

The arylene group is preferably an arylene group with 6 to 20 carbon atoms and more preferably an arylene group with 6 to 10 carbon atoms. Specific examples thereof include a phenylene group, a naphthylene group, an anthracenylene, and the like.

The alkylene group and the arylene group may have a substituent group and examples of the substituent group include the groups described in the substituent group section.

$Y^1$ represents —NH— or —O— and is preferably —NH—.

$R^1$ and $R^2$ each represent an alkyl group which may have a substituent group and $R^1$ and $R^2$ may be combined with each other to form a hetero ring which includes a nitrogen atom.

The alkyl group is preferably an alkyl group with 1 to 10 carbon atoms and more preferably an alkyl group with 1 to 6 carbon atoms. Specific examples thereof include a methyl group, an ethyl group, a propyl group, an isopropyl group, a butyl group, an isobutyl group, a tert-butyl group, a neopentyl group, an n-hexyl group, an n-octyl group, and the like. The alkyl group may have a substituent group and examples of the substituent group include the groups described in the substituent group section.

$R^1$ and $R^2$ preferably represent an alkyl group which may have the same substituent group.

m represents an integer of 1 to 6, is preferably an integer of 1 to 4, and more preferably an integer of 1 to 3.

n represents an integer of 1 to 4, is preferably an integer of 1 to 3, and more preferably 1 or 2.

Z represents a hydroxyl group, an alkoxy group, a group which is represented by General Formula (I-1) below, or —NH—X-Dye in a case where n represents 1 (X has the same meaning as X in General Formula (I)) and each represents a hydroxyl group, an alkoxy group, or a group which is represented by General Formula (I-1) below in a case where n represents an integer of 2 to 4.

In a case where n represents 1, Z is preferably a group which is represented by General Formula (I-1) below or —NH—X-Q and more preferably a group which is represented by General Formula (I-1) below.

In a case where n represents an integer of 2 to 4, Z is preferably a group which is represented by General Formula (I-1) below.

General Formula (I-1)

(In General Formula (I-1), $Y^3$ represents —NH— or —O—. $R^1$ and $R^2$ each represent an alkyl group which may have a substituent group and $R^1$ and $R^2$ may be combined with each other to form a hetero ring which includes a nitrogen atom. m represents an integer of 1 to 6.)

$Y^3$ represents —NH— or —O— and is preferably —NH—. $Y^3$ preferably represents the same group as $Y^1$ in General Formula (I).

$R^1$ and $R^2$ in General Formula (I-1) each represent an alkyl group which may have a substituent group and have the same meaning as $R^1$ and $R^2$ in General Formula (I) and the preferable ranges thereof are also the same. $R^1$ and $R^2$ in General Formula (I-1) preferably represent an alkyl group which may have the same substituent group. In addition, $R^1$ and $R^2$ in General Formula (I-1) preferably represent an alkyl group which may have the same substituent group as $R^1$ and $R^2$ in General Formula (I).

m represents an integer of 1 to 6, preferably an integer of 1 to 4, and more preferably an integer of 1 to 3. m preferably represents the same integer as m in General Formula (I).

Specific examples of the pigment derivative which is used in the present invention will be illustrated below; however, the present invention is not limited thereto.

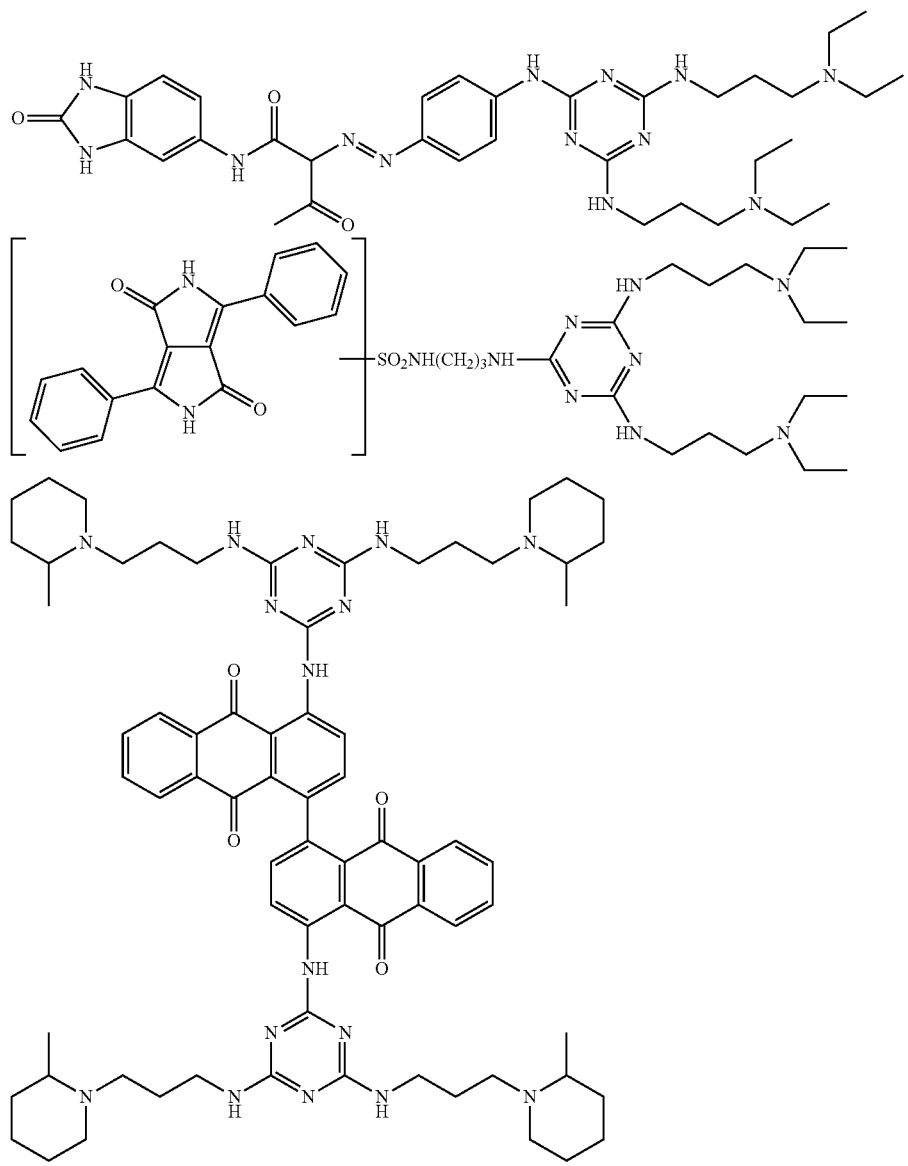

-continued
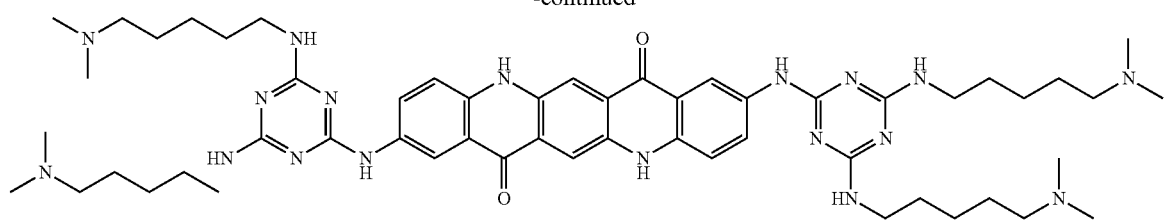
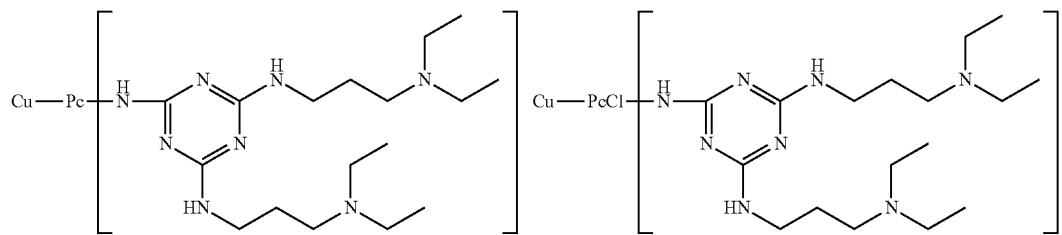
Cu—Pc: Copper phthalocyanine residues
Cu—PcCl: Chlorinated copper phthalocyanine residues
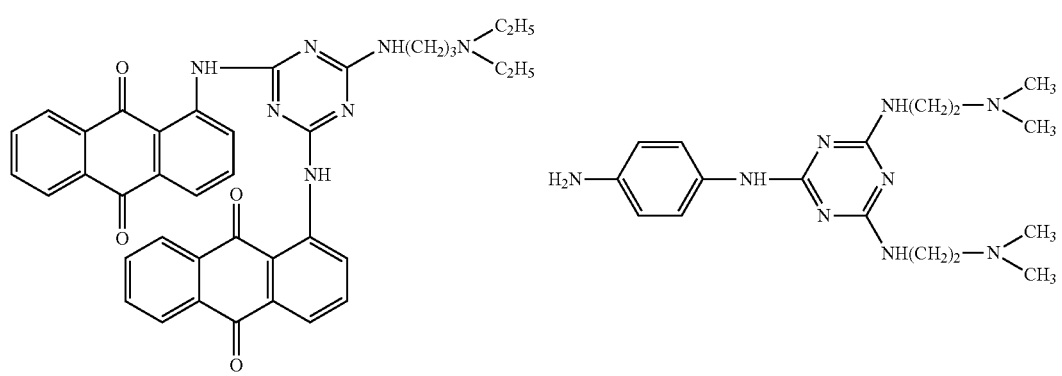
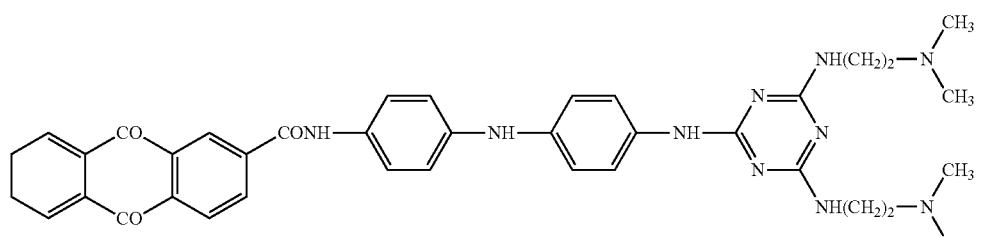
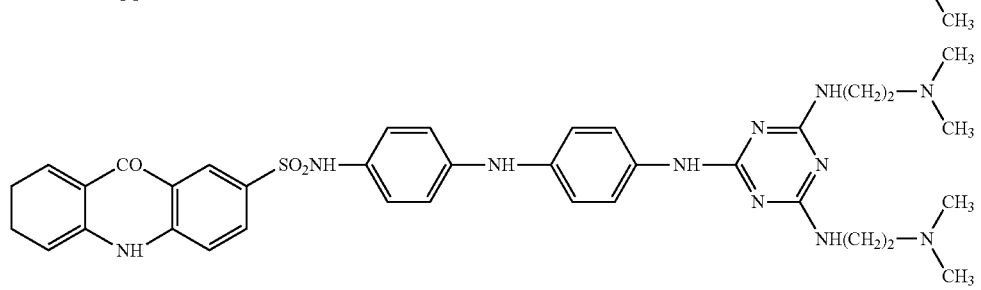
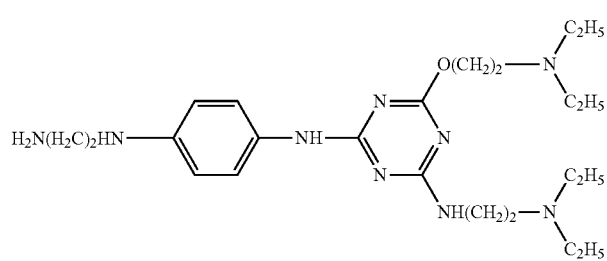

-continued
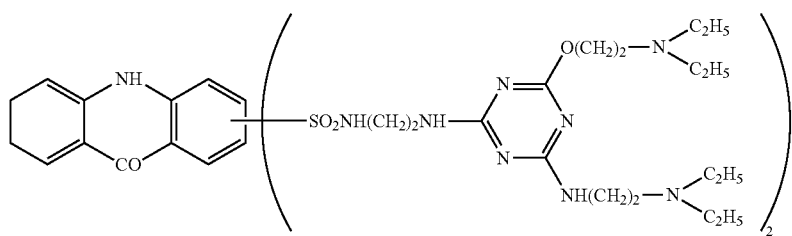
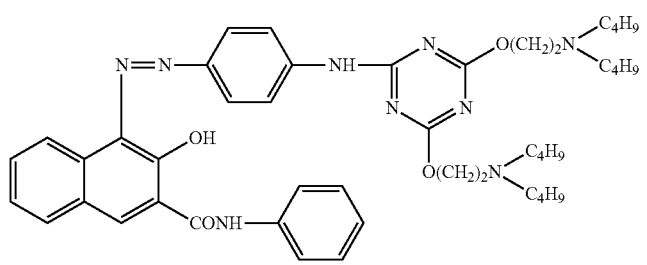
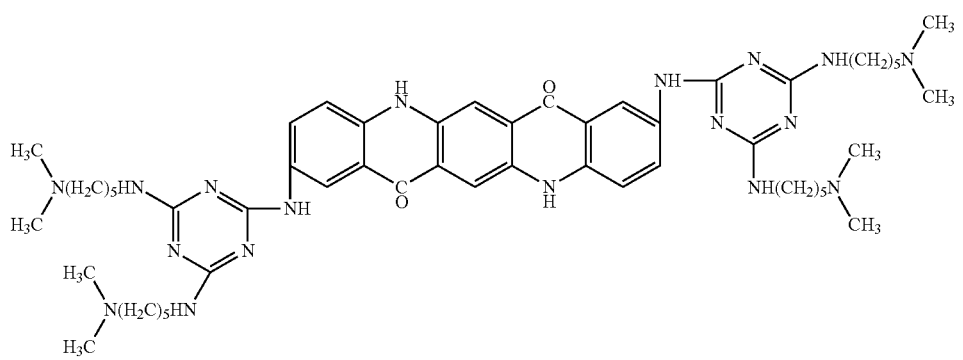
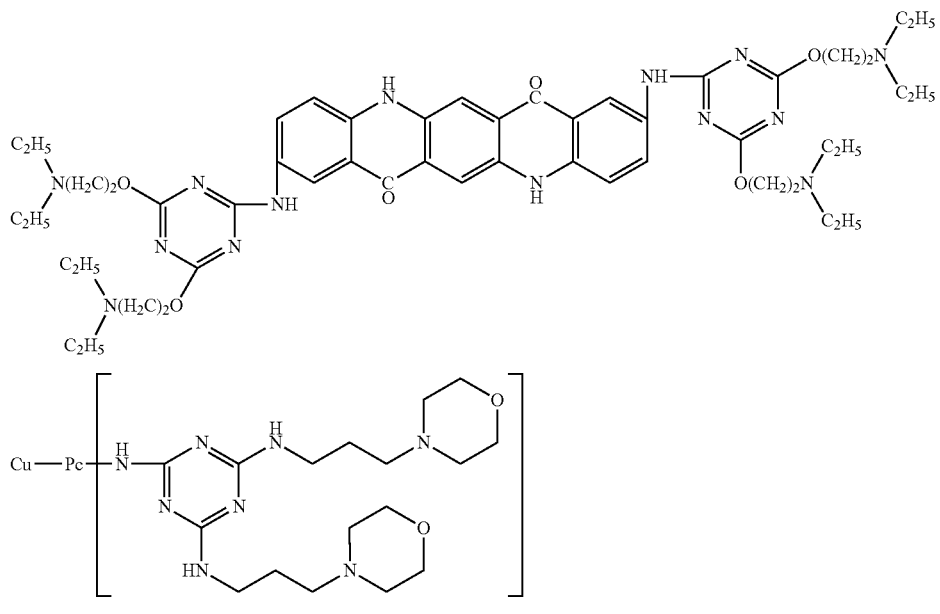
Cu—PC: Copper phthalocyanine residues -continued
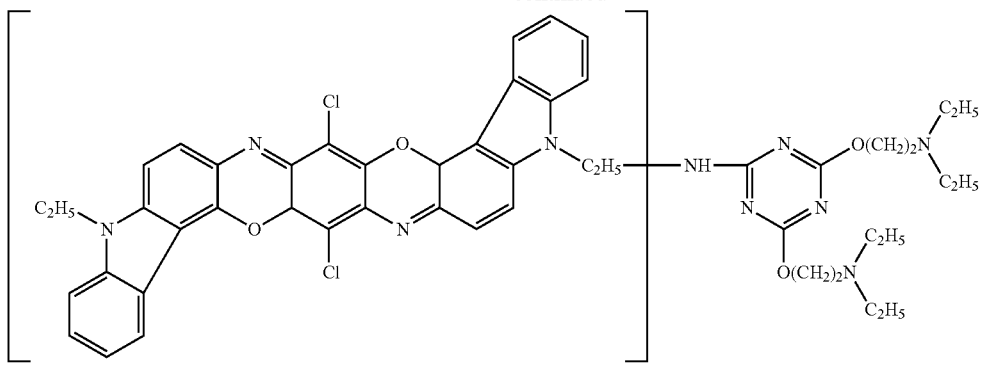
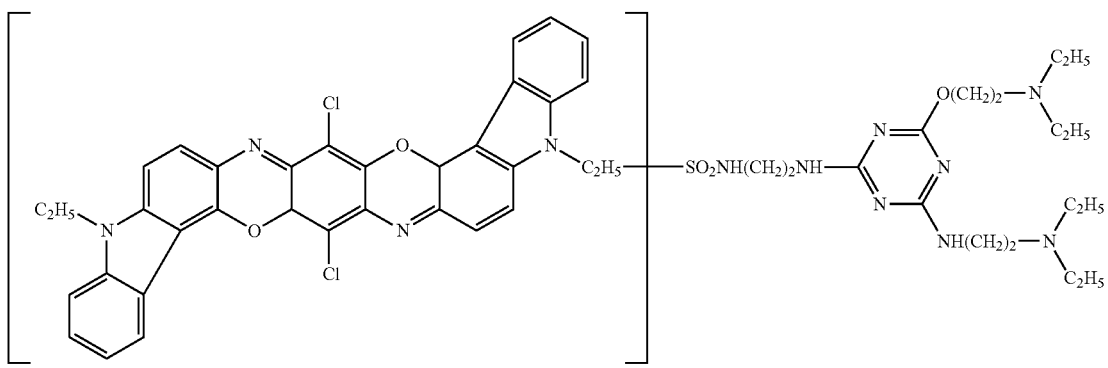
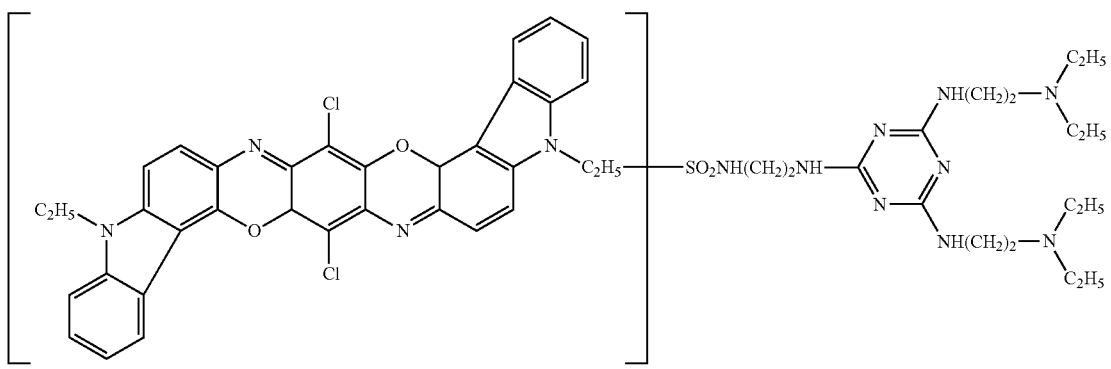
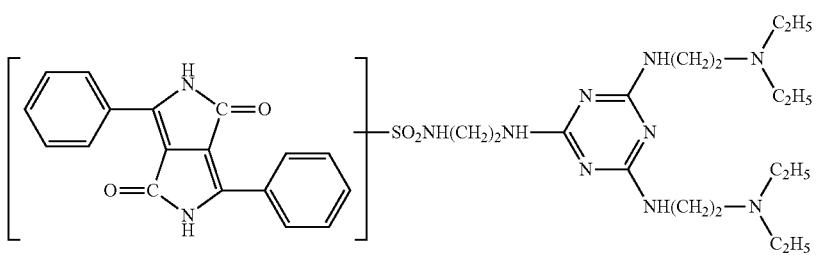

65 66
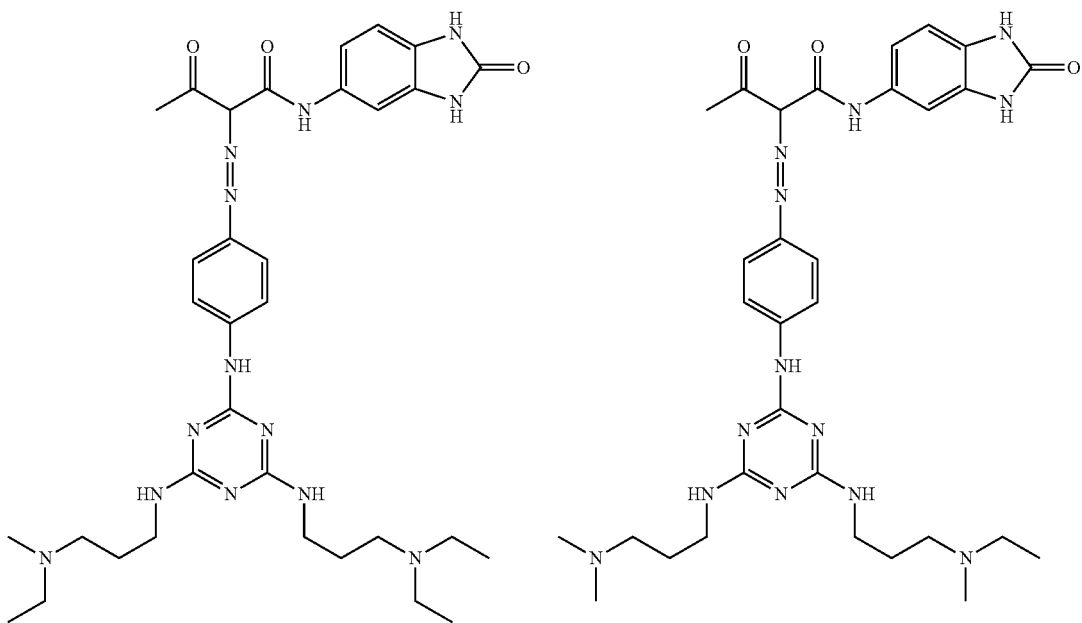
-continued
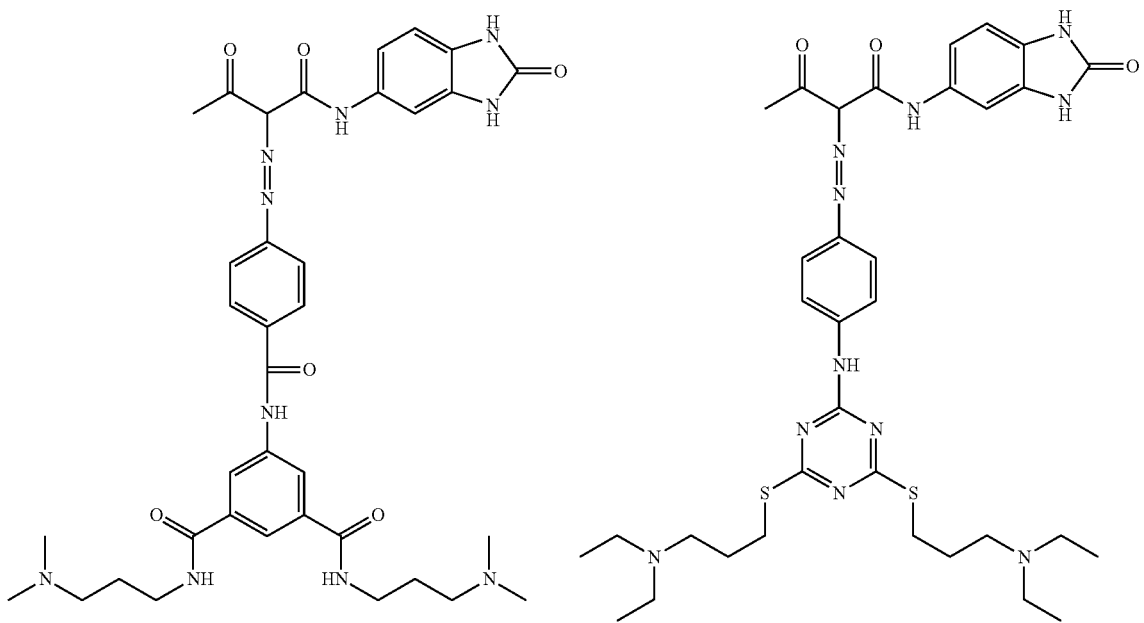

-continued

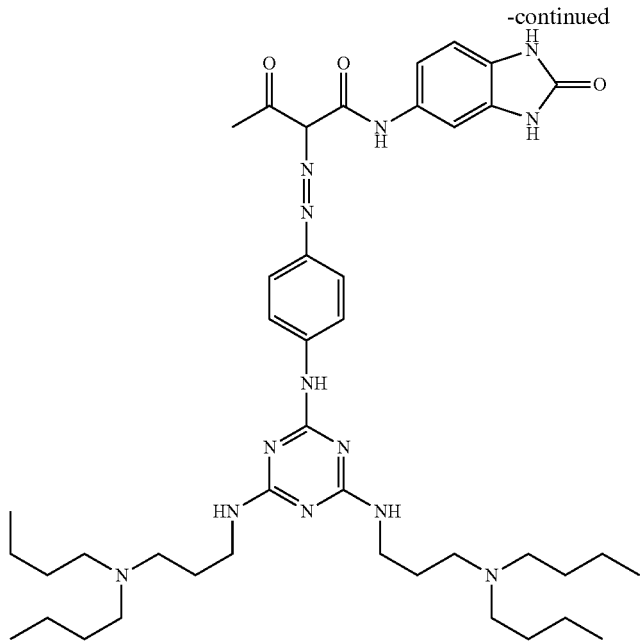

—Pigment Derivative which is Represented by General Formula (II)—

General Formula (II)

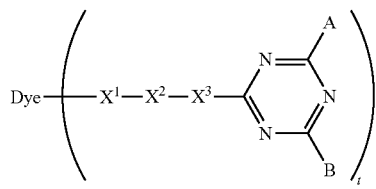

(In General Formula (II), Dye represents a quinophthalone residue which may have a substituent group, $X^1$ represents —NR'SO$_2$—, —SO$_2$NR'—, —CONR'—, —CH$_2$NR'COCH$_2$NR'—, or —NR'CO—, $X^2$ represents an arylene group with 6 to 20 carbon atoms which may have a substituent group or a hetero aromatic ring group with 4 to 20 carbon atoms which may have a substituent group, these groups may be bonded with each other by a divalent linking group selected from —NR'—, —O—, —SO$_2$—, or —CO—. $X^3$ represents —NR'— or —O—. R' represents a hydrogen atom, an alkyl group with 1 to 20 carbon atoms which may have a substituent group, an alkenyl group with 2 to 20 carbon atoms which may have a substituent group, or an aryl group with 6 to 20 carbon atoms which may have a substituent group. A and B each represent a group selected from a group which is represented by General Formula (1) below, a group which is represented by General Formula (2) below, —O—(CH$_2$)$_n$—R$^8$, —OR$^9$, —NR$^{10}$R$^{11}$, —Cl, —F, and —X$^3$—X$^2$—X$^1$-Dye, R$^8$ represents a nitrogen-containing heterocyclic residue, R$^9$, R$^{10}$, and R$^{11}$ each represent a hydrogen atom, an alkyl group with 1 to 20 carbon atoms which may have a substituent group, an alkenyl group with 2 to 20 carbon atoms which may have a substituent group, or an aryl group with 6 to 20 carbon atoms which may have a substituent group, and n represents an integer of 0 to 20.

One of A and B represents a group which is represented by General Formula (II-1) below, a group which is represented by General Formula (II-2) below, —O—(CH$_2$)n-R$^8$, —OR$^9$, or NR$^{10}$R$^{11}$ and t represents an integer of 1 to 3. A plurality of $X^1$, $X^2$, $X^3$, A, and B may be the same or may be different in a case where t is 2 or more.)

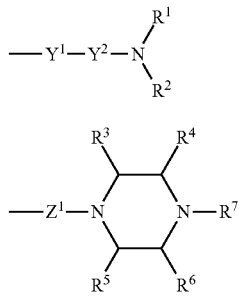

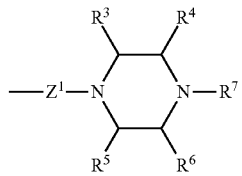

(In General Formula (II-1), $Y^1$ represents —NR'— or —O—, $Y^2$ represents an alkylene group with 1 to 20 carbon atoms which may have a substituent group, an alkenylene group with 2 to 20 carbon atoms which may have a substituent group, or an arylene group with 6 to 20 carbon atoms which may have a substituent group and these groups may be bonded with each other by a divalent linking group selected from —NR'—, —O—, —SO$_2$—, and —CO—. R' represents a hydrogen atom, an alkyl group with 1 to 20 carbon atoms which may have a substituent group, an alkenyl group with 2 to 20 carbon atoms which may have a substituent group, or an aryl group with 6 to 20 carbon atoms which may have a substituent group. R$^1$ and R$^2$ each represent an alkyl group with 1 to 20 carbon atoms which may have a substituent group or an alkenyl group with 2 to 20 carbon atoms which may have a substituent group. R$^1$ and R$^2$ may be combined together to form a heterocyclic structure and the heterocyclic structure may further include a nitrogen atom, an oxygen atom, or a sulfur atom or may have a substituent group.

In General Formula (II-2), $Z^1$ represents a single bond which connects a triazine ring and a nitrogen atom, —NR'—, —NR'-G-CO—, NR'-G-CONR"—, —NR'-G-SO$_2$—, —NR'-G-SO$_2$NR"—, —O-G-CO—, —O-G-CONR'—, —O-G-SO$_2$—, or —O-G-SO$_2$NR'—, G represents an alkylene group with 1 to 20 carbon atoms which may have a substituent group, an alkenylene group with 2 to 20 carbon atoms which may have a substituent group, or an arylene group with 6 to 20 carbon atoms which may have a substituent group, and R' and R" each represent a hydrogen atom, an alkyl group with 1 to 20 carbon atoms which may have a substituent group, an alkenyl group with 2 to 20 carbon atoms which may have a substituent group, or an aryl group with 6 to 20 carbon atoms which may have a substituent group. $R^3$, $R^4$, $R^5$, and $R^6$ each represent a hydrogen atom, an alkyl group with 1 to 20 carbon atoms which may have a substituent group, an alkenyl group with 2 to 20 carbon atoms which may have a substituent group, or an aryl group with 6 to 20 carbon atoms which may have a substituent group and $R^7$ represents an alkyl group with 1 to 20 carbon atoms which may have a substituent group or an alkenyl group with 2 to 20 carbon atoms which may have a substituent group.)

In General Formula (II), Dye represents a quinophthalone residue which may have a substituent group. In detail, the quinophthalone residue is represented by General Formula (II-3) below.

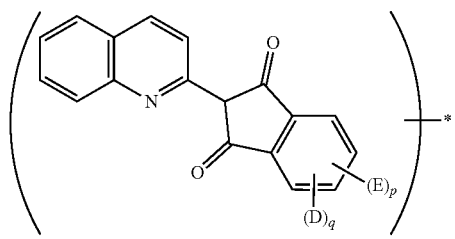

General Formula (II-3)

(In General Formula (II-3), D and E each represent any group selected from a hydrogen atom, a halogen atom, an alkyl group with 1 to 20 carbon atoms, an aromatic ring group or a heterocyclic group which may have a substituent group which D and E form with a bonded benzene ring, a hydroxyl group, an alkoxyl group with 1 to 3 carbon atoms, a carboxyl group or a salt thereof, an ester with 1 to 20 carbon atoms, an amide group with 1 to 20 carbon atoms, a sulfone group or a salt thereof, a sulfamoyl group, —NR'R"—, and a nitro group. In the formula, R' and R" each represent a hydrogen atom, an alkyl group with 1 to 20 carbon atoms which may have a substituent group, an alkenyl group with 2 to 20 carbon atoms which may have a substituent group, or an aryl group with 6 to 20 carbon atoms which may have a substituent group. p represents an integer of 0 to 4 and q represents an integer which is calculated by 4-p. * represents a bonding site with $X^1$ in General Formula (II).)

D and E each represent any group selected from a hydrogen atom, a halogen atom, an alkyl group with 1 to 20 carbon atoms, an aromatic ring group or a heterocyclic group which may have a substituent group which D and E form with a bonded benzene ring, a hydroxyl group, an alkoxyl group with 1 to 3 carbon atoms (for example, a methoxy group, an ethoxy group, and a propoxy group), a carboxyl group or a salt thereof, an ester with 1 to 20 carbon atoms, an amide group with 1 to 20 carbon atoms, a sulfone group or a salt thereof, a sulfamoyl group, —NR'R"—, and a nitro group. R' and R" each represent a hydrogen atom, an alkyl group with 1 to 20 carbon atoms which may have a substituent group, an alkenyl group with 2 to 20 carbon atoms which may have a substituent group, or an aryl group with 6 to 20 carbon atoms which may have a substituent group.

The alkyl group with 1 to 20 carbon atoms is preferably an alkyl group with 1 to 10 carbon atoms and more preferably an alkyl group with 1 to 6 carbon atoms. Specific examples thereof include a methyl group, an ethyl group, a propyl group, an isopropyl group, a butyl group, an isobutyl group, a tert-butyl group, a neopentyl group, an n-hexyl group, an n-octyl group, and the like.

Examples of the aromatic ring group or the heterocyclic ring include a phenyl group, a naphthyl group, a thiophene ring group, a pyridine ring group, a pyrrole ring group, and the like.

The aromatic ring group or the heterocyclic group which is represented by D and E, the alkyl group with 1 to 20 carbon atoms, the alkenyl group with 2 to 20 carbon atoms, and the aryl group with 6 to 20 carbon atoms which is represented by R' and R" may have a substituent group and examples of the substituent group include the groups described in the section of the substituent.

Among these, D and E are preferably a hydrogen atom and a halogen atom.

p represents an integer of 0 to 4, more preferably an integer of 1 to 4, and even more preferably 4. q represents an integer which is calculated by 4-p, specifically preferably an integer of 0 to 3, more preferably 2 or 3, and even more preferably 3.

The bonding site with $X^1$ in General Formula (II) is not particularly limited; however, the 5-position or 8-position of a quinoline skeleton in the quinophthalone residue is preferably a bonding site and the 8-position is more preferably a bonding site.

In General Formula (II), $X^1$ represents —NR' SO$_2$—, —SO$_2$NR'—, —CONR'—, —CH$_2$NR'COCH$_2$NR'—, or —NR'CO—, and is preferably —NR'SO$_2$—. Here, in a case where t is 2 or more, a plurality of $X^1$ may be the same or may be different.

The R' in $X^1$ described above represents a hydrogen atom, an alkyl group with 1 to 20 carbon atoms which may have a substituent group, an alkenyl group with 2 to 20 carbon atoms which may have a substituent group, or an aryl group with 6 to 20 carbon atoms which may have a substituent group and is preferably a hydrogen atom.

The alkyl group with 1 to 20 carbon atoms is preferably an alkyl group with 1 to 10 carbon atoms and more preferably an alkyl group with 1 to 6 carbon atoms. Specific examples thereof include a methyl group, an ethyl group, a propyl group, an isopropyl group, a butyl group, an isobutyl group, a tert-butyl group, a neopentyl group, an n-hexyl group, an n-octyl group, and the like.

The alkenyl group with 2 to 20 carbon atoms is preferably an alkenyl group with 2 to 10 carbon atoms and more preferably an alkenyl group with 2 to 6 carbon atoms. Specific examples thereof include an ethenyl group, a propenyl group, a butenyl group, a pentenyl group, a hexenyl group, and the like.

The aryl group with 6 to 20 carbon atoms is preferably an aryl group with 6 to 10 carbon atoms and specific examples thereof include a phenyl group, a naphthyl group, an anthracenyl group, and the like.

These may have a substituent group and examples of the substituent group include the groups described in the substituent group section.

In General Formula (II), $X^2$ represents an arylene group with 6 to 20 carbon atoms which may have a substituent group or a hetero aromatic ring group with 4 to 20 carbon atoms which may have a substituent group and these groups may be bonded with each other by a divalent linking group selected from —NR'—, —O—, —SO$_2$—, or —CO— (R' has the same meaning as R' in $X^1$ described above and the preferable ranges thereof are also the same). Here, in a case where t is 2 or more, a plurality of $X^2$ may be the same or may be different.

The arylene group with 6 to 20 carbon atoms is preferably an arylene group with 6 to 10 carbon atoms and specific examples thereof include a phenylene group, a naphthylene group, an anthracenylene, and the like.

The hetero aromatic ring group with 4 to 20 carbon atoms is preferably a hetero aromatic ring group with 4 to 10 carbon atoms and specific examples thereof include a thiophene ring group, a pyridine ring group, a pyrrole ring group, and the like.

These may have a substituent group and examples of the substituent group include the groups described in the substituent group section.

$X^3$ represents —NR'— or —O— and is preferably —NR'—. Here, in a case where t is 2 or more, a plurality of $X^3$ may be the same or may be different. R' has the same meaning as R' described above and the preferable ranges thereof are also the same.

A and B each represent a group selected from a group which is represented by General Formula (II-1) below, a group which is represented by General Formula (II-2) below, —O—(CH$_2$)$_n$—R$^8$, —OR$^9$, —NR$^{10}$R$^{11}$, —Cl, —F, and —X$^3$—X$^2$—X$^1$-Dye, and one of A and B is a group which is represented by General Formula (II-1) or (II-2) below, —O—(CH$_2$)n-R$^8$, —OR$^9$, or —NR$^{10}$R$^{11}$. Among these, A and B are both preferably a group which is represented by General Formula (II-1) below or General Formula (II-2) below and it is more preferable that A and B are a group which is represented by General Formula (II-1) below or General Formula (II-2) below and that A and B are the same group.

R$^8$ represents a nitrogen-containing heterocyclic residue which may be substituted and specific examples thereof include a pyrrole ring residue, a pyridine ring residue, and the like.

R$^9$, R$^{10}$, and R$^{11}$ each represent a hydrogen atom, an alkyl group with 1 to 20 carbon atoms which may have a substituent group, an alkenyl group with 2 to 20 carbon atoms which may have a substituent group, or an aryl group with 6 to 20 carbon atoms which may have a substituent group. R$^9$, R$^{10}$, and R$^{11}$ have the same meaning as R' described above and the preferable ranges thereof are also the same.

General Formula (II-1)

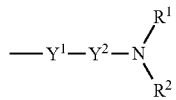

(In General Formula (II-1), Y$^1$ represents —NR'— or —O—, Y$^2$ represents an alkylene group with 2 to 20 carbon atoms which may have a substituent group, an alkenylene group with 2 to 20 carbon atoms which may have a substituent group, or an arylene group with 6 to 20 carbon atoms which may have a substituent group and these groups may be bonded with each other by a divalent linking group selected from —NR'—, —O—, —SO$_2$—, and —CO—. R' represents a hydrogen atom, an alkyl group with 1 to 20 carbon atoms which may have a substituent group, an alkenyl group with 2 to 20 carbon atoms which may have a substituent group, or an aryl group with 6 to 20 carbon atoms which may have a substituent group. R$^1$ and R$^2$ each represent an alkyl group with 1 to 20 carbon atoms which may have a substituent group or an alkenyl group with 2 to 20 carbon atoms which may have a substituent group (R$^1$ and R$^2$ may be combined to form a heterocyclic structure, which may further include a nitrogen atom, an oxygen atom, or a sulfur atom and may be substituted).

Y$^1$ represents —NR'— or —O— and is preferably —NR'—. R' has the same meaning as R' described above and the preferable ranges thereof are also the same.

Y$^2$ represents an alkylene group with 1 to 20 carbon atoms which may have a substituent group, an alkenylene group with 2 to 20 carbon atoms which may have a substituent group, or an arylene group with 6 to 20 carbon atoms which may have a substituent group and the groups may be bonded with each other by a divalent linking group selected from —NR'—, —O—, —SO$_2$—, and —CO— (R' has the same meaning as R' described above and the preferable ranges are thereof also the same).

The alkylene group with 1 to 20 carbon atoms is preferably an alkylene group with 1 to 10 carbon atoms, more preferably an alkylene group with 1 to 6 carbon atoms, and even more preferably an alkylene group with 1 to 3 carbon atoms. Specific examples thereof include a methylene group, an ethylene group, a propylene group, a butylene group, a pentylene group, a hexylene group, and the like. The alkylene group may have a substituent group and examples of the substituent group include the groups described in the substituent group section.

The alkenylene group with 2 to 20 carbon atoms is preferably an alkenylene group with 1 to 10 carbon atoms, more preferably an alkenylene group with 1 to 6 carbon atoms, and even more preferably an alkenylene group with 1 to 3 carbon atoms. Specific examples thereof include an ethenylene group, a propenylene group, a butenylene group, a pentenylene group, a hexenylene group, and the like. The alkenylene group may have a substituent group and examples of the substituent group include the groups described in the substituent group section.

The arylene group with 6 to 20 carbon atoms is preferably an arylene group with 6 to 20 carbon atoms and more preferably an arylene group with 6 to 10 carbon atoms. Specific examples thereof include a phenylene group, a naphthylene group, an anthracenylene, and the like. The arylene group may have a substituent group and examples of the substituent group include the groups described in the substituent group section.

R$^1$ and R$^2$ each represent an alkyl group with 1 to 20 carbon atoms which may have a substituent group or an alkenyl group with 2 to 20 carbon atoms which may have a substituent group (R$^1$ and R$^2$ may be combined with each other to form a heterocyclic structure, which may further include a nitrogen atom, an oxygen atom, or a sulfur atom and may be substituted).

The alkyl group with 1 to 20 carbon atoms is preferably an alkyl group with 1 to 10 carbon atoms and more preferably an alkyl group with 1 to 6 carbon atoms. Specific examples thereof include a methyl group, an ethyl group, a propyl group, an isopropyl group, a butyl group, an isobutyl group, a tert-butyl group, a neopentyl group, an n-hexyl group, an n-octyl group, and the like.

The alkenyl group with 2 to 20 carbon atoms is preferably an alkenyl group with 2 to 10 carbon atoms and more preferably an alkenyl group with 2 to 6 carbon atoms. Specific examples thereof include an ethenyl group, a propenyl group, a butenyl group, a pentenyl group, a hexenyl group, and the like.

These groups may have a substituent group and examples of the substituent group include the groups described in the substituent group section. $R^1$ and $R^2$ preferably represent the same group.

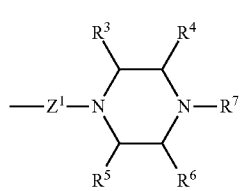

General Formula (II-2)

(In General Formula (II-2), $Z^1$ represents a single bond which connects a triazine ring and a nitrogen atom, —NR'—, —NR'-G-CO—, NR'-G-CONR"—, —NR'-G-SO$_2$—, —NR'-G-SO$_2$NR"—, —O-G-CO—, —O-G-CONR'—, —O-G-SO$_2$—, or —O-G-SO$_2$NR'—, G represents an alkylene group with 1 to 20 carbon atoms which may have a substituent group, an alkenylene group with 2 to 20 carbon atoms which may have a substituent group, or an arylene group with 6 to 20 carbon atoms which may have a substituent group, and R' and R" each represent a hydrogen atom, an alkyl group with 1 to 20 carbon atoms which may have a substituent group, an alkenyl group with 2 to 20 carbon atoms which may have a substituent group, or an aryl group with 6 to 20 carbon atoms which may have a substituent group. $R^3$, $R^4$, $R^5$, and $R^6$ each represent a hydrogen atom, an alkyl group with 1 to 20 carbon atoms which may have a substituent group, an alkenyl group with 2 to 20 carbon atoms which may have a substituent group, or an aryl group with 6 to 20 carbon atoms which may have a substituent group and $R^7$ represents an alkyl group with 1 to 20 carbon atoms which may have a substituent group or an alkenyl group with 2 to 20 carbon atoms which may have a substituent group.)

$Z^1$ represents a single bond which connects a triazine ring and a nitrogen atom, —NR'—, —NR'-G-CO—, NR'-G-CONR"—, —NR'-G-SO$_2$—, —NR'-G-SO$_2$NR"—, —O-G-CO—, —O-G-CONR'—, —O-G-SO$_2$—, or —O-G-SO$_2$NR'— and is preferably a single bond.

R' and R" each represent a hydrogen atom, an alkyl group with 1 to 20 carbon atoms which may have a substituent group, an alkenyl group with 2 to 20 carbon atoms which may have a substituent group, or an aryl group with 6 to 20 carbon atoms which may have a substituent group. R' and R" have the same meaning as R' in General Formula (II-1) and the preferable ranges thereof are also the same.

G represents an alkylene group with 1 to 20 carbon atoms which may have a substituent group, an alkenylene group with 2 to 20 carbon atoms which may have a substituent group, or an arylene group with 6 to 20 carbon atoms which may have a substituent group. G has the same meaning as $Y^2$ in General Formula (II-1) and the preferable ranges are also the same.

$R^3$, $R^4$, $R^5$, and $R^6$ each represent a hydrogen atom, an alkyl group with 1 to 20 carbon atoms which may have a substituent group, an alkenyl group with 2 to 20 carbon atoms which may have a substituent group, or an aryl group with 6 to 20 carbon atoms which may have a substituent group. $R^3$, $R^4$, $R^5$, and $R^6$ have the same meaning as R' in General Formula (II-1) and the preferable ranges thereof are also the same.

$R^7$ represents an alkyl group with 1 to 20 carbon atoms which may have a substituent group or an alkenyl group with 2 to 20 carbon atoms which may have a substituent group. $R^7$ has the same meaning as $R^1$ in General Formula (II-1) and the preferable ranges thereof are also the same.

t in General Formula (II) represents an integer of 1 to 3, preferably 1 or 2 and more preferably 1.

Specific examples of the pigment derivative which is represented by General Formula (II) which is used in the present invention will be illustrated below; however, the present invention is not limited thereto.

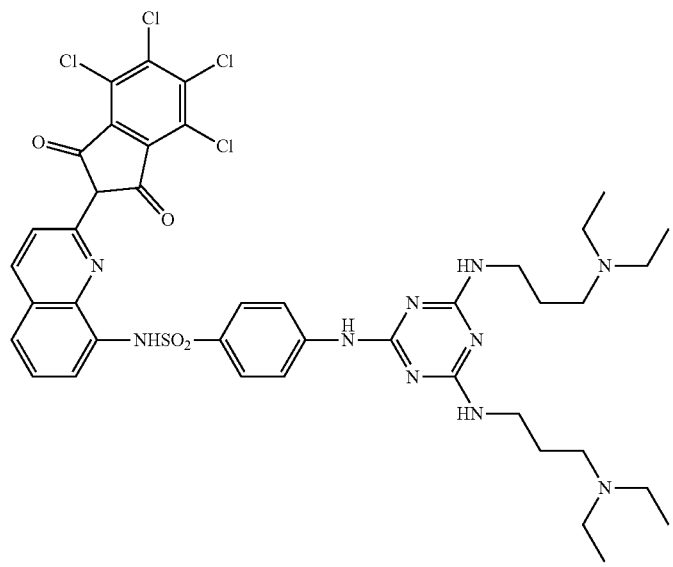

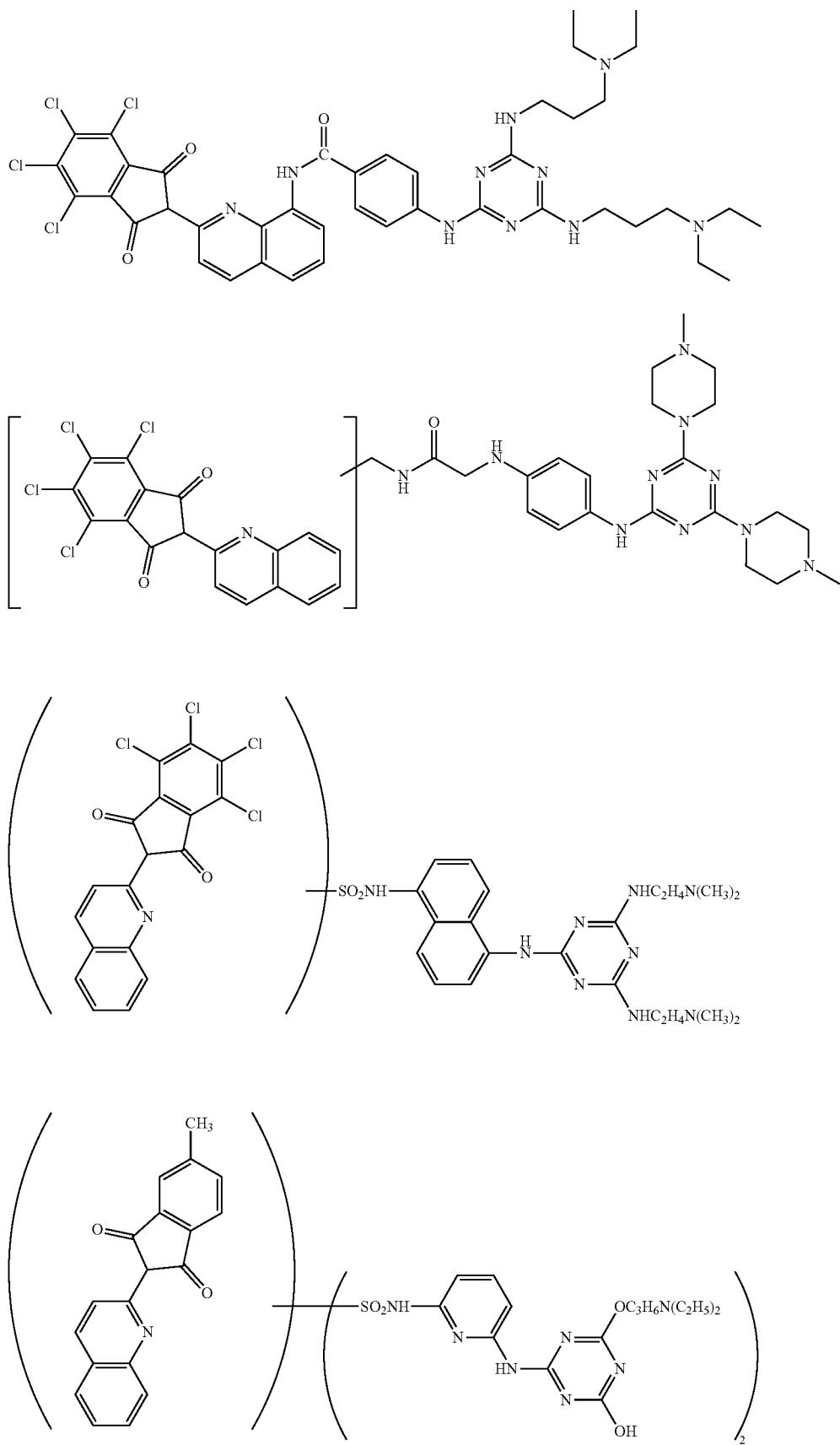

-continued
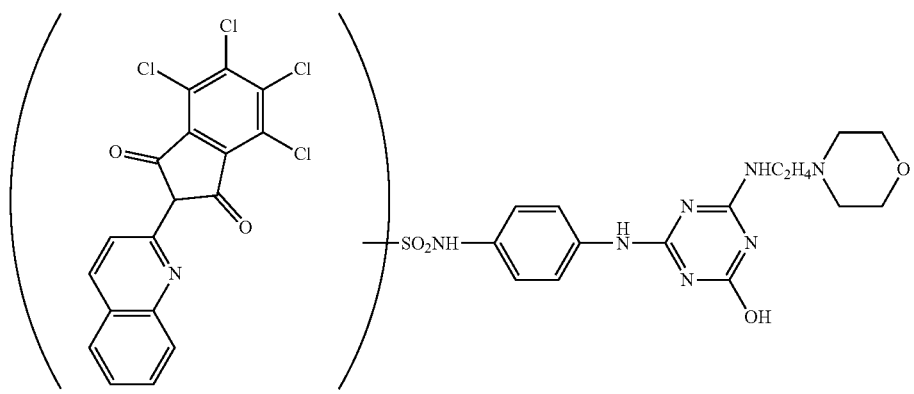
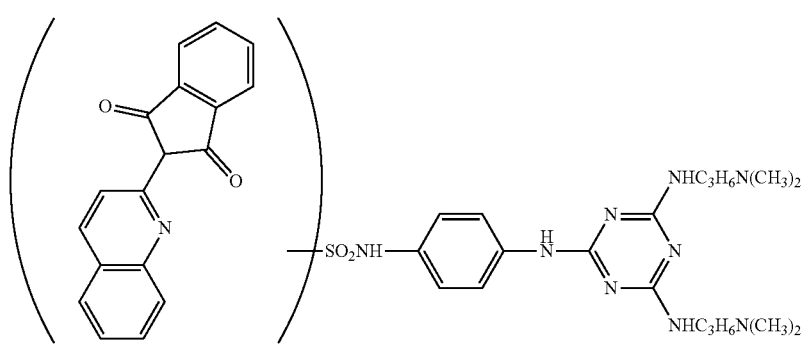
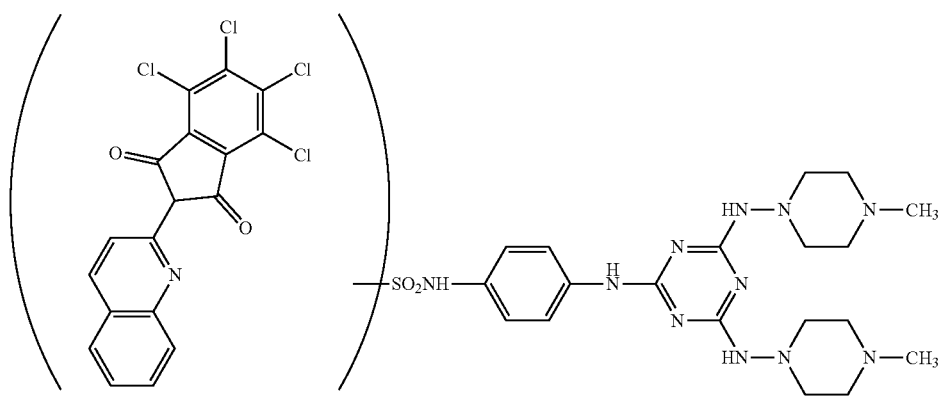
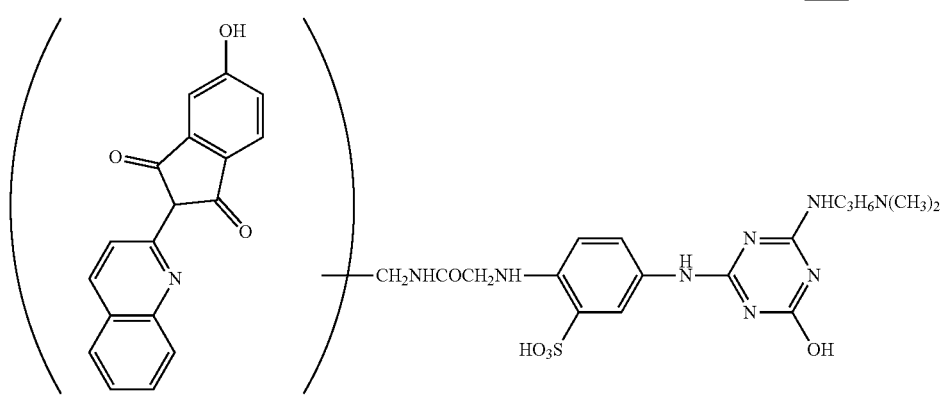

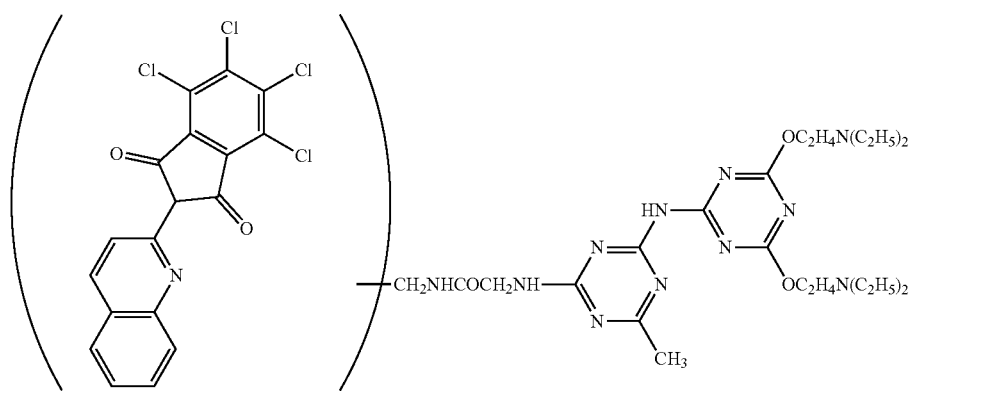
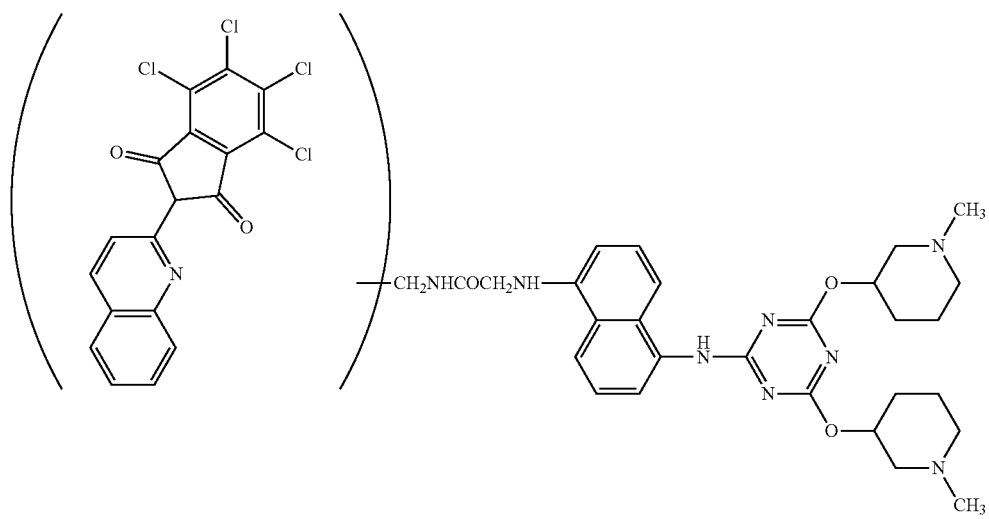
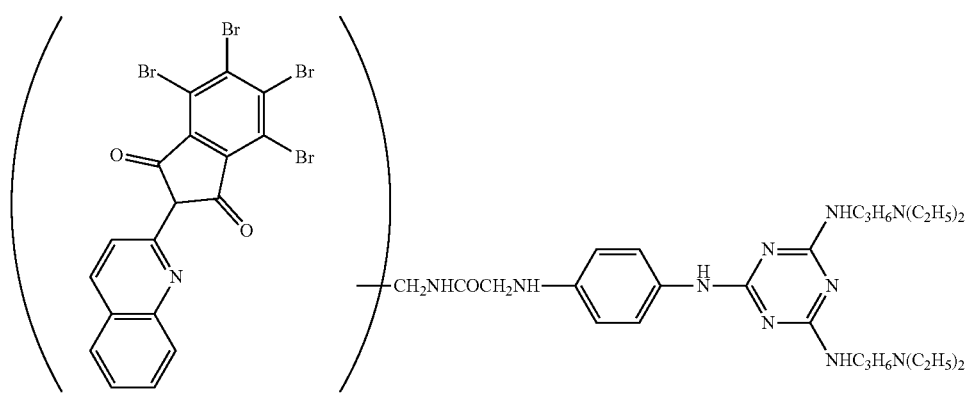
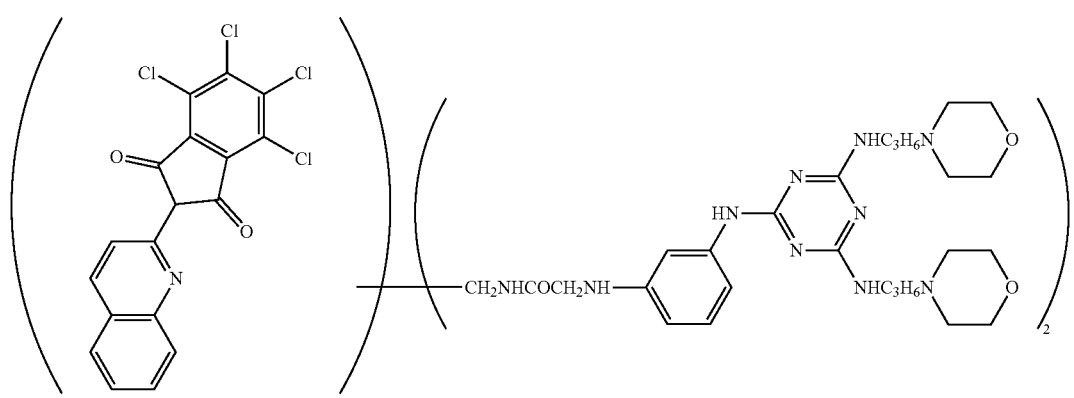

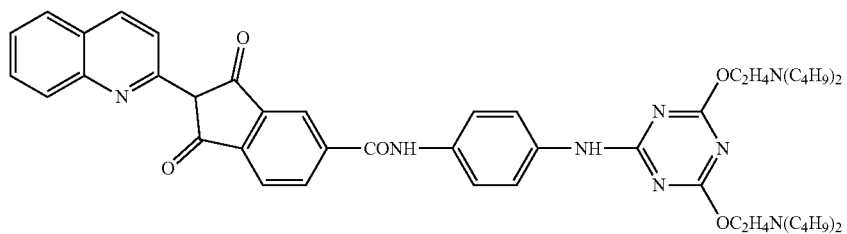
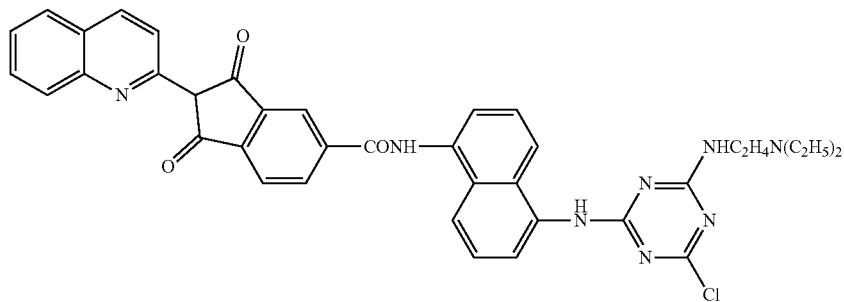
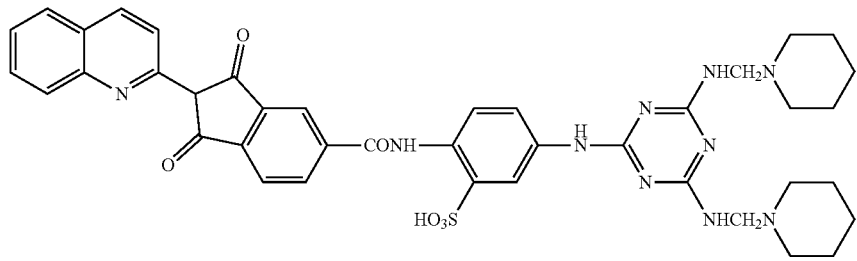
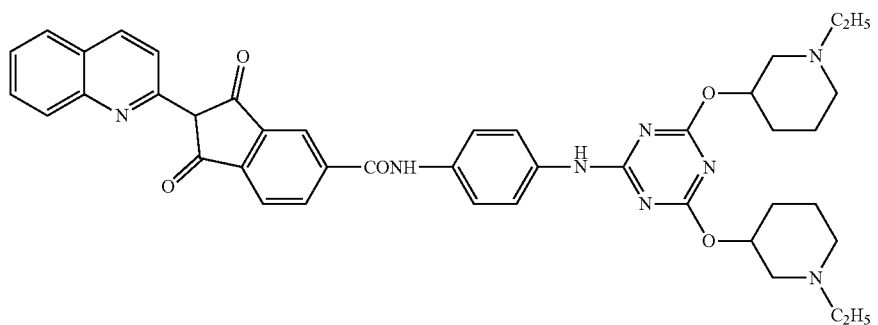
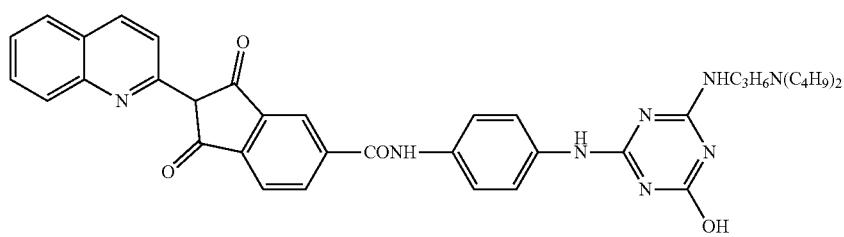

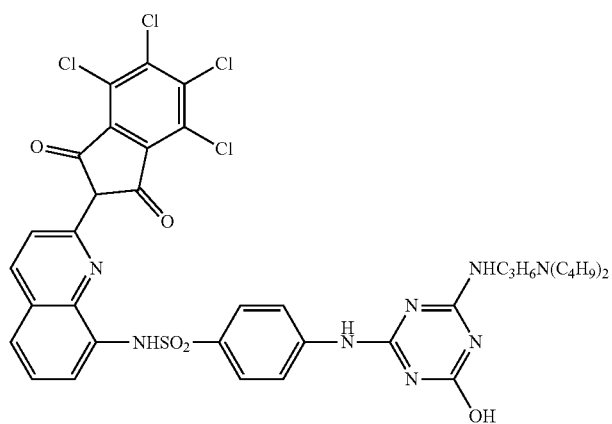
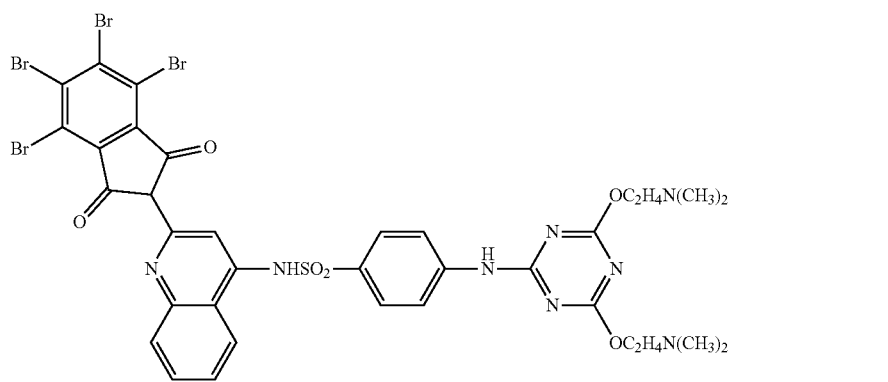
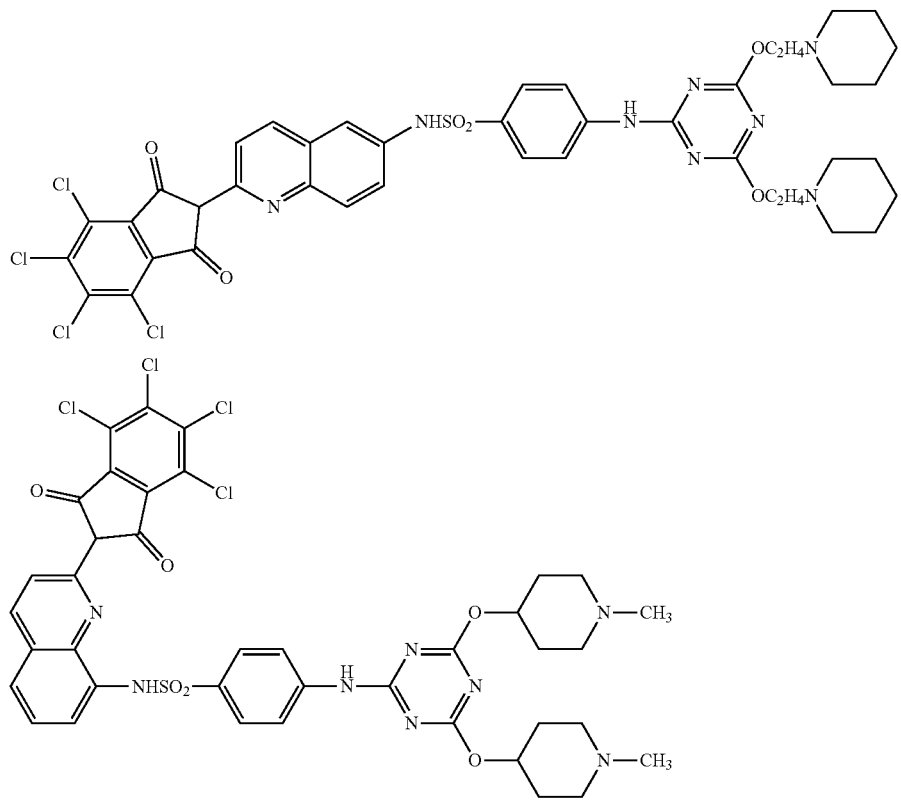

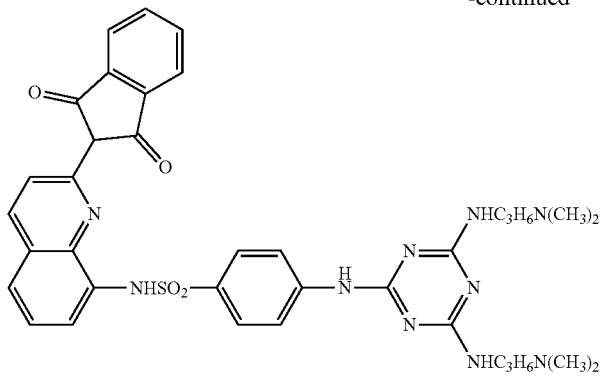

—Pigment Derivative which is Represented by General Formula (III)—

A-N=N—X—Y    General Formula (III)

In General Formula (III), A represents a component which may form an azo pigment with X—Y It is possible to arbitrarily select A as long as A is a compound which may form an azo pigment by coupling with a diazonium compound. Examples of A will be illustrated below; however, the present invention is not limited to the specific examples.

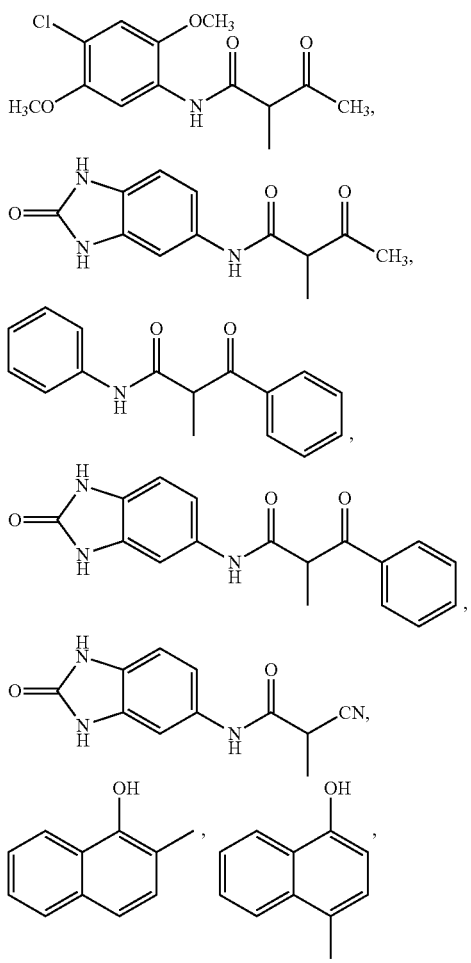

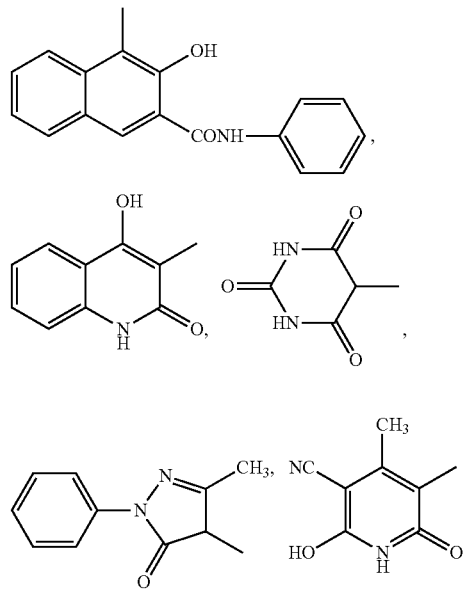

In General Formula (III), X represents a single bond (which has the meaning that Y is directly bonded with —N=N—) or a group selected from the divalent linking groups in the group A below.

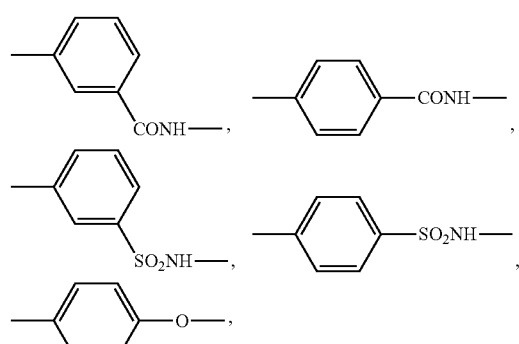

In General Formula (III), Y represents a group which is represented by General Formula (III-2) below.

(III-2)

In General Formula (III-2), Z represents an alkylene group with 1 to 5 carbon atoms and preferably represents an alkylene group with 2 or 3 carbon atoms. $R^2$ represents an alkyl group with 1 to 4 carbon atoms or a 5 or 6-membered saturated hetero ring which includes a nitrogen atom. In a case where $R^2$ represents a 5 or 6-membered saturated hetero ring which includes a nitrogen atom, a hetero ring which is represented by the structure formula below is preferable.

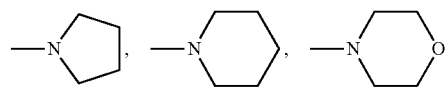

Z and $-NR^2$ in General Formula (III-2) may each have a lower alkyl group and an alkoxy group as a substituent group. In General Formula (III-2), a represents 1 or 2 and preferably represents 2.

Specific Examples (specific examples 1 to 22) of a compound which is represented by General Formula (III) will be given below; however, the present invention is not limited to the specific examples.

1.

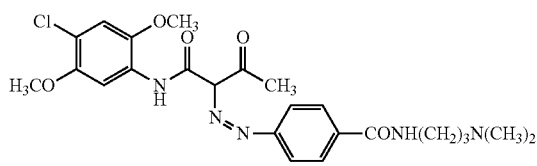

2.

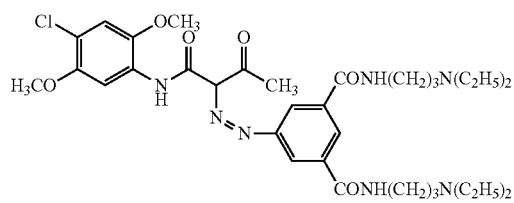

3.

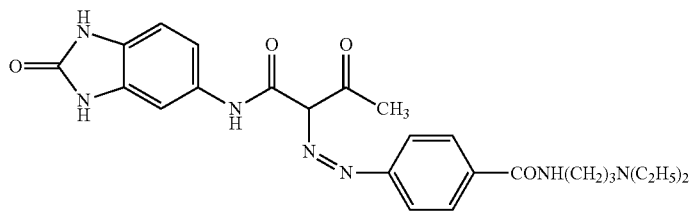

4.

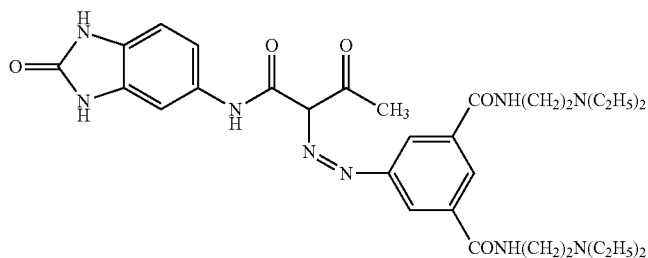

5.

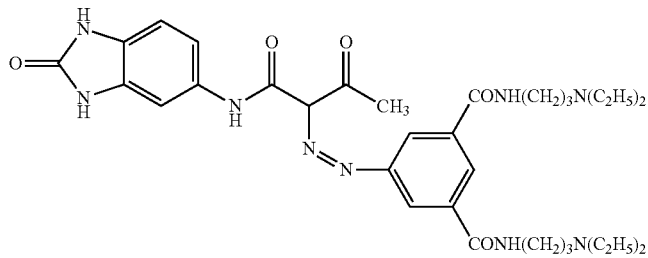

6. 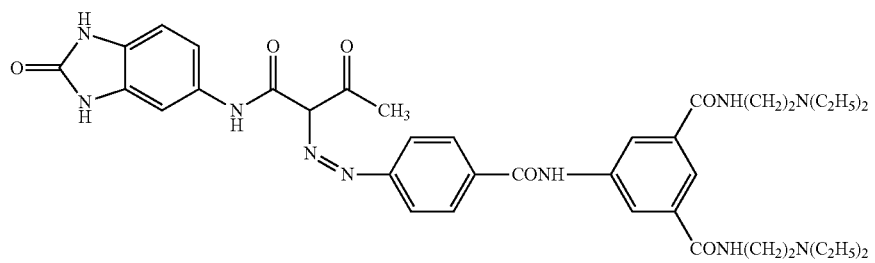
7. 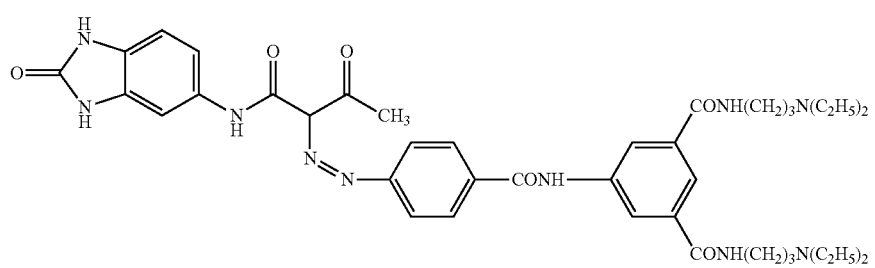
8. 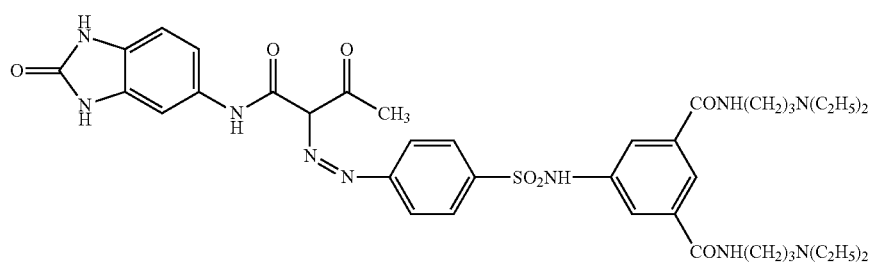
9. 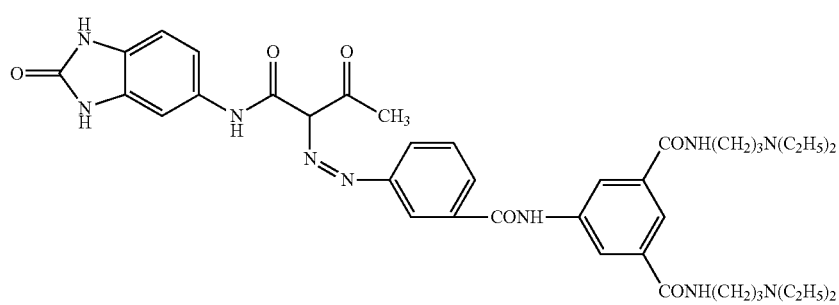
10. 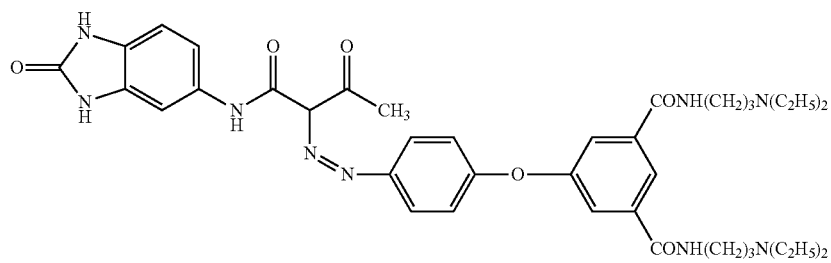

-continued
11.
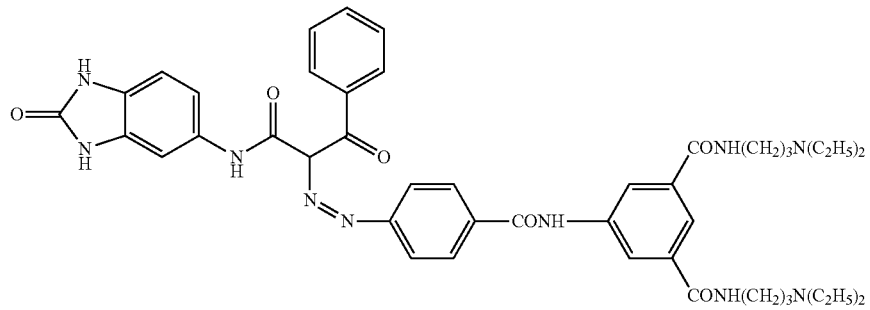
12.
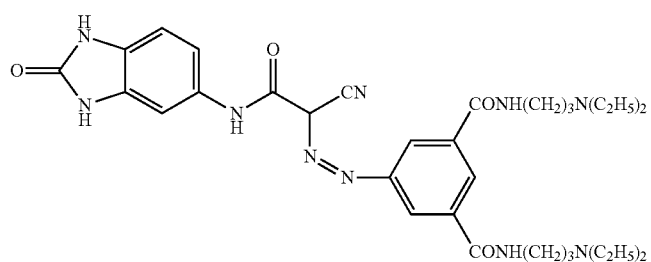
13.
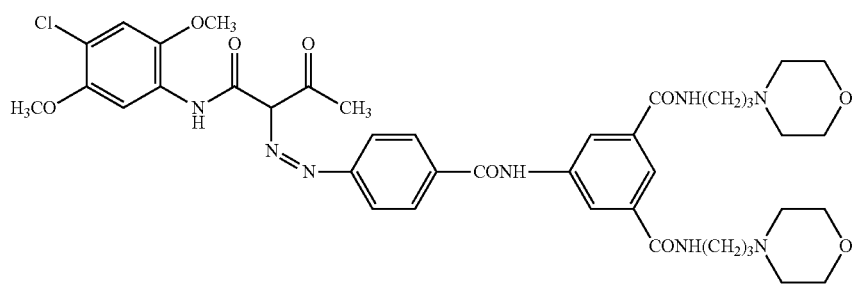
14.
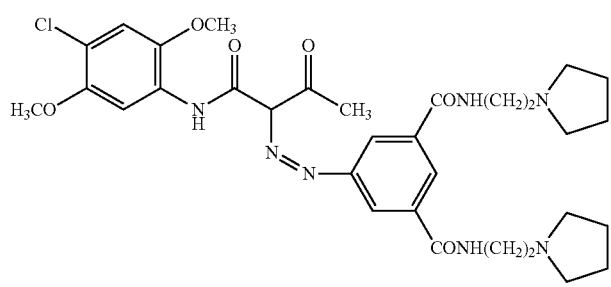
15.
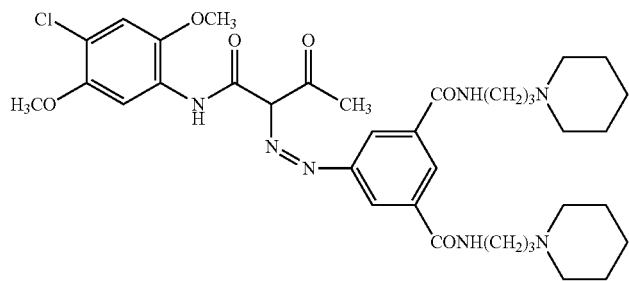

16.
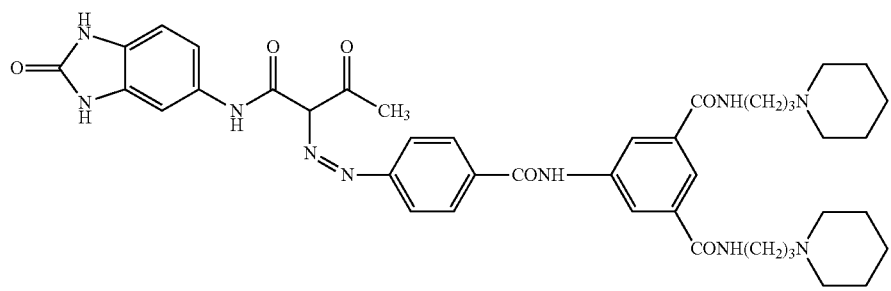
17.
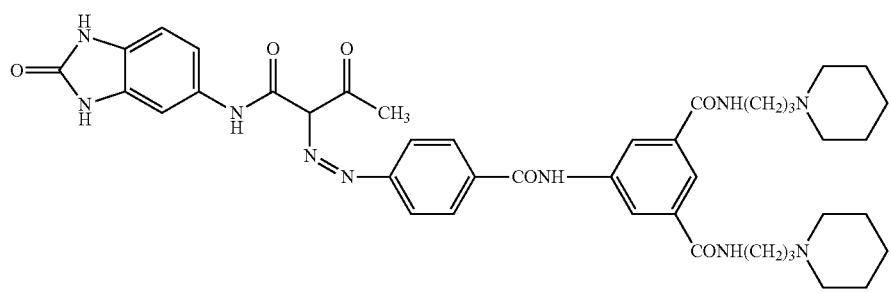
18.
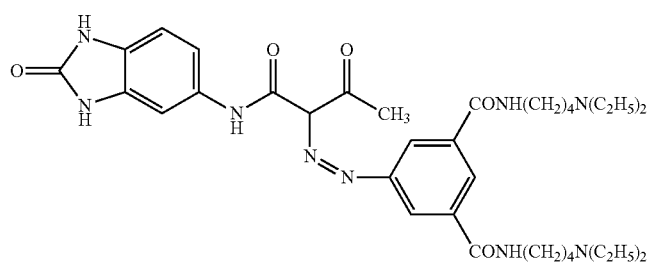
19.
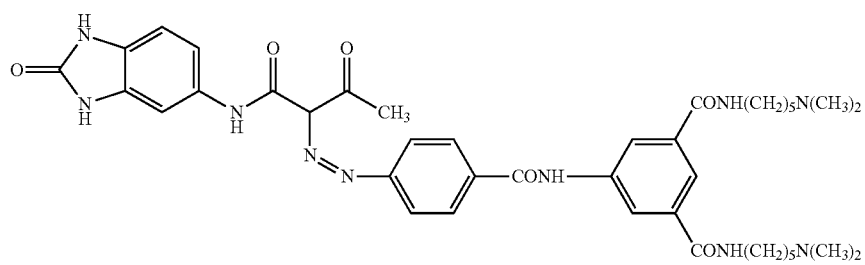
20.
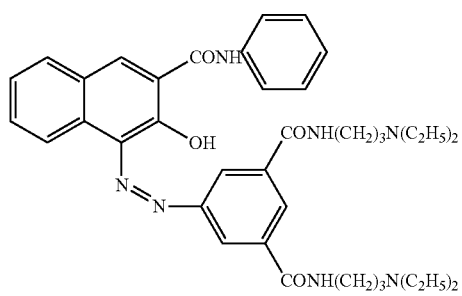
21.
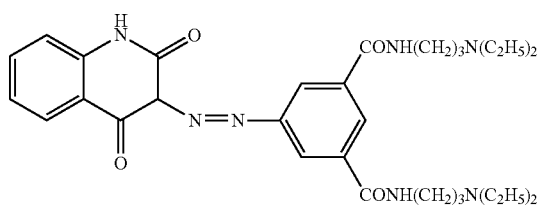

22.

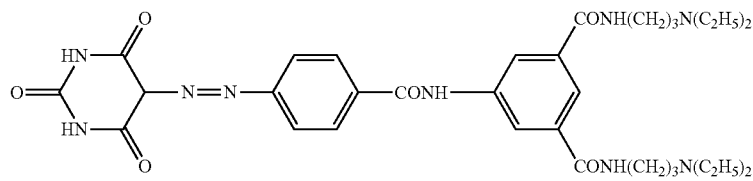

—Pigment Derivative which is Represented by General Formula (IV)—

General Formula (IV)

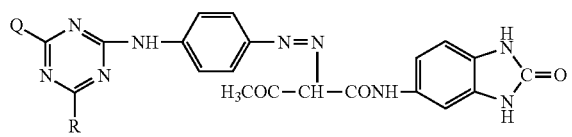

(In General Formula (IV), Q represents $NH(CH_2)nNR^1R^2$ or a hydroxyl group and R represents $NH(CH_2)nNR^1R^2$, $R^1$ and $R^2$ represent an alkyl group with 1 to 4 carbon atoms or a 5-membered ring structure or a 6-membered ring structure which may include a new nitrogen atom or oxygen atom by $R^1$ and $R^2$ being combined with each other, and n represents an integer of 1 to 4.)

The content of the pigment derivatives in the present invention is preferably 0.5 parts by mass or more to 50 parts by mass or less with respect to the entirety of the pigment as 100 parts by mass and more preferably 1 part by mass or more to 25 parts by mass or less.

Only one type of the pigment derivative may be included in the composition of the present invention or two or more types may be included. In a case of including two or more types, the total amount is preferably within the ranges described above.

<<Other Components>>
<<Organic Solvent>>

The composition of the present invention may contain an organic solvent.

The organic solvent is not basically particularly limited as long as the solubility of each component or the coating property of the photosensitive coloring composition is satisfied; however, it is preferably selected while considering the solubility, the coating property, and the safety of an ultraviolet ray absorbing agent, an alkali-soluble resin, a dispersing agent, and the like in particular. The organic solvent may be one type or two or more types may be included.

Examples of the organic solvent favorably include, as esters, ethyl acetate, acetate-n-butyl, isobutyl acetate, amyl formate, isoamyl acetate, butyl propionate, isopropyl butyrate, ethyl butyrate, butyl butyrate, methyl lactate, ethyl lactate, alkyl oxyacetate (examples: methyl oxyacetate, ethyl oxyacetate, and butyl oxyacetate (for example, methyl methoxyacetate, ethyl methoxyacetate, butyl methoxyacetate, methyl ethoxyacetate, ethyl ethoxyacetate, and the like)), 3-oxypropionate alkyl esters (examples: methyl 3-oxypropionate, ethyl 3-oxypropionic, and the like (for example, methyl 3-methoxypropionate, ethyl 3-methoxypropionate, methyl 3-ethoxypropionate, ethyl 3-ethoxypropionate, and the like)), 2-oxypropionate alkyl esters (examples: methyl 2-oxypropionate, ethyl 2-oxypropionate, propyl 2-oxypropionate, and the like (for example, methyl 2-methoxypropionate, ethyl 2-methoxypropionate, propyl 2-methoxypropionate, methyl 2-ethoxypropionate, and ethyl 2-ethoxypropionate)), 2-oxy-2-methyl methyl propionate and 2-oxy-2-methyl ethyl propionate (for example, 2-methoxy-2-methyl methyl propionate, 2-ethoxy-2-methyl ethyl propionate, and the like), methyl pyruvate, ethyl pyruvate, propyl pyruvate, methyl acetoacetate, ethyl acetoacetate, 2-oxobutanic acid methyl, 2-oxobutanate ethyl, and the like, and, as ethers, diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate (PGMEA), propylene glycol monoethyl ether acetate, propylene glycol monopropyl ether acetate, and the like, and, as ketones, methylethyl ketone, cyclohexanone, 2-heptanone, 3-heptanone, and the like, and, as aromatic hydrocarbons, toluene, xylene, and the like.

It is also preferable to mix two or more types of the organic solvents. In this case, a mixed solvent which is configured by two or more types selected from the above-described methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether, and propylene glycol methyl ether acetate is particularly preferable.

The content of the organic solvent in the composition is preferably an amount such that the concentration of the total solid content of the composition is 5 mass % to 80 mass % from the point of view of the coating property, 5 mass % to 60 mass % is more preferable, and 8 mass % to 50 mass % is particularly preferable.

<<Cross-Linking Agent>>

The cross-linking agent is not particularly limited as long as it is possible to cure a film by a cross-linking reaction and examples thereof include (a) an epoxy resin, (b) a melamine compound, a guanamine compound, a glycoluril compound, or an urea compound which is substituted with at least one substituent group selected from a methylol group, an alkoxy methyl group, and an acyloxy methyl group, and (c) a phenol compound, a naphthol compound, or a hydroxy anthracene compound which is substituted with at least one substituent group selected from a methylol group, an alkoxy methyl group, and an acyloxy methyl group. Among these, a polyfunctional epoxy resin is preferable.

For the details of specific examples of the cross-linking agent and the like, it is possible to refer to the description in paragraphs "0134" to "0147" in JP2004-295116A.

In a case of containing a cross-linking agent in the composition of the present invention, the blending amount of the cross-linking agent is not particularly set; however, 2 mass % to 30 mass % of the total solid content of the composition is preferable, and 3 mass % to 20 mass % is more preferable.

The composition of the present invention may include only one type of the cross-linking agent or may include two or more types. In a case of including two or more types, the total amount thereof is preferably in the ranges described above.

<<<Polymerization Inhibitor>>>

Examples of the polymerization inhibitor which may be used in the present invention include hydroquinone, p-methoxy phenol, di-tert-butyl-p-cresol, pyrogallol, tert-butylcatechol, benzoquinone, 4,4'-thiobis(3-methyl-6-tert-butyl phenol), 2,2'-methylene bis(4-methyl-6-tert-butyl phenol), N-nitrosophenylhydroxyamine primary cerium salt, and the like.

In a case of containing the polymerization inhibitor in the composition of the present invention, the added amount of the polymerization inhibitor is preferably approximately 0.01 mass % to approximately 5 mass % with respect to the mass of the entirety of the composition.

The composition of the present invention may include only one type of the polymerization inhibitor or may include two or more types. In a case of including two or more types, the total amount thereof is preferably in the ranges described above.

<<<Surfactant>>>

From the view point of improving the coating property more, various types of surfactants may be added to the composition of the present invention.

As a surfactant, it is possible to use various types of surfactants such as a fluorine-based surfactant, a non-ionic surfactant, a cation-based surfactant, an anion-based surfactant, and a silicone-based surfactant.

In particular, since the liquid characteristics (particularly the fluidity) of the composition of the present invention when prepared as a coating liquid are further improved by a fluorine-based surfactant being contained, it is possible to further improve the uniformity of the coating thickness or liquid saving property.

That is, in a case of forming a film using a coating liquid to which the composition which contains a fluorine-based surfactant is applied, the wettability on the target coating surface is improved by decreasing the surface tension between the target coating surface and the coating liquid and the wettability on the target coating surface is improved. Due to this, even in a case of forming a thin film of approximately a few μm with a small amount of liquid, the above is effective in terms of it being possible to more favorably form a film which has a uniform thickness with little unevenness.

The fluorine-containing ratio in the fluorine-based surfactant is favorably 3 mass % to 40 mass %, more preferably 5 mass % to 30 mass %, and particularly preferably 7 mass % to 25 mass %. The fluorine-based surfactant of which the fluorine-containing ratio is within the range is effective in terms of the uniformity of the thickness of the coating film and the liquid saving property, and the solubility in the curable composition is also favorable.

Examples of the fluorine-based surfactant include Megaface F171, Megaface F172, Megaface F173, Megaface F176, Megaface F177, Megaface F141, Megaface F142, Megaface F143, Megaface F144, Megaface R30, Megaface F437, Megaface F475, Megaface F479, Megaface F482, Megaface F554, Megaface F780, and Megaface F781 (the above are produced by DIC Corporation.), Fluorad FC430, Fluorad FC431, and Fluorad FC171 (the above are produced by Sumitomo 3M Inc.), Surflon S-382, Surflon S-101, Surflon S-103, Surflon SC-104, Surflon SC-105, Surflon SC 1068, Surflon SC-381, Surflon SC-383, Surflon S393, and Surflon KH-40 (the above are produced by Asahi Glass Co., Ltd.), and the like.

Specific examples of the non-ionic surfactant include glycerol, trimethylol propane, trimethylol ethane and ethoxylates and propoxylates thereof (for example, glycerol propoxylate, glycerin ethoxylate, and the like), polyoxyethylene lauryl ether, polyoxyethylene stearyl ether, polyoxyethylene oleyl ether, polyoxyethylene octyl phenyl ether, polyoxyethylene nonylphenyl ether, polyethylene glycol dilaurate, polyethylene glycol distearate, sorbitan-fatty acid ester (Pluronic L10, L31, L61, L62, 10R5, 17R2, and 25R2, Tetronic 304, 701, 704, 901, 904, and 150R1 produced by BASF Corporation), Solsperse 20000 (Japan Lubrizol Corporation), and the like.

Specific examples of the cation-based surfactant include a phthalocyanine derivative (product name: EFKA-745, produced by Morishita Sangyo Co., Ltd.), an organosiloxane polymer KP341 (produced by Shin-Etsu Chemical Co., Ltd.), a (meth)acrylic acid-based (co)polymer Polyflow No. 75, No. 90, and No. 95 (produced by Kyoeisha Chemical Co., Ltd.), W001 (produced by Yusho Co., Ltd.), and the like.

Specific examples of the anion-based surfactant include W004, W005, and W017 (produced by Yusho Co., Ltd.), and the like.

Examples of the silicone-based surfactant include "Toray Silicone DC3PA", "Toray Silicone SH7PA", "Toray Silicone DC11PA", "Toray Silicone SH21PA", "Toray Silicone SH28PA", "Toray Silicone SH29PA", "Toray Silicone SH30PA", and "Toray Silicone SH8400" produced by Toray Dow Corning Co., Ltd., "TSF-4440", "TSF-4300", "TSF-4445", "TSF-4460", and "TSF-4452" produced by Momentive Performance Materials Inc., "KP341", "KF6001", and "KF6002" produced by Shin-Etsu Silicone Co., Ltd., "BYK307", "BYK323", and "BYK330" produced by BYK KK, and the like.

Only one type of the surfactant may be used or two or more types may be combined.

In a case where the surfactant is contained in the composition of the present invention, the added amount of the surfactant is preferably 0.001 mass % to 2.0 mass % with respect to the entirety of the mass of the composition and more preferably 0.005 mass % to 1.0 mass %.

The composition of the present invention may include only one type of the surfactant or may include two or more types. In a case of including two or more types, the total amount thereof is preferably in the ranges described above.

It is possible to blend various types of additives other than the components described above such as a filler, an acceleration agent, an antioxidant, an ultraviolet ray absorbing agent, an aggregation agent, and the like in the composition of the present invention as necessary. Examples of the additives include the additives according to paragraphs "0155" and "0156" in JP2004-295116A.

The present invention is a color filter forming kit which includes a photosensitive red composition which contains a red coloring material, a photosensitive green composition which contains a green coloring material, a photosensitive blue composition which contains a blue coloring material, in which the photosensitive red composition, the photosensitive green composition, and the photosensitive blue composition each further include a polymerization initiator (a) of which an absorption coefficient of 365 nm in methanol is $1.0 \times 10^3$ mL/gcm or more, a polymerization initiator (b) of which an absorption coefficient of 365 nm in methanol is $1.0 \times 10^2$ mL/gcm or less and an absorption coefficient of 254 nm in methanol is $1.0 \times 10^3$ mL/gcm or more, a compound (c) which has an unsaturated double bond, and an alkali-soluble resin (d), the content of the polymerization initiator (a) is 1.5 mass % to 10 mass % in the total solid content of each of the photosensitive red composition, the photosensitive green composition, and the photosensitive blue composition, and the content of the polymerization initiator (b) is 1.5 mass % to 7.5 mass %.

<Color Filter and Method for Producing Color Filter>

Next, detailed description will be given of a color filter in the present invention through the manufacturing method thereof.

The method for producing the color filter of the present invention has a step of forming a photosensitive coloring composition layer on a substrate using a photosensitive coloring composition of the present invention, a step of exposing the photosensitive coloring composition layer using light with a wavelength of more than 350 nm to 380 nm or less, a step of carrying out alkali development on the photosensitive coloring composition layer, and a step of exposing the photosensitive coloring composition layer using light with a wavelength of 254 nm to 350 nm in this order. Furthermore, as necessary, a step (a pre-baking step) of baking the photosensitive coloring composition layer and a step of baking the developed colored pattern (a post-baking step) may be provided.

It is possible to favorably obtain the color filter of the present invention by the manufacturing method described above.

<Step (i) of Forming a Photosensitive Coloring Composition Layer on a Substrate Using a Photosensitive Coloring Composition>

In the step of forming a photosensitive coloring composition layer on a substrate using a photosensitive coloring composition, a photosensitive coloring composition layer is formed by adding the composition of the present invention to a substrate.

It is possible to use, for example, a substrate for solid-state imaging elements which are provided with imaging elements (light receiving elements) such as charge coupled devices (CCD) and complementary metal-oxide semiconductors (CMOS) on a substrate (for example, a silicon substrate) as a substrate which may be used in the present step.

The colored pattern in the present invention may be formed on the imaging element forming surface side (front surface) of the substrate for solid-state imaging elements or may be formed on the imaging element non-forming surface side (rear surface).

A light shielding film may be provided between colored patterns in the solid-state imaging element or on the rear surface of the substrate for solid-state imaging elements.

In addition, an undercoating layer may be provided on the substrate as necessary in order to improve adhesion with an upper layer, prevent the diffusion of substances, or planarize the substrate surface.

As a method for forming the photosensitive coloring composition layer, coating or printing is preferable, and various types of methods such as slit coating, an ink jet method, a rotation coating, flow casting coating, roll coating, and screen printing method are preferable.

<Step of Heating the Photosensitive Coloring Composition Layer which is Formed on the Substrate>

The photosensitive coloring composition layer which is formed on the substrate is preferably heated (pre-baked). The heating is preferably performed at 120° C. or less, more preferably 50° C. to 120° C., even more preferably 80° C. to 110° C., and particularly preferably 90° C. to 105° C. By performing the heating at 120° C. or less, it is possible to more effectively maintain the characteristics in a case of making the light emitting sources of a liquid crystal display device organic EL or in a case of making a photoelectric conversion film of an image sensor organic material.

In addition, the heating time is preferably 10 seconds to 300 seconds, more preferably 40 seconds to 250 seconds, and even more preferably 80 seconds to 220 seconds. It is possible to perform the heating using a hot plate, an oven, and the like.

<Step (ii) of Exposing the Photosensitive Coloring Composition Layer Using Light with a Wavelength of More than 350 nm to 380 nm or Less>

In the present step, pattern exposure is carried out on the photosensitive coloring composition layer via a mask which has a predetermined mask pattern using an exposure apparatus such as a stepper.

The radiation (light) which is able to be used during the exposure is light with a wavelength of more than 350 nm to 380 nm or less, preferably light with a wavelength of 355 nm to 370 nm, and particularly preferably i ray. The irradiation amount (exposure amount) is preferably 30 mJ/cm² to 1500 mJ/cm² and more preferably 50 mJ/cm² to 1000 mJ/cm².

The film thickness of the photosensitive coloring composition layer after the exposure is preferably 1.0 µm or less, more preferably 0.1 µm to 0.9 µm, and even more preferably 0.2 µm to 0.8 µm.

The reaction ratio of the compound (c) which has an unsaturated double bond described above in the photosensitive coloring composition after the exposure is preferably 30% to 60%. By setting the reaction ratio, it is possible to set the compound (c) which has an unsaturated double bond to a state of being appropriately cured. Here, the reaction ratio of the compound (c) which has an unsaturated double bond refers to the proportion of the reacted unsaturated double bonds in the entirety of the unsaturated double bonds of the compound (c) which has an unsaturated double bond.

<(iii) Step of Carrying Out Alkali Development to the Photosensitive Coloring Composition Layer>

In the present step, by carrying out alkali development to the photosensitive coloring composition layer after exposure, the photosensitive coloring composition layer of a non-light irradiated portion in step (ii) of exposing elutes into an alkali aqueous solution and only a photocured portion remains.

As a developer, an organic alkali developer which does not cause damage to the imaging elements, circuits, or the like of the base is desirable. The developing temperature is generally 20° C. to 30° C. and the developing time is preferably 60 seconds to 300 seconds and more preferably 120 seconds to 200 seconds.

Examples of the alkali agent which is used for the developer include organic alkali compounds such as ammonia water, ethylamine, diethylamine, dimethyl ethanol amine, tetramethyl ammonium hydroxide, tetraethyl ammonium hydroxide, tetrapropyl ammonium hydroxide, tetrabutyl ammonium hydroxide, benzyltrimethyl ammonium hydroxide, choline, pyrrole, piperidine, and 1,8-diazabicyclo-[5,4,0]-7-undecene and an alkali aqueous solution where the alkali agents are diluted using pure water such that the concentration is 0.001% to 10 mass %, preferably 0.01% to 1 mass % is preferably used as a developer.

Here, an inorganic alkali may be used for the developer and the organic alkali is preferably, for example, sodium hydroxide, potassium hydroxide, sodium carbonate, sodium bicarbonate, sodium silicate, sodium metasilicate, and the like.

Here, in a case of using a developer formed of the alkali aqueous solution, cleaning (rinsing) is generally carried out using pure water after development.

<Step (iv) of Exposing the Photosensitive Coloring Composition Layer Using Light with a Wavelength of 254 nm to 350 nm>

In the present step, the photosensitive coloring composition layer after development is exposed using light with a wavelength of 254 nm to 350 nm. For example, exposure is carried out using an ultraviolet ray photoresist exposure apparatus. From the ultraviolet ray photoresist exposure apparatus, for example, light other than this (for example, i ray) may be irradiated along with light with a wavelength of 254 nm to 350 nm.

In the present invention, by exposing the photosensitive coloring composition layer in the two phases, before the step of development and after the step of development, it is possible to appropriately cure the photosensitive coloring composition by the first exposure and it is possible to substantially cure the entirety of the photosensitive coloring composition by the next exposure. As a result, even under low temperature conditions of approximately 210° C. without post-baking, it is possible to improve the curing property of the photosensitive coloring composition and it is possible to make the solvent resistance of the color filter favorable. In addition, it is possible to suppress residual color mixing.

The radiation (light) which is able to be used during exposure is ultraviolet rays with a wavelength of 254 nm to 300 nm and preferably ultraviolet rays with a wavelength of 254 nm.

The difference between the wavelength of the light which is used in the step of exposure before the development described above and the wavelength of the light which is used in the step of exposure after the step of development is preferably 200 nm or less and more preferably 100 nm to 150 nm or less.

The irradiation amount (exposure amount) is preferably 30 mJ/cm$^2$ to 4000 mJ/cm$^2$ and more preferably 50 mJ/cm$^2$ to 3500 mJ/cm$^2$.

The reaction rate of the compound (c) which has the unsaturated double bond described above in the photosensitive coloring composition after exposure is preferably 60% to 90%. By setting the reaction ratio, it is possible to make the curing state of the photosensitive coloring composition layer after exposure favorable.

In the manufacturing method of the present invention, post-baking other than in the steps described above may be performed; however, from the view point of making the light emitting sources of a liquid crystal display device organic EL or making the photoelectric conversion film of an image sensor an organic material, the post-baking is preferably performed at a temperature of 120° C. or less.

The color filter of the present invention is able to be favorably used for solid-state imaging elements such as CCD and CMOS and is particularly favorable for CCD, CMOS, and the like with high resolutions which exceed 1 million pixels. It is possible to use the color filter for solid-state imaging elements of the present invention, for example, as a color filter which is arranged between the light receiving sections of each of the pixels which configure a CCD or CMOS and a microlens for gathering light. In addition, it is also possible to favorably use the color filter of the present invention for an organic EL liquid crystal display device.

Here, the film thickness of the colored pattern (colored pixels) in the color filter of the present invention is preferably 2.0 µm or less, more preferably 1.0 µm or less, and even more preferably 0.7 µm or less.

In addition, the size (pattern width) of the colored pattern (colored pixels) is preferably 1.0 µm or less.

[Solid-State Imaging Elements]

The solid-state imaging elements of the present invention are provided with a color filter of the present invention described above. The configuration of the solid-state imaging element of the present invention is a configuration provided with the color filter in the present invention and is not particularly limited as long as the configuration is a configuration which functions as a solid-state imaging element; however, examples thereof include the configuration below.

This configuration has transfer electrodes formed of a plurality of photodiodes, polysilicon, and the like which configure a light receiving area of the solid-state imaging elements (a CCD image sensor, a CMOS image sensor, and the like) on a support, has a light shielding film formed of tungsten and the like where only the light receiving sections of photodiodes are opened to the photodiodes and the transfer electrodes, has a device protective film formed of silicon nitride or the like which are formed so as to cover the entire light shielding film and the photodiode light receiving sections on the light shielding film, and has the color filter for solid-state imaging elements of the present invention on the device protective film.

Furthermore, the configuration may have a means of gathering light (for example, a microlens and the like, the same below) under the color filter (on the side close to the support) on the device protective film, the configuration may have a means of gathering light on the color filter, or the like.

[Image Display Device]

The color filter of the present invention is able to be used not only for the solid-state imaging elements but also for an image display device such as a liquid crystal display device or an organic EL liquid crystal display device and is particularly favorable for use in an organic EL liquid crystal display device.

The definition of the display device or details of each display device are described, for example, in "Electronic Display Devices (by Akio Sasaki, published by Kogyo Chosakai Publishing Co., Ltd. in 1990)", "Display Devices (by Jun Ibuki, published by Sangyo Tosho Publishing Co., Ltd. in 1989)", and the like. In addition, the liquid display devices are described, for example, in "Next Generation Liquid Crystal Display Technology (edited by Tatsuo Uchida, published by Kogyo Chosakai Publishing Co., Ltd. in 1994)". The liquid crystal display device to which the present invention is able to be applied is not particularly limited and, for example, application is possible to the various types of liquid crystal display devices described in "Next Generation Liquid Crystal Display Technology" described above.

The color filter of the present invention may be used for a color TFT type liquid crystal display device. The color TFT type liquid crystal display device is described, for example, in "Color TFT Liquid Crystal Display (published by Kyoritsu Shuppan Co., Ltd. in 1996)". Furthermore, it is also possible to apply the present invention to liquid crystal display devices of a lateral electric field driving type such as IPS, a pixel dividing type such as MVA, and the like where the viewing angle is expanded, or to STN, TN, VA, OCS, FFS, R-OCB, and the like.

In addition, it is also possible to use the color filter in the present invention in a color filter on array (COA) type which is bright and has high definition. Regarding the COA type liquid display device, there are cases where it is necessary for the characteristics demanded with respect to the color filter layer to be the characteristics demanded with respect to the interlayer insulating film, that is, a low dielectric constant and a resistance to a stripping liquid in addition to the general demanded characteristics described above. In the color filter of the present invention, the color purity, light transmitting property, and the like are favorable and the tone of the colored pattern (pixels) is excellent since dye polymers which are excellent in hue are used, thus it is possible to provide a COA type liquid crystal display device with high resolution and excellent long-term durability. Here, in order to satisfy the demanded characteristic of a low dielectric constant, a resin covered film may be provided on the color filter layer.

The image display types are described, for example, on page 43 of "EL, PDP, and LCD Displays—Technology and Newest Market Trends—(published by Toray Research Center Inc., Research Department in 2001)" and the like.

The liquid crystal display device which is provided with the color filter in the present invention is configured by various members other than the color filter in the present invention such as an electrode substrate, a polarizing film, a phase difference film, backlight, a spacer, and a viewing angle compensation film. It is possible to apply the color filter of the present invention to a liquid crystal display device which is configured by members which are known in the art. The members are described, for example, in "The '94 Liquid Display Peripheral Materials and Chemicals Market' (by Kentaro Shima, published by CMC Corporation in 1994)" and "2003 State and Future Prospects of Liquid Crystal Related Markets (last volume) (by Ryokichi Omote, published by Fuji Chimera Research Institute, Inc. in 2003)".

The backlight is described in SID meeting Digest 1380 (2005) (A. Konno et. al), pages 18 to 24 of the monthly publication Display in December 2005 (Yasuhiro Shima), pages 25 to 30 in the same magazine (Takaaki Yagi), and the like.

When the color filter in the present invention is used in a liquid crystal display device, it is possible to realize high contrast when combined with a three-wavelength tube of cold cathode tube which is known in the art; however, it is also possible to provide a liquid crystal display device with high brightness by having red, green, and blue LED light source (RGB-LED) as a backlight and with high color purity and favorable color reproducibility.

EXAMPLES

More detailed description will be given of the present invention using the Examples below. It is possible to appropriately change the materials, usage amounts, portions, process contents, process order, and the like which are illustrated in the Examples below as long as these do not depart from the spirit of the present invention. Therefore, the ranges of the present invention are not limited to the specific examples which are illustrated below. Here, unless otherwise stated, "%" and "parts" refer to mass.

<1-1. Preparation of Green Pigment Dispersing Liquid>
<<Preparation of Green Pigment Dispersing Liquid G1>>

A green pigment dispersing liquid G1 was prepared by mixing and dispersing a mixed liquid formed of 15 parts of mixture of 60/40 (mass ratio) of C.I. Pigment Green 36 and C.I. Pigment Yellow 150 as a pigment, 5.0 parts of a dispersing agent 1 as a dispersing agent, 2.5 parts of a derivative 1 as a pigment derivative, and 77.5 parts of PGMEA as a solvent by a bead mill for 15 hours.

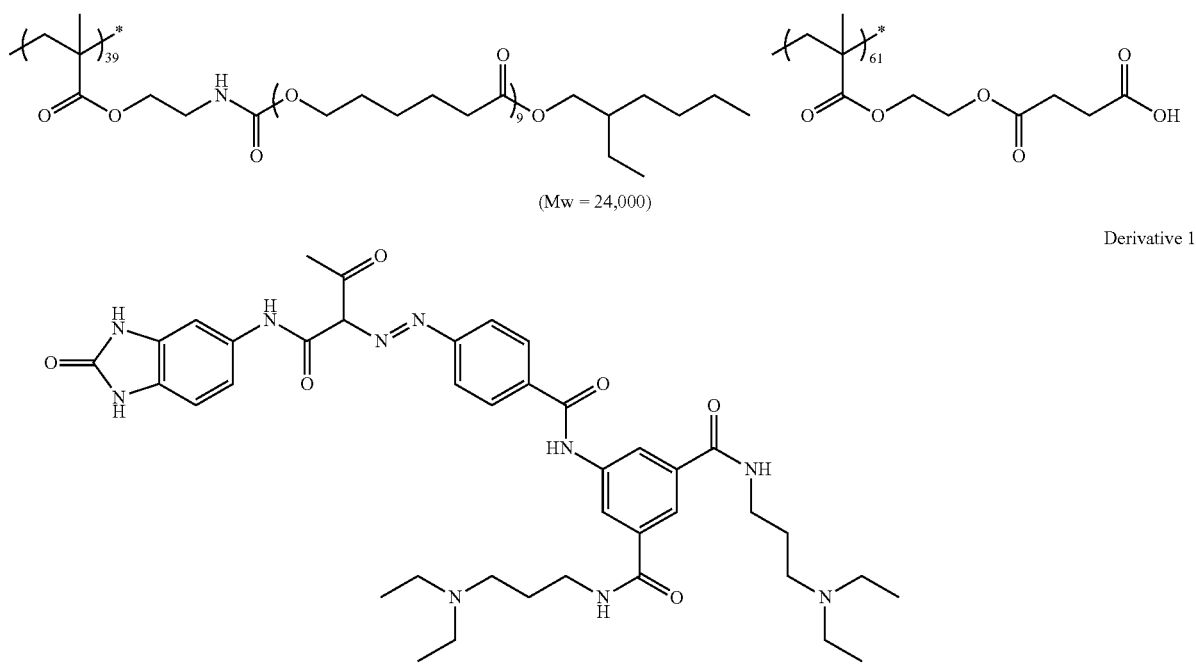

<<Preparation of Green Pigment Dispersing Liquids G2 to G11>>

Green pigment dispersing liquids G2 to G11 were prepared in the same manner as the green pigment dispersing liquid G1 except that at least any one of the pigment, the dispersing agent, and the derivative was changed.

TABLE 1

|     | Pigment | Dispersing agent | Derivative |
| --- | --- | --- | --- |
| G1  | PG36 | PY150 | Dispersing agent 1 | Derivative 1 |
| G2  | PG36 | PY150 | Dispersing agent 2 | Derivative 1 |
| G3  | PG36 | PY150 | Dispersing agent 3 | Derivative 1 |
| G4  | PG36 | PY150 | Dispersing agent 4 | Derivative 2 |
| G5  | PG36 | PY150 | Dispersing agent 4 | Derivative 3 |
| G6  | PG36 | PY150 | Dispersing agent 3 | Derivative 4 |
| G7  | PG58 | PY150 | Dispersing agent 1 | Derivative 1 |
| G8  | PG7  | PY150 | Dispersing agent 1 | Derivative 1 |
| G9  | PG58 | PY138 | Dispersing agent 1 | Derivative 1 |
| G10 | PG58 | PY139 | Dispersing agent 1 | Derivative 1 |
| G11 | PG58 | PY185 | Dispersing agent 1 | Derivative 1 |

Dispersing Agent 2 (Mw = 24,000)

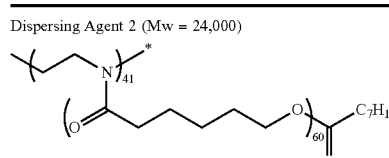

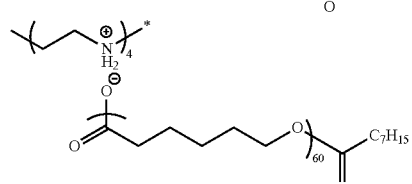

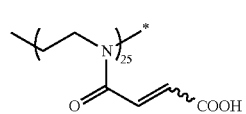

Dispersing Agent 3 (Mw = 24,000)

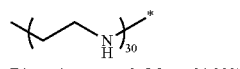

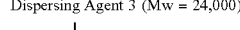

Dispersing Agent 4

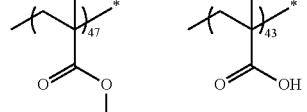

Derivative 2

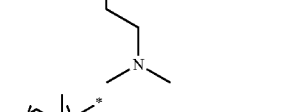

TABLE 1-continued

|     | Pigment | Dispersing agent | Derivative |
| --- | --- | --- | --- |

Derivative 3

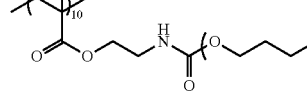

Derivative 4

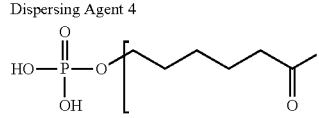

<1-2. Preparation of Red Pigment Dispersing Liquid>
<<Preparation of Red Pigment Dispersing Liquid R1>>

A red pigment dispersing liquid R1 was prepared by mixing and dispersing a mixed liquid formed of 15 parts of mixture of 70/30 (mass ratio) of C.I. Pigment Red 254 and C.I. Pigment Yellow 139 as a pigment, 5.5 parts of a dispersing agent 1 as a dispersing agent, 2.0 parts of a derivative 1 as a pigment derivative, and 77.5 parts of PGMEA as a solvent by a bead mill for 15 hours.

<<Preparation of Red Pigment Dispersing Liquids R2 to R14>>

Red pigment dispersing liquids R2 to R14 were prepared in the same manner as the red pigment dispersing liquid R1 except that at least any one of the pigment, the dispersing agent, and the derivative was changed. In the table below, the dispersing agents 2 to 4 and the derivatives 2 to 4 are as described for the green pigment dispersing liquid described above. In addition, in the table blow, the numbers in the brackets in the pigment section represent a mixed ratio (mass ratio).

TABLE 2

|     | Pigment | | | Dispersing agent | Derivative |
| --- | --- | --- | --- | --- | --- |
| R1  | PR254 | | PY139 | Dispersing agent 1 | Derivative 1 |
| R2  | PR254 | | PY139 | Dispersing agent 2 | Derivative 1 |
| R3  | PR254 | | PY139 | Dispersing agent 3 | Derivative 1 |
| R4  | PR254 | | PY139 | Dispersing agent 4 | Derivative 2 |
| R5  | PR254 | | PY139 | Dispersing agent 4 | Derivative 3 |
| R6  | PR254 | | PY139 | Dispersing agent 3 | Derivative 4 |
| R7  | PR254(50) | PR177(50) | PY139 | Dispersing agent 4 | Derivative 2 |
| R8  | PR254(50) | PR177(50) | PY139 | Dispersing agent 4 | Derivative 3 |
| R9  | PR254(50) | PR177(50) | PY139 | Dispersing agent 4 | Derivative 3 |
| R10 | PR177 | | PY139 | Dispersing agent 4 | Derivative 3 |
| R11 | PR254(50) | PR177(50) | PY139 | Dispersing agent 1 | Derivative 1 |
| R12 | PR254(50) | PR177(50) | PY139 | Dispersing agent 2 | Derivative 1 |
| R13 | PR254(50) | PR177(50) | PY139 | Dispersing agent 3 | Derivative 1 |
| R14 | PR254(50) | PR177(50) | PY139 | Dispersing agent 3 | Derivative 4 |

<1-3. Preparation of Blue Pigment Dispersing Liquid>

<<Preparation of Blue Pigment Dispersing Liquid B1>>

A blue pigment dispersing liquid B1 was prepared by mixing and dispersing a mixed liquid formed of 15 parts of mixture of 80/20 (mass ratio) of C.I. Pigment Blue 15:6 and C.I. Pigment Violet 23 as a pigment, 4.8 parts of the dispersing agent 1 described above as a dispersing agent, 2.7 parts of the derivative 1 described above as a pigment derivative, and 77.5 parts of PGMEA as a solvent by a bead mill for 15 hours.

<<Preparation of Blue Pigment Dispersing Liquids B2 to B12>>

Blue pigment dispersing liquids B2 to B12 were prepared in the same manner as the blue pigment dispersing liquid B1 except that at least any one of the pigment, the dispersing agent, and the derivative was changed. In the table below, the dispersing agents 2 to 4 and the derivatives 2 to 4 are as described in the green pigment dispersing liquid described above.

TABLE 3

|  | Pigment | Dispersing agent | Derivative |
|---|---|---|---|
| B1 | PB15:6 PV23 | Dispersing agent 1 | Derivative 1 |
| B2 | PB15:6 PV23 | Dispersing agent 2 | Derivative 1 |
| B3 | PB15:6 PV23 | Dispersing agent 3 | Derivative 1 |
| B4 | PB15:6 PV23 | Dispersing agent 4 | Derivative 2 |
| B5 | PB15:6 PV23 | Dispersing agent 4 | Derivative 3 |
| B6 | PB15:6 PV23 | Dispersing agent 3 | Derivative 4 |
| B7 | PB15:3 PV23 | Dispersing agent 1 | Derivative 1 |
| B8 | BDye 1 PV23 | Dispersing agent 1 | Derivative 1 |
| B9 | PB15:6 PV19 | Dispersing agent 1 | Derivative 1 |
| B10 | PB15:6 VDye 1 | Dispersing agent 1 | Derivative 1 |
| B11 | PB15:6 VDye 2 | Dispersing agent 1 | Derivative 1 |
| B12 | BDye 1 VDye 2 | None | None |

V dye 1 (Mw = 8,000)

V dye 2 (Mw = 12,000)

B dye 1 (Mw = 10,000)

<1-4. Preparation of Green Photosensitive Coloring Composition (Coating Liquid) RG-1>

A green photosensitive coloring composition RG-1 was prepared by using the green pigment dispersing liquid obtained as described above and mixing and stirring so as to form the composition below.

<Composition>

(a) Polymerization initiator with an absorption coefficient of $1.0 \times 10^3$ mL/gcm or more X part (b) Polymerization initiator with an absorption coefficient of $1.0 \times 10^2$ mL/gcm or less Y part (c) Monomer 1.5 parts (d) Alkali-soluble resin 2.0 parts (e) Green pigment dispersing liquid described above 80.0 parts p-methoxy phenol 0.001 part Polyethylene glycol methyl ether acetate (12.3-X—Y) parts

[PGMEA (below, abbreviated in the same manner); solvent]

Surfactant 4.2 parts (product name: F-781, PGMEA 0.2% solution produced by DIC Corporation.)

<1-5. Preparation of Red Photosensitive Coloring Composition (Coating Liquid) RR-1>

A red photosensitive coloring composition RR-1 was prepared by using the red pigment dispersing liquid described above and mixing and stirring so as to form the composition below.

<Composition>

(a) Polymerization initiator with an absorption coefficient of $1.0 \times 10^3$ mL/gcm or more X part
(b) Polymerization initiator with an absorption coefficient of $1.0 \times 10^2$ mL/gcm or less
Y part
(c) Monomer
0.75 parts
(d) Alkali-soluble resin
2.0 parts
(e) Red pigment dispersing liquid described above
65.0 parts
p-methoxy phenol
0.001 part
Polyethylene glycol methyl ether acetate
(28.05-X—Y) parts
[PGMEA (below, abbreviated in the same manner); solvent]
Surfactant
4.2 parts (product name: F-781, PGMEA 0.2% solution produced by DIC Corporation.)

<1-6. Preparation of Blue Photosensitive Coloring Composition (Coating Liquid) RB-1>

A blue photosensitive coloring composition RB-1 was prepared by using the blue pigment dispersing liquid described above and mixing and stirring so as to form the composition below.

<Composition>
(a) Polymerization initiator with an absorption coefficient of $1.0 \times 10^3$ mL/gcm or more
X part
(b) Polymerization initiator with an absorption coefficient of $1.0 \times 10^2$ mL/gcm or less
Y part
(c) Monomer
1.5 parts
(d) Alkali-soluble resin
2.0 parts
(e) Blue pigment dispersing liquid described above
60.0 parts
p-methoxy phenol
0.001 part
Polyethylene glycol methyl ether acetate
(32.3-X—Y) parts
[PGMEA (below, abbreviated in the same manner); solvent]
Surfactant
4.2 parts (product name: F-781, PGMEA 0.2% solution produced by DIC Corporation.)

(A-1) to (A-4) (produced by BASF Corporation) below were used for the polymerization initiator (a) with an absorption coefficient of $1.0 \times 10^3$ mL/gcm or more.

TABLE 4

| No. | (a) Polymerization initiator with an absorption coefficient of $1.0 \times 10^3$ mL/gcm or more | Absorption coefficient (mL/g cm) |
|---|---|---|
| A-1 | IrgacureOXE01 | 6969 |
| A-2 | IrgacureOXE02 | 7749 |
| A-3 | Irgacure369 | 7858 |
| A-4 | Irgacure819 | 2309 |

(B-1) to (B-5) (produced by BASF Corporation) below were used for the polymerization initiator (b) of which an absorption coefficient is $1.0 \times 10^2$ mL/gcm or less.

TABLE 5

| No. | (b) Polymerization initiator with an absorption coefficient of $1.0 \times 10^2$ mL/gcm or less | Absorption coefficient (mL/g cm) |
|---|---|---|
| B-1 | Irgacure184 | 88.64 |
| B-2 | Darocur1173 | 73.88 |
| B-3 | Irgacure754 | 59.00 |
| B-4 | Irgacure2959 | 48.93 |
| B-5 | DarocurMBF | 38.00 |

(ref-1) to (ref-4) (produced by BASF Corporation) below were used for the other polymerization initiators.

TABLE 6

| No. | (a) Polymerization initiator with an absorption coefficient of more than $1.0 \times 10^2$ mL/gcm to less than $1.0 \times 10^3$ mL/gcm | Absorption coefficient mL/gcm |
|---|---|---|
| ref-1 | Irgacure500 | 175.6 |
| ref-2 | Irgacure651 | 361.3 |
| ref-3 | Irgacure907 | 466.5 |
| ref-4 | Irgacure1800 | 929 |

(C-1) to (C-3) below were used for the monomer (c).

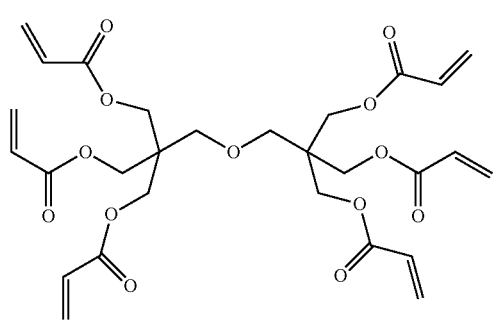

C-1

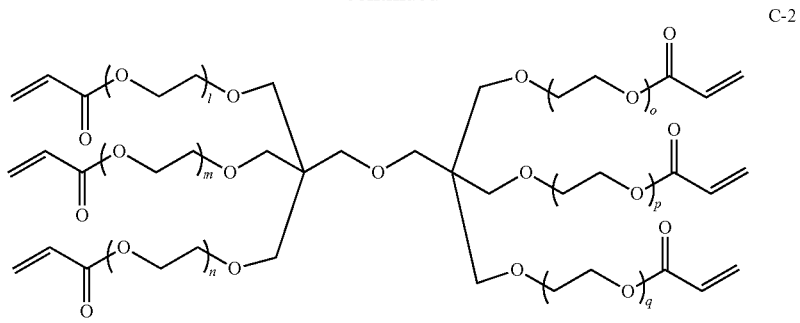

C-2 l + m + n + o + p + q ≠ 12

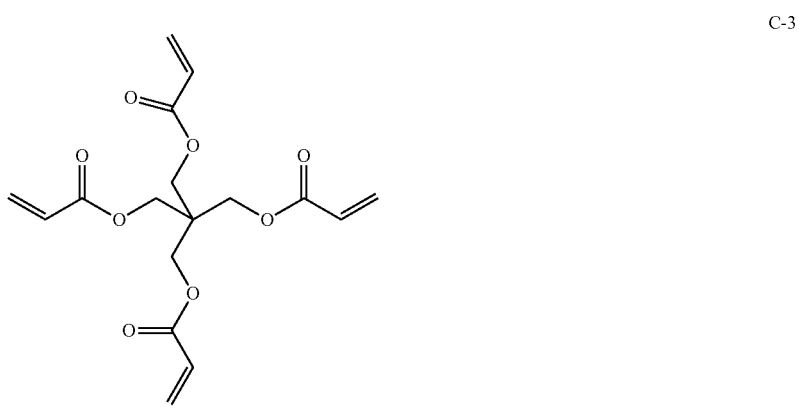

C-3

(D-1) or (D-2) below were used for the alkali-soluble resin (d).

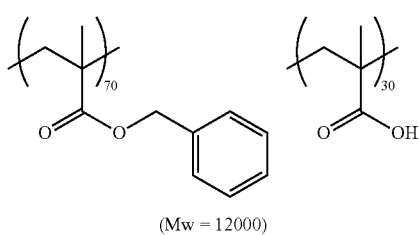

D-1

(Mw = 12000)

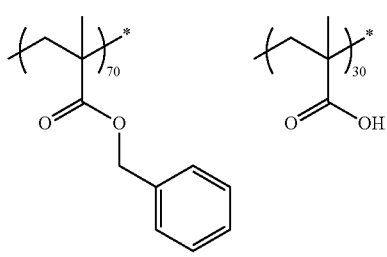

D-2

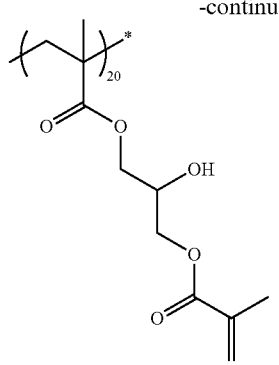

-continued (Mw = 13500)

<1.7 Forming Colored Pattern>

A photocurable coating film was formed by coating the prepared green photosensitive coloring composition RG-1 on an 8-inch glass wafer on which hexamethyldisilazane was sprayed beforehand. Then, a heating process (prebaking) was performed for 180 seconds using a hot plate at 100° C. such that the dried film thickness of the coating film was 1.0 μm.

Subsequently, using an i ray stepper exposure apparatus FPA-3000 i5+(manufactured by Canon Inc.), irradiation was carried out at 50 mJ/cm² to 1000 mJ/cm² through a 1.0 μm square Bayer pattern mask at a wavelength of 365 nm (the exposing amount was changed by 50 mJ/cm² at a time). After this, a green colored pattern was formed on a glass wafer by mounting a silicon wafer on which an irradiated coating film was formed on a horizontally rotating table of a spin shower developing apparatus (DW-30 type; manufactured by Chemitronics Co., Ltd.) and performing paddle development at 23° C. for 180 seconds using a 40% diluted liquid of CD-2000 (produced by Fuji Film Electronics Materials Corporation).

The glass wafer on which the green colored pattern was formed was fixed on the horizontally rotating table by a vacuum chuck method, a rinsing process was performed by supplying pure water in the form of a shower from discharging nozzles from the above the rotation center thereof while rotating the glass wafer at a rotation speed of 50 rpm using a rotating apparatus, and spray drying was carried out after that.

After that, a colored pattern was formed on the glass wafer by performing additional exposure on the entire glass wafer on which the pattern was formed by an ultraviolet ray photoresist curing apparatus (MMA-802-HC-552; manufactured by Ushio Inc.).

As described above, a green color filter was produced.

Furthermore, using the red photosensitive coloring composition RR-1 and the blue photosensitive coloring composition RB-1 described above, by repeating the same steps as the green color filter apart from carrying out the exposure through a 1.0 µm square island pattern mask, a color filter formed by red (R), green (G), and blue (B) patterns was formed.

<1-8. Evaluation>

(1-8-1. Exposure Amount which is Necessary to Obtain a Line Width of 1.0 µm)

Regarding the pattern which was formed in <1.7. Forming Colored Pattern>, the shape of the pattern was observed using SEM (manufactured by Hitachi High-Technologies Corporation, S-9260A) and an exposing amount where the line width was 1.0 µm was described in the table below.

(1-8-2. Solvent Resistance)

A heating process (pre-baking) was performed on the colored pattern which was obtained described above for 150 seconds using a hot plate at 100° C. Subsequently, using an i ray stepper exposure apparatus FPA-3000 i5+ (manufactured by Canon Inc.), irradiation was carried out on the entire surface at 1000 mJ/cm² at a wavelength of 365 nm. Furthermore, additional exposure was performed at 3000 mJ/cm² using an ultraviolet ray photoresist curing apparatus (UMA-802-HC-552; manufactured by Ushio Inc.).

With respect to the color filter which was obtained described above, after N-methylpyrrolidone (NMP) was dripped and left for 200 seconds, rinsing was carried out for 10 seconds using flowing water.

The light division change of the transmittance before and after various types of liquids were dripped was measured using an MCPD-3000 (manufactured by Otsuka Electronics Co., Ltd.) and the color difference ΔEab was measured.

Here, ΔEab being low has the meaning of that the solvent resistance is excellent.

(1-8-3. Evaluation of the Stability of the Photosensitive Coloring Composition Over Time)

The photosensitive coloring composition which was used for forming the colored pattern of the color filter described above was stored at 23° C. for 6 months and changes in the viscosity before and after the storage were confirmed (units: mPa). When the difference is within ±1.0 mPa, use is possible without problems in practical use. When the difference is within ±2.0 mPa, there is a problem but use is possible. The range of the change preferably does not exceed ±2.0 mPa.

(1-8-4. Whether or not Acicular Crystal Generation Occurs)

The color filter described above was heated on a hot plate of 260° C. for 5 minutes, the pattern was observed at ×20,000 using a scanning electron microscope (SEM), and the degree of acicular foreign matter generation was evaluated according to the evaluation criteria below.

<Evaluation Reference>

4: The generation of acicular foreign matter is not recognized at all

3: The generation of minute acicular foreign matter is recognized, but there is no problem 2: The generation of acicular foreign matter is recognized, but acceptable 1: The generation of acicular foreign matter is great and outside the acceptable range (1-8-5. Long Post Coating Delay (PCD: Post Coating Delay) Evaluation)

(Manufacturing Silicon Wafer with Undercoating Layer)

A silicon wafer with an undercoating layer was obtained by coating a resist CT-4000 L solution (produced by Fuji Film Electronics Materials Corporation; a base transparent agent) on a silicon wafer using a spin coater such that the film thickness after drying was 0.1 µm and heating and drying at 220° C. for 1 hour.

(Manufacturing Colored Pattern)

A photosensitive composition layer was obtained by coating the photosensitive coloring composition in Examples and Comparative Examples on a silicon wafer with an undercoating layer by a spin coating method such that the film thickness after coating was 0.6 µm and then heating at 90° C. for 2 minutes on a hot plate.

Subsequently, with respect to the obtained photosensitive coloring composition layer, using an i ray stepper exposure apparatus FPA-3000 i5+ (manufactured by Canon Inc.), a 2.0 µm island pattern was exposed at 300 mj/cm² via a mask. Subsequently, with respect to the photosensitive coloring composition layer after the exposure, paddle development was performed at 23° C. for 60 seconds using a tetramethylammonium hydroxide (TMAH) 0.3% aqueous solution. After that, a colored pattern was obtained by performing rinsing by spin shower and further cleaning using pure water.

The line width of the obtained colored pattern was observed using a length measuring SEM (manufactured by Hitachi High-Technologies Corporation, S-9260A). The difference between the maximum value and the minimum value of the line widths in one pixel in a case where the post coating delay is 72 hours was measured by selecting 10 arbitrary points within the wafer and calculating the average value thereof. Here, in a case where the post coating delay was 0 hour, the average value was also <0.02 µm in all of the Examples and Comparative Examples.

The determination criteria is desirably 3 or more in practice. The results will be illustrated in the table.

(Determination Criteria)

6: less than 0.02 µm (Most favorable)

5: 0.02 µm or more to less than 0.04 µm (Favorable)

4: 0.04 µm or more to less than 0.06 µm (Slightly favorable)

3: 0.06 µm or more to less than 0.10 µm (Acceptable)

2: 0.10 µm or more to less than 0.20 (Not acceptable)

1: 0.20 µm or more (Not acceptable)

TABLE 7

| | Polymerization initiator (a) with an absorption coefficient of $1.0 \times 10^3$ mL/gcm or more | Polymerization initiator (b) with an absorption coefficient of $1.0 \times 10^2$ mL/gcm or less | Compound (c) which has an unsaturated double bond | Alkali-soluble resin (d) | Coloring material (e) | Exposing amount which is necessary to obtain a line width of 1.0 μm using FPA-3000i5+ | Solvent resistance | Stability over time | Acicular crystal | PCD |
|---|---|---|---|---|---|---|---|---|---|---|
| RR-1 | A-1 (1.0 part) | B-1 (0.5 parts) | C-1 | D-1 | R-1 | 100 | 1.0 | 1.0 | 3 | 5 |
| RR-2 | A-2 (1.0 part) | B-1 (0.5 parts) | C-1 | D-1 | R-1 | 50 | 1.0 | 1.0 | 3 | 5 |
| RR-3 | A-3 (1.0 part) | B-1 (0.5 parts) | C-1 | D-1 | R-1 | 300 | 1.0 | 1.0 | 3 | 5 |
| RR-4 | A-4 (1.0 part) | B-1 (0.5 parts) | C-1 | D-1 | R-1 | 600 | 1.0 | 1.0 | 3 | 5 |
| RR-5 | A-1 (1.0 part) | B-2 (0.5 parts) | C-1 | D-1 | R-1 | 150 | 0.5 | 1.0 | 3 | 5 |
| RR-6 | A-1 (1.0 part) | B-3 (0.5 parts) | C-1 | D-1 | R-1 | 200 | 1.5 | 1.0 | 3 | 5 |
| RR-7 | A-1 (1.0 part) | B-4 (0.5 parts) | C-1 | D-1 | R-1 | 250 | 1.0 | 1.0 | 3 | 5 |
| RR-8 | A-1 (1.0 part) | B-5 (0.5 parts) | C-1 | D-1 | R-1 | 300 | 2.0 | 1.0 | 3 | 5 |
| RR-9 | A-1 (1.0 part) | B-4 (0.5 parts) | C-2 | D-1 | R-1 | 250 | 1.0 | 1.0 | 3 | 5 |
| RR-10 | A-1 (1.0 part) | B-4 (0.5 parts) | C-3 | D-1 | R-1 | 250 | 1.0 | 1.0 | 3 | 5 |
| RR-11 | A-1 (1.0 part) | B-4 (0.5 parts) | C-1 | D-2 | R-1 | 200 | 0.5 | 1.0 | 3 | 5 |
| RR-12 | A-1 (1.0 part) | B-4 (0.5 parts) | C-1 | D-2 | R-2 | 200 | 0.5 | 1.5 | 3 | 5 |
| RR-13 | A-1 (1.0 part) | B-4 (0.5 parts) | C-1 | D-2 | R-3 | 200 | 0.5 | 1.7 | 3 | 5 |
| RR-14 | A-1 (1.0 part) | B-4 (0.5 parts) | C-1 | D-2 | R-4 | 200 | 0.5 | 0.7 | 4 | 5 |
| RR-15 | A-1 (1.0 part) | B-4 (0.5 parts) | C-1 | D-2 | R-5 | 200 | 0.5 | 0.3 | 4 | 5 |
| RR-16 | A-1 (1.0 part) | B-4 (0.5 parts) | C-1 | D-2 | R-6 | 200 | 0.5 | 1.5 | 3 | 5 |
| RR-17 | A-1 (1.0 part) | B-4 (0.5 parts) | C-1 | D-2 | R-7 | 200 | 0.5 | 0.6 | 4 | 6 |
| RR-18 | A-1 (1.0 part) | B-4 (0.5 parts) | C-1 | D-2 | R-8 | 200 | 0.5 | 0.2 | 4 | 6 |
| RR-19 | A-1 (1.0 part) | B-4 (0.5 parts) | C-1 | D-2 | R-9 | 200 | 0.5 | 0.2 | 4 | 6 |
| RR-20 | A-1 (1.0 part) | B-4 (0.5 parts) | C-1 | D-2 | R-10 | 200 | 0.5 | 0.3 | 4 | 5 |
| RR-21 | A-1 (0.3 parts) | B-4 (0.5 parts) | C-1 | D-2 | R-1 | 500 | 1.5 | 1.0 | 3 | 5 |
| RR-22 | A-1 (0.5 parts) | B-4 (0.5 parts) | C-1 | D-2 | R-1 | 400 | 1.5 | 1.0 | 3 | 5 |
| RR-23 | A-1 (0.7 parts) | B-4 (0.5 parts) | C-1 | D-2 | R-1 | 300 | 1.0 | 1.0 | 3 | 5 |
| RR-24 | A-1 (1.5 parts) | B-4 (0.5 parts) | C-1 | D-2 | R-1 | 75 | 1.0 | 1.0 | 3 | 5 |
| RR-25 | A-1 (2.0 parts) | B-4 (0.5 parts) | C-1 | D-2 | R-1 | 50 | 0.5 | 1.0 | 3 | 5 |
| RR-26 | A-1 (1.0 part) | B-4 (0.3 parts) | C-1 | D-2 | R-1 | 250 | 2.5 | 1.0 | 3 | 5 |
| RR-27 | A-1 (1.0 part) | B-4 (0.8 parts) | C-1 | D-2 | R-1 | 250 | 2.0 | 1.0 | 3 | 5 |
| RR-28 | A-1 (1.0 part) | B-4 (1.5 parts) | C-1 | D-2 | R-1 | 250 | 1.0 | 1.0 | 3 | 5 |
| RR-29 | A-1 (1.0 part) | B-4 (0.5 parts) | C-1 | D-2 | R-11 | 200 | 0.5 | 1.0 | 3 | 5 |
| RR-30 | A-1 (1.0 part) | B-4 (0.5 parts) | C-1 | D-2 | R-12 | 200 | 0.5 | 1.4 | 3 | 5 |
| RR-31 | A-1 (1.0 part) | B-4 (0.5 parts) | C-1 | D-2 | R-13 | 200 | 0.5 | 1.6 | 3 | 5 |
| RR-32 | A-1 (1.0 part) | B-4 (0.5 parts) | C-1 | D-2 | R-14 | 200 | 0.5 | 1.4 | 3 | 5 |
| Comparative Example 1 | A-1 (1.0 part) | None | C-1 | D-1 | R-1 | 100 | 15.0 | 1.0 | 1 | 5 |
| Comparative Example 2 | None | B-1 (0.5 parts) | C-1 | D-1 | R-1 | >1000 | 14.0 | 1.0 | 1 | 5 |
| Comparative Example 3 | ref-1 (1.0 part) | B-1 (0.5 parts) | C-1 | D-1 | R-1 | >1000 | 10.0 | 1.0 | 1 | 5 |
| Comparative Example 4 | A-1 (1.0 part) | ref-2 (0.5 parts) | C-1 | D-1 | R-1 | <50 | 0.5 | 1.0 | 3 | 5 |
| Comparative Example 5 | A-1 (1.0 part) | ref-3 (0.5 parts) | C-1 | D-1 | R-1 | <50 | 0.5 | 1.0 | 3 | 5 |
| Comparative Example 6 | A-1 (1.0 part) | ref-4 (0.5 parts) | C-1 | D-1 | R-1 | <50 | 0.5 | 1.0 | 3 | 5 |
| Comparative Example 6A | A-1 (3.0 parts) | B-4 (0.5 parts) | C-1 | D-2 | R-1 | <50 | 0.5 | 1.0 | 3 | 5 |
| Comparative Example 6B | A-1 (1.0 part) | B-4 (2.0 parts) | C-1 | D-2 | R-1 | 200 | 0.5 | 1.0 | 3 | 2 |
| Comparative Example 6C | A-1 (0.1 parts) | B-4 (0.5 parts) | C-1 | D-2 | R-1 | >1000 | 10.0 | 1.0 | 1 | 5 |
| Comparative Example 6D | A-1 (1.0 part) | B-4 (0.1 parts) | C-1 | D-2 | R-1 | 200 | 8.0 | 1.0 | 3 | 5 |

TABLE 8

| | Polymerization initiator (a) with an absorption coefficient of $1.0 \times 10^3$ mL/gcm or more | Polymerization initiator (b) with an absorption coefficient of $1.0 \times 10^2$ mL/gcm or less | Compound (c) which has an unsaturated double bond | Alkali-soluble resin (d) | Coloring material (e) | Exposing amount which is necessary to obtain a line width of 1.0 μm using FPA-3000i5+ | Solvent resistance | Stability over time | Acicular crystal | PCD |
|---|---|---|---|---|---|---|---|---|---|---|
| RG-1 | A-1 (1.0 part) | B-1 (0.5 parts) | C-1 | D-1 | G-1 | 200 | 1.2 | 1.2 | 3 | 5 |
| RG-2 | A-2 (1.0 part) | B-1 (0.5 parts) | C-1 | D-1 | G-1 | 150 | 1.2 | 1.1 | 3 | 5 |

TABLE 8-continued

| | Polymerization initiator (a) with an absorption coefficient of 1.0 × 10³ mL/gcm or more | Polymerization initiator (b) with an absorption coefficient of 1.0 × 10² mL/gcm or less | Compound (c) which has an unsaturated double bond | Alkali-soluble resin (d) | Coloring material (e) | Exposing amount which is necessary to obtain a line width of 1.0 µm using FPA-3000i5+ | Solvent resistance | Stability over time | Acicular crystal | PCD |
|---|---|---|---|---|---|---|---|---|---|---|
| RG-3 | A-3 (1.0 part) | B-1 (0.5 parts) | C-1 | D-1 | G-1 | 400 | 1.2 | 1.2 | 3 | 5 |
| RG-4 | A-4 (1.0 part) | B-1 (0.5 parts) | C-1 | D-1 | G-1 | 700 | 1.2 | 1.1 | 3 | 5 |
| RG-5 | A-1 (1.0 part) | B-2 (0.5 parts) | C-1 | D-1 | G-1 | 250 | 0.7 | 1.1 | 3 | 5 |
| RG-6 | A-1 (1.0 part) | B-3 (0.5 parts) | C-1 | D-1 | G-1 | 300 | 1.7 | 1.1 | 3 | 5 |
| RG-7 | A-1 (1.0 part) | B-4 (0.5 parts) | C-1 | D-1 | G-1 | 350 | 1.2 | 1.2 | 3 | 5 |
| RG-8 | A-1 (1.0 part) | B-5 (0.5 parts) | C-1 | D-1 | G-1 | 400 | 2.2 | 1.2 | 3 | 5 |
| RG-9 | A-1 (1.0 part) | B-4 (0.5 parts) | C-2 | D-1 | G-1 | 350 | 1.2 | 1.1 | 3 | 5 |
| RG-10 | A-1 (1.0 part) | B-4 (0.5 parts) | C-3 | D-1 | G-1 | 350 | 1.2 | 1.1 | 3 | 5 |
| RG-11 | A-1 (1.0 part) | B-4 (0.5 parts) | C-1 | D-2 | G-1 | 300 | 0.7 | 1.2 | 3 | 5 |
| RG-12 | A-1 (1.0 part) | B-4 (0.5 parts) | C-1 | D-2 | G-2 | 300 | 0.7 | 1.2 | 3 | 4 |
| RG-13 | A-1 (1.0 part) | B-4 (0.5 parts) | C-1 | D-2 | G-3 | 300 | 0.7 | 1.9 | 3 | 5 |
| RG-14 | A-1 (1.0 part) | B-4 (0.5 parts) | C-1 | D-2 | G-4 | 300 | 0.7 | 0.7 | 4 | 5 |
| RG-15 | A-1 (1.0 part) | B-4 (0.5 parts) | C-1 | D-2 | G-5 | 300 | 0.7 | 0.3 | 4 | 5 |
| RG-16 | A-1 (1.0 part) | B-4 (0.5 parts) | C-1 | D-2 | G-6 | 300 | 0.7 | 1.2 | 3 | 5 |
| RG-17 | A-1 (1.0 part) | B-4 (0.5 parts) | C-1 | D-2 | G-7 | 300 | 0.7 | 1.2 | 4 | 6 |
| RG-18 | A-1 (1.0 part) | B-4 (0.5 parts) | C-1 | D-2 | G-8 | 300 | 0.7 | 1.2 | 3 | 5 |
| RG-19 | A-1 (1.0 part) | B-4 (0.5 parts) | C-1 | D-2 | G-9 | 300 | 0.7 | 1.2 | 4 | 6 |
| RG-20 | A-1 (1.0 part) | B-4 (0.5 parts) | C-1 | D-2 | G-10 | 300 | 0.7 | 1.2 | 4 | 6 |
| RG-21 | A-1 (1.0 part) | B-4 (0.5 parts) | C-1 | D-2 | G-11 | 300 | 0.7 | 1.2 | 4 | 6 |
| RG-22 | A-1 (0.3 parts) | B-4 (0.5 parts) | C-1 | D-2 | G-1 | 600 | 1.7 | 1.0 | 3 | 5 |
| RG-23 | A-1 (0.5 parts) | B-4 (0.5 parts) | C-1 | D-2 | G-1 | 500 | 1.7 | 1.0 | 3 | 5 |
| RG-24 | A-1 (0.7 parts) | B-4 (0.5 parts) | C-1 | D-2 | G-1 | 400 | 1.2 | 1.0 | 3 | 5 |
| RG-25 | A-1 (1.5 parts) | B-4 (0.5 parts) | C-1 | D-2 | G-1 | 175 | 1.2 | 1.0 | 3 | 5 |
| RG-26 | A-1 (2.0 parts) | B-4 (0.5 parts) | C-1 | D-2 | G-1 | 150 | 0.7 | 1.0 | 2 | 5 |
| RG-27 | A-1 (1.0 part) | B-4 (0.3 parts) | C-1 | D-2 | G-1 | 350 | 2.7 | 1.0 | 3 | 5 |
| RG-28 | A-1 (1.0 part) | B-4 (0.8 parts) | C-1 | D-2 | G-1 | 350 | 2.2 | 1.0 | 3 | 5 |
| RG-29 | A-1 (1.0 part) | B-4 (1.5 parts) | C-1 | D-2 | G-1 | 350 | 1.2 | 1.0 | 2 | 5 |
| Comparative Example 7 | A-1 (1.0 part) | None | C-1 | D-1 | G-1 | 200 | 15.0 | 1.0 | 1 | 5 |
| Comparative Example 8 | None | B-1 (0.5 parts) | C-1 | D-1 | G-1 | >1000 | 15.0 | 1.0 | 1 | 5 |
| Comparative Example 9 | ref-1 (1.0 part) | B-1 (0.5 parts) | C-1 | D-1 | G-1 | >1000 | 11.0 | 1.0 | 1 | 5 |
| Comparative Example 10 | A-1 (1.0 part) | ref-2 (0.5 parts) | C-1 | D-1 | G-1 | <50 | 0.7 | 1.0 | 3 | 5 |
| Comparative Example 11 | A-1 (1.0 part) | ref-3 (0.5 parts) | C-1 | D-1 | G-1 | <50 | 0.7 | 1.0 | 3 | 5 |
| Comparative Example 12 | A-1 (1.0 part) | ref-4 (0.5 parts) | C-1 | D-1 | G-1 | <50 | 0.7 | 1.0 | 3 | 5 |

TABLE 9

| | Polymerization initiator (a) with an absorption coefficient of 1.0 × 10³ mL/gcm or more | Polymerization initiator (b) with an absorption coefficient of 1.0 × 10² mL/gcm or less | Compound (c) which has an unsaturated double bond | Alkali-soluble resin (d) | Coloring material (e) | Exposing amount which is necessary to obtain a line width of 1.0 µm using FPA-3000i5+ | Solvent resistance | Stability over time | Acicular crystal | PCD |
|---|---|---|---|---|---|---|---|---|---|---|
| RB-1 | A-1 (1.0 part) | B-1 (0.5 parts) | C-1 | D-1 | B-1 | 250 | 1.3 | 0.9 | 3 | 5 |
| RB-2 | A-2 (1.0 part) | B-1 (0.5 parts) | C-1 | D-1 | B-1 | 200 | 1.3 | 0.9 | 3 | 5 |
| RB-3 | A-3 (1.0 part) | B-1 (0.5 parts) | C-1 | D-1 | B-1 | 450 | 1.3 | 0.9 | 3 | 5 |
| RB-4 | A-4 (1.0 part) | B-1 (0.5 parts) | C-1 | D-1 | B-1 | 750 | 1.3 | 1.0 | 3 | 5 |
| RB-5 | A-1 (1.0 part) | B-2 (0.5 parts) | C-1 | D-1 | B-1 | 300 | 0.8 | 0.9 | 3 | 5 |
| RB-6 | A-1 (1.0 part) | B-3 (0.5 parts) | C-1 | D-1 | B-1 | 350 | 1.8 | 0.9 | 3 | 5 |
| RB-7 | A-1 (1.0 part) | B-4 (0.5 parts) | C-1 | D-1 | B-1 | 400 | 1.3 | 0.9 | 3 | 5 |
| RB-8 | A-1 (1.0 part) | B-5 (0.5 parts) | C-1 | D-1 | B-1 | 450 | 2.3 | 0.9 | 3 | 5 |
| RB-9 | A-1 (1.0 part) | B-4 (0.5 parts) | C-2 | D-1 | B-1 | 400 | 1.3 | 0.9 | 3 | 5 |
| RB-10 | A-1 (1.0 part) | B-4 (0.5 parts) | C-3 | D-1 | B-1 | 400 | 1.3 | 0.9 | 3 | 5 |
| RB-11 | A-1 (1.0 part) | B-4 (0.5 parts) | C-1 | D-2 | B-1 | 350 | 0.8 | 0.9 | 3 | 5 |
| RB-12 | A-1 (1.0 part) | B-4 (0.5 parts) | C-1 | D-2 | B-2 | 350 | 0.8 | 1.5 | 3 | 4 |
| RB-13 | A-1 (1.0 part) | B-4 (0.5 parts) | C-1 | D-2 | B-3 | 350 | 0.8 | 2.0 | 3 | 5 |
| RB-14 | A-1 (1.0 part) | B-4 (0.5 parts) | C-1 | D-2 | B-4 | 350 | 0.8 | 0.5 | 4 | 5 |
| RB-15 | A-1 (1.0 part) | B-4 (0.5 parts) | C-1 | D-2 | B-5 | 350 | 0.8 | 0.2 | 4 | 5 |
| RB-16 | A-1 (1.0 part) | B-4 (0.5 parts) | C-1 | D-2 | B-6 | 350 | 0.8 | 1.2 | 3 | 5 |

TABLE 9-continued

| | Polymerization initiator (a) with an absorption coefficient of $1.0 \times 10^3$ mL/gcm or more | Polymerization initiator (b) with an absorption coefficient of $1.0 \times 10^2$ mL/gcm or less | Compound (c) which has an unsaturated double bond | Alkali-soluble resin (d) | Coloring material (e) | Exposing amount which is necessary to obtain a line width of 1.0 μm using FPA-3000i5+ | Solvent resistance | Stability over time | Acicular crystal | PCD |
|---|---|---|---|---|---|---|---|---|---|---|
| RB-17 | A-1 (1.0 part) | B-4 (0.5 parts) | C-1 | D-2 | B-7 | 350 | 0.8 | 1.2 | 3 | 5 |
| RB-18 | A-1 (1.0 part) | B-4 (0.5 parts) | C-1 | D-2 | B-8 | 350 | 1.2 | 0.8 | 4 | 6 |
| RB-19 | A-1 (1.0 part) | B-4 (0.5 parts) | C-1 | D-2 | B-9 | 350 | 0.8 | 1.2 | 3 | 5 |
| RB-20 | A-1 (1.0 part) | B-4 (0.5 parts) | C-1 | D-2 | B-10 | 350 | 1.2 | 0.7 | 4 | 6 |
| RB-21 | A-1 (1.0 part) | B-4 (0.5 parts) | C-1 | D-2 | B-11 | 350 | 1.2 | 0.7 | 4 | 6 |
| RB-22 | A-1 (1.0 part) | B-4 (0.5 parts) | C-1 | D-2 | B-12 | 350 | 1.4 | 0.1 | 4 | 6 |
| RB-23 | A-1 (0.3 parts) | B-4 (0.5 parts) | C-1 | D-2 | B-1 | 650 | 1.8 | 0.9 | 3 | 5 |
| RB-24 | A-1 (0.5 parts) | B-4 (0.5 parts) | C-1 | D-2 | B-1 | 550 | 1.8 | 0.9 | 3 | 5 |
| RB-25 | A-1 (0.7 parts) | B-4 (0.5 parts) | C-1 | D-2 | B-1 | 450 | 1.3 | 0.9 | 3 | 5 |
| RB-26 | A-1 (1.5 parts) | B-4 (0.5 parts) | C-1 | D-2 | B-1 | 225 | 1.3 | 0.9 | 3 | 5 |
| RB-27 | A-1 (2.0 parts) | B-4 (0.5 parts) | C-1 | D-2 | B-1 | 200 | 0.8 | 0.9 | 2 | 5 |
| RB-28 | A-1 (1.0 part) | B-4 (0.3 parts) | C-1 | D-2 | B-1 | 400 | 2.8 | 0.9 | 3 | 5 |
| RB-29 | A-1 (1.0 part) | B-4 (0.8 parts) | C-1 | D-2 | B-1 | 400 | 2.3 | 0.9 | 3 | 5 |
| RB-30 | A-1 (1.0 part) | B-4 (1.5 parts) | C-1 | D-2 | B-1 | 400 | 1.3 | 0.9 | 2 | 5 |
| Comparative Example 13 | A-1 (1.0 part) | None | C-1 | D-1 | B-1 | 250 | 16.0 | 0.9 | 1 | 5 |
| Comparative Example 14 | None | B-1 (0.5 parts) | C-1 | D-1 | B-1 | >1000 | 16.0 | 0.9 | 1 | 5 |
| Comparative Example 15 | ref-1 (1.0 part) | B-1 (0.5 parts) | C-1 | D-1 | B-1 | >1000 | 12.0 | 0.9 | 1 | 5 |
| Comparative Example 16 | A-1 (1.0 part) | ref-2 (0.5 parts) | C-1 | D-1 | B-1 | <50 | 1.0 | 0.9 | 3 | 5 |
| Comparative Example 17 | A-1 (1.0 part) | ref-3 (0.5 parts) | C-1 | D-1 | B-1 | <50 | 1.0 | 0.9 | 3 | 5 |
| Comparative Example 18 | A-1 (1.0 part) | ref-4 (0.5 parts) | C-1 | D-1 | B-1 | <50 | 1.0 | 0.9 | 3 | 5 |

As is clear from the tables described above, it is understood that it is possible to achieve both forming a 1.0 μm pattern and having the solvent resistance in the Examples in which a polymerization initiator (a) with an absorption coefficient of 365 nm in methanol is $1.0 \times 10^3$ mL/gcm or more and a polymerization initiator (b) with an absorption coefficient of 365 nm in methanol is $1.0 \times 10^2$ mL/gcm or less and an absorption coefficient of 254 nm is $1.0 \times 10^3$ mL/gcm or more were used.

In addition, as illustrated in Examples RR-14, RR-15, and RR-17 to RR-20, it is understood that the stability over time is superior and the generation of acicular crystals is further suppressed in a case of using a derivative 2 and a derivative 3.

On the other hand, in Comparative Examples to which the polymerization initiator (b) was not added, it is understood that it is possible to form a 1.0 μm pattern, but that the solvent resistance is not favorable. In addition, in Comparative Examples to which the polymerization initiator (a) was not added, it is understood that it is possible to impart the solvent resistance, but it is not possible to form a 1.0 μm pattern.

Furthermore, it is understood that it was possible to impart the solvent resistance in Comparative Examples in which a polymerization initiator with an absorption coefficient of 365 nm in methanol exceeding $1.0 \times 10^2$ mL/gcm was used as the polymerization initiator (b); however, when the exposure amount which is necessary to obtain a 1.0 μm line width using FPA-3000i5+ is less than 50 mJ/cm$^2$, the sensitivity is excessively high and it is difficult to form a pattern of 1.0 μm.

In Comparative Examples in which the content of the polymerization initiator (a) exceeded 10 mass % in the total solid content of the composition, it is understood that when the exposure amount which is necessary to obtain a line width of 1.0 μm using FPA-3000i5+ was less than 50 mJ/cm$^2$, the sensitivity is excessively high and that it is difficult to form a pattern of 1.0 μm. In addition, in the Comparative Examples in which the content of the polymerization initiator (a) is less than 1.5 mass % of the total solid content of the composition, it is understood that the solvent resistance is not favorable and that acicular crystals is easily generated.

In Comparative Examples in which the content of the polymerization initiator (b) exceeds 7.5 mass % in the total solid content of the composition, it is understood that the colored pattern forming property after a long time standing is not favorable. In addition, in Comparative Examples in which the content of the polymerization initiator (b) is less than 1.5 mass % in the total solid content of the composition, it is understood that the solvent resistance is not favorable.

What is claimed is:

1. A method for producing a color filter, comprising:
    a step (i) of forming a photosensitive coloring composition layer on a substrate using a photosensitive coloring composition;
    a step (ii) of exposing the photosensitive coloring composition layer using light with a wavelength of more than 350 nm to 380 nm or less;
    a step (iii) of carrying out alkali development on the photosensitive coloring composition layer after exposure; and
    a step (iv) of exposing the photosensitive coloring composition layer after alkali development using light with a wavelength of 254 nm to 350 nm, in the stated order,
    wherein the photosensitive coloring composition contains a polymerization initiator (a) with an absorption coefficient at 365 nm in methanol of $1.0 \times 10^3$ mL/gcm or more, a polymerization initiator (b) with an absorption coefficient at 365 nm in methanol of $1.0\times10^2$ mL/gcm or less and an absorption coefficient at 254 nm in methanol of $1.0\times10^3$ mL/gcm or more,
a compound (c) which has an unsaturated double bond,
an alkali-soluble resin (d), and
a coloring material comprising a pigment (e), and
with respect to the total solids content of the photosensitive coloring composition, the content of the polymerization initiator (a) is 1.5 mass % to 10 mass %, and the content of the polymerization initiator (b) is 1.5 mass % to 7.5 mass %.

2. The method for producing a color filter according to claim 1,
wherein, in the step (ii) of exposure using light with a wavelength of more than 350 nm to 380 nm or less, the reaction rate of the compound (c) which has an unsaturated double bond in the photosensitive coloring composition after exposure is 30% to 60%.

3. The method for producing a color filter according to claim 2,
wherein, in the step (iv) of exposure using light with a wavelength of 254 nm to 350 nm, the reaction rate of the compound (c) which has an unsaturated double bond in the photosensitive coloring composition after exposure is 60% to 90%.

4. The method for producing a color filter according to claim 1,
wherein, in the step (iv) of exposure using light with a wavelength of 254 nm to 350 nm, the reaction rate of the compound (c) which has an unsaturated double bond in the photosensitive coloring composition after exposure is 60% to 90%.

5. The method for producing a color filter according to claim 1, further comprising:
a step of heating the photosensitive coloring composition layer which is formed on the substrate at 120° C. or less.

6. The method for producing a color filter according to claim 1,
wherein,
in the step (ii) of exposure using light with a wavelength of more than 350 nm to 380 nm or less, the exposure amount is 50 mJ/cm$^2$ to 1000 mJ/cm$^2$, and
in the step (iv) of exposure using light with a wavelength of 254 nm to 350 nm, the exposure amount is 50 mJ/cm$^2$ to 3500 mJ/cm$^2$.

7. The method for producing a color filter according to claim 1,
wherein the coloring material (e) includes a red, green, or blue coloring material.

8. The method for producing a color filter according to claim 7,
wherein the coloring material (e) includes
at least one compound selected from the group consisting of C.I. Pigment Red 81, 122, 166, 177, 179, 209, 224, 242 and 254; and
at least one compound selected from the group consisting of C.I. Pigment Yellow 138, 139, 150 and 185.

9. The method for producing a color filter according to claim 8,
wherein the coloring material (e) includes
at least one compound selected from the group consisting of C.I. Pigment Red 177 and 254; and
C.I. Pigment Yellow 139.

10. The method for producing a color filter according to claim 7,
wherein the coloring material (e) includes
at least one compound selected from the group consisting of C.I. Pigment Green 7, 36 and 58; and
at least one compound selected from the group consisting of C.I. Pigment Yellow 138, 139, 150 and 185.

11. The method for producing a color filter according to claim 7,
wherein the coloring material (e) includes
at least one compound selected from the group consisting of C.I. Pigment Blue 15, 15:1, 15:2, 15:3, 15:4, 15:5, 15:6 and a triarylmethane dye; and
at least one compound selected from the group consisting of C.I. Pigment Violet 23, 19, a xanthene dye and a pyrromethene dye.

12. The method for producing a color filter according to claim 1,
wherein the polymerization initiator (a) is at least one compound selected from the group consisting of
2-benzyl-2-dimethylamino-1-(4-morpholinophenyl)-butanone-1;
2-dimethylanimo-2-(4-methyl-benzyl)-1-(4-morpholin-4-yl-phenyl)-butan-1-one;
1,2-octanedione,1-[4-(phenylthio)-,2-(o-benzoyloxime)]; and
ethanone,1-[9-ethyl-6-(2-methylbenzoyl)-9H-carbazole-3-yl]-,1-(O-acetyloxime).

13. The method for producing a color filter according to claim 1,
wherein the polymerization initiator (b) is at least one compound selected from the group consisting of
1-hydroxy-cyclohexyl-phenyl-ketone;
2-hydroxy-2-methyl-1-phenyl-propan-1-one;
1-[4-(2-hydroxyethoxy)-phenyl]-2-hydroxy-2-methyl-1-propan-1-one; and
phenylglyoxylic acid methyl ester.

14. The method for producing a color filter according to claim 1,
wherein the content of the coloring material (e) is 40 mass % to 70 mass % in the total solids content of the photosensitive coloring composition.

15. The method for producing a color filter according to claim 1,
wherein the compound (c) which has an unsaturated double bond includes a polyfunctional polymerizable compound.

16. The method for producing a color filter according to claim 1,
wherein the alkali-soluble resin (d) has a polymerizable group.

17. The method for producing a color filter according to claim 1,
wherein the polymerization initiator (a) is 1,2-octanedione,1-[4-(phenylthio)-,2-(o-benzoyloxime)] and the polymerization initiator (b) is 1-[4-(2-hydroxyethoxy)-phenyl]-2-hydroxy-2-methyl-1-propan-1-one.

18. An organic EL liquid crystal display device which has the color filter according to claim 17.

19. The method for producing a color filter according to claim 1,
wherein the coloring material (e) includes a pigment and a pigment derivative which is represented by General Formula (I) below or General Formula (II) below,

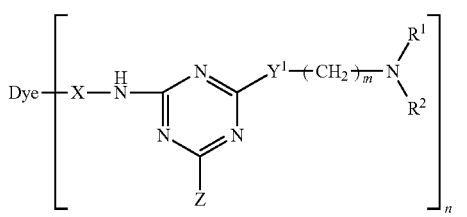

in General Formula (I),

Dye represents a n-valent organic dye residue,

X represents a single bond, —CONH—$Y^2$—, —$SO_2$NH—$Y^2$—, or —$CH_2$NHCOCH$_2$NH—$Y^2$—, where $Y^2$ represents an alkylene group or an arylene group which may have a substituent group, $Y^1$ represents —NH— or —O—, Z represents a hydroxyl group, an alkoxy group, a group which is represented by General Formula (I-1) below, or —NH—X-Dye when n represents 1 (X has the same meaning as X in General Formula (I)) and Z represents a hydroxyl group, an alkoxy group, or a group which is represented by General Formula (I-1) below when n represents an integer of 2 to 4, $R^1$ and $R^2$ each represents an alkyl group which may have a substituent group, and $R^1$ and $R^2$ may be combined with each other to form a hetero ring which includes a nitrogen atom, m represents an integer of 1 to 6, n represents an integer of 1 to 4, and each of a plurality of X, $Y^1$, $R^1$, and $R^2$ may be the same or different when n is 2 or more,

in General Formula (I-1), $Y^3$ represents —NH— or —O—, $R^1$ and $R^2$ each represents an alkyl group which may have a substituent group, and $R^1$ and $R^2$ may be combined with each other to form a hetero ring which includes a nitrogen atom, and m represents an integer of 1 to 6,

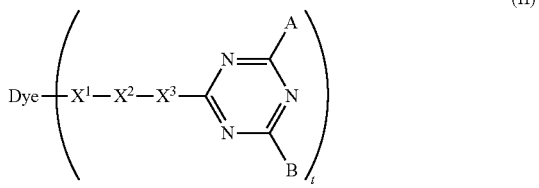

in General Formula (II),

Dye represents a quinophthalone residue which may have a substituent group, $X^1$ represents —NR'$SO_2$—, —$SO_2$NR'—, —CONR'—, —$CH_2$NR'COCH$_2$NR'—, or —NR'CO—, $X^2$ represents an arylene group with 6 to 20 carbon atoms which may have a substituent group or a hetero aromatic ring group with 4 to 20 carbon atoms which may have a substituent group, these groups may be bonded with each other by a divalent linking group selected from —NR'—, —O—, —$SO_2$—, or —CO—, $X^3$ represents —NR'— or —O—, R' represents a hydrogen atom, an alkyl group with 1 to 20 carbon atoms which may have a substituent group, an alkenyl group with 2 to 20 carbon atoms which may have a substituent group, or an aryl group with 6 to 20 carbon atoms which may have a substituent group, A and B each represents a group selected from a group which is represented by General Formula (II-1) below, a group which is represented by General Formula (II-2) below, —O—$(CH_2)_n$—$R^8$, —$OR^9$, —$NR^{10}R^{11}$, —Cl, —F, and —$X^3$—$X^2$—$X^1$-Dye, $R^8$ represents a nitrogen-containing heterocyclic residue which may be substituted, $R^9$, $R^{10}$, and $R^{11}$ each represents a hydrogen atom, an alkyl group with 1 to 20 carbon atoms which may have a substituent group, an alkenyl group with 2 to 20 carbon atoms which may have a substituent group, or an aryl group with 6 to 20 carbon atoms which may have a substituent group, and n represents an integer of 0 to 20, one of A and B represents a group which is represented by General Formula (II-1) below, a group which is represented by General Formula (II-2) below, —O—$(CH_2)$n-$R^8$, —$OR^9$, or $NR^{10}R^{11}$, and t represents an integer of 1 to 3, and a plurality of $X^1$, $X^2$, $X^3$, A, and B may be the same or may be different when t is 2 or more,

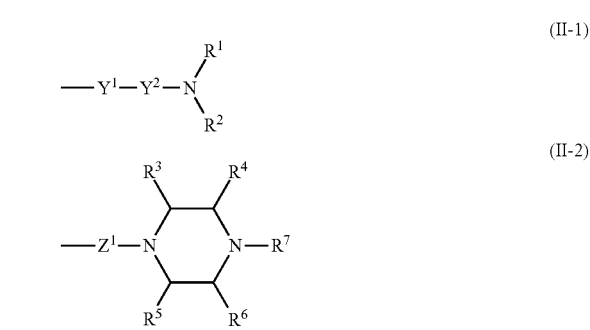

in General Formula (II-1), $Y^1$ represents —NR'— or —O—, $Y^2$ represents an alkylene group with 1 to 20 carbon atoms which may have a substituent group, an alkenylene group with 2 to 20 carbon atoms which may have a substituent group, or an arylene group with 6 to 20 carbon atoms which may have a substituent group and these groups may be bonded with each other by a divalent linking group selected from —NR'—, —O—, —$SO_2$—, and —CO—, R' represents a hydrogen atom, an alkyl group with 1 to 20 carbon atoms which may have a substituent group, an alkenyl group with 2 to 20 carbon atoms which may have a substituent group, or an aryl group with 6 to 20 carbon atoms which may have a substituent group, $R^1$ and $R^2$ each represents an alkyl group with 1 to 20 carbon atoms which may have a substituent group, or an alkenyl group with 2 to 20 carbon atoms which may have a substituent group, and $R^1$ and $R^2$ may be combined with each other to form a heterocyclic structure and the heterocyclic structure may further include a nitrogen atom, an oxygen atom, or a sulfur atom or may have a substituent group, and in General Formula (II-2), $Z^1$ represents a single bond which connects a triazine ring and a nitrogen atom, —NR'—, —NR'-G-CO—, NR'-G-CONR"—, —NR'-G-SO$_2$—, —NR'-G-SO$_2$NR"—, —O-G-CO—, —O-G-CONR'—, —O-G-SO$_2$—, or —O-G-SO$_2$NR'—, where G represents an alkylene group with 1 to 20 carbon atoms which may have a substituent group, an alkenylene group with 2 to 20 carbon atoms which may have a substituent group, or an arylene group with 6 to 20 carbon atoms which may have a substituent group, and R' and R" each represents a hydrogen atom, an alkyl group with 1 to 20 carbon atoms which may have a substituent group, an alkenyl group with 2 to 20 carbon atoms which may have a substituent group, or an aryl group with 6 to 20 carbon atoms which may have a substituent group, and $R^3$, $R^4$, $R^5$, and $R^6$ each represents a hydrogen atom, an alkyl group with 1 to 20 carbon atoms which may have a substituent group, an alkenyl group with 2 to 20 carbon atoms which may have a substituent group, or an aryl group with 6 to 20 carbon atoms which may have a substituent group, and $R^7$ represents an alkyl group with 1 to 20 carbon atoms which may have a substituent group or an alkenyl group with 2 to 20 carbon atoms which may have a substituent group.

20. A color filter which is made by the method for producing a color filter according to claim 1.

\* \* \* \* \*